(12) United States Patent
Dye et al.

(10) Patent No.: US 7,190,284 B1
(45) Date of Patent: Mar. 13, 2007

(54) SELECTIVE LOSSLESS, LOSSY, OR NO COMPRESSION OF DATA BASED ON ADDRESS RANGE, DATA TYPE, AND/OR REQUESTING AGENT

(76) Inventors: Thomas A. Dye, 6621 Candle Ridge Cove, Austin, TX (US) 78731; Manuel J. Alvarez, II, 8800 Pepper Rock Dr., Austin, TX (US) 78717; Peter Geiger, 10407 Treasure Island Dr., Austin, TX (US) 78730

( * ) Notice: Subject to any disclaimer, the term of this patent is extended or adjusted under 35 U.S.C. 154(b) by 0 days.

(21) Appl. No.: 09/239,659

(22) Filed: Jan. 29, 1999

Related U.S. Application Data

(63) Continuation-in-part of application No. 08/916,464, filed on Aug. 8, 1997, now Pat. No. 6,173,381, which is a continuation-in-part of application No. 08/463,106, filed on Jun. 5, 1995, now abandoned, which is a continuation-in-part of application No. 08/340,667, filed on Nov. 16, 1994, now Pat. No. 6,002,411.

(51) Int. Cl.
*H03M 7/30* (2006.01)
*G06F 12/00* (2006.01)

(52) U.S. Cl. ............... 341/51; 341/87; 710/68; 711/170; 382/232; 382/233; 382/244

(58) Field of Classification Search ......... 382/232, 382/233, 244; 710/68; 709/247; 341/51, 341/87; 711/170
See application file for complete search history.

(56) References Cited

U.S. PATENT DOCUMENTS

| | | | |
|---|---|---|---|
| 4,008,460 A | 2/1977 | Bryant et al. ............... 395/463 |
| 4,688,108 A | 8/1987 | Cotton et al. ............ 358/261.1 |
| 4,876,541 A | 10/1989 | Storer | |
| 4,881,075 A | 11/1989 | Weng ............................ 341/87 |
| 4,903,317 A * | 2/1990 | Nishihara et al. ............. 358/1.9 |
| 4,987,541 A * | 1/1991 | Levente et al. ............... 701/35 |
| 5,003,307 A | 3/1991 | Whiting et al. | |
| 5,016,009 A | 5/1991 | Whiting et al. | |
| 5,126,739 A | 6/1992 | Whiting et al. | |
| 5,136,289 A | 8/1992 | Yoshida et al. | |
| 5,146,221 A | 9/1992 | Whiting et al. | |
| 5,150,430 A | 9/1992 | Chu | |
| 5,155,484 A | 10/1992 | Chambers, IV | |
| 5,237,460 A | 8/1993 | Miller et al. ................. 395/888 |
| 5,237,675 A | 8/1993 | Hannon, Jr. .................. 710/68 |
| 5,247,638 A | 9/1993 | O'Brien et al. ............. 395/888 |
| 5,247,646 A | 9/1993 | Osterlund et al. .......... 395/888 |
| 5,280,520 A * | 1/1994 | Abe ....................... 379/100.14 |
| 5,325,297 A * | 6/1994 | Bird et al. ................... 715/530 |
| 5,337,275 A | 8/1994 | Garner .................... 365/189.01 |
| 5,353,024 A | 10/1994 | Graybill | |
| 5,353,425 A | 10/1994 | Malamy et al. ............. 711/144 |
| 5,357,614 A | 10/1994 | Pattisam et al. ............ 395/250 |
| 5,371,499 A | 12/1994 | Graybill et al. | |
| 5,379,036 A | 1/1995 | Storer | |
| 5,389,922 A | 2/1995 | Seroussi et al. | |
| 5,396,343 A | 3/1995 | Hanselman ................. 358/426 |
| 5,406,278 A | 4/1995 | Graybill et al. | |
| 5,406,279 A | 4/1995 | Anderson et al. | |
| 5,412,429 A | 5/1995 | Glover | |
| 5,414,425 A | 5/1995 | Whiting et al. | |
| 5,414,850 A | 5/1995 | Whiting | |
| 5,420,696 A | 5/1995 | Wegeng et al. ............. 358/468 |
| 5,426,779 A | 6/1995 | Chambers, IV | |
| 5,455,577 A | 10/1995 | Slivka et al. ................. 341/51 |
| 5,455,943 A | 10/1995 | Chambers, IV | |
| 5,463,390 A | 10/1995 | Whiting et al. | |
| 5,467,087 A | 11/1995 | Chu | |
| 5,479,587 A * | 12/1995 | Campbell et al. .......... 358/1.11 |
| 5,485,526 A | 1/1996 | Tobin | |
| 5,493,698 A * | 2/1996 | Suzuki et al. ............... 370/280 |
| 5,506,580 A | 4/1996 | Whiting et al. | |
| 5,510,840 A | 4/1996 | Yonemitsu et al. | |
| 5,525,982 A | 6/1996 | Cheng et al. | |
| 5,526,363 A | 6/1996 | Weiss et al. | |
| 5,532,693 A | 7/1996 | Winters et al. | |
| 5,532,694 A | 7/1996 | Mayers et al. | |
| 5,539,865 A * | 7/1996 | Gentile ....................... 358/1.16 |
| 5,548,742 A | 8/1996 | Wang et al. ................. 711/128 |
| 5,553,160 A * | 9/1996 | Dawson ................. 358/426.02 |
| 5,559,978 A | 9/1996 | Spilo .......................... 711/203 |
| 5,563,595 A | 10/1996 | Strohacker .................. 341/106 |

| | | | |
|---|---|---|---|
| 5,572,206 A | 11/1996 | Miller et al. | |
| 5,577,248 A | 11/1996 | Chambers, IV | |
| 5,584,008 A | 12/1996 | Shimada et al. | 711/114 |
| 5,590,047 A * | 12/1996 | Uehara | 700/214 |
| 5,602,976 A * | 2/1997 | Cooper et al. | 358/1.15 |
| 5,606,428 A | 2/1997 | Hanselman | 358/404 |
| 5,621,403 A | 4/1997 | Reznik | |
| 5,625,712 A * | 4/1997 | Schoenzeit et al. | 375/240.05 |
| 5,627,995 A | 5/1997 | Miller et al. | |
| 5,652,878 A | 7/1997 | Craft | |
| 5,696,912 A | 12/1997 | Bicevskis et al. | 395/308 |
| 5,724,582 A * | 3/1998 | Pelanek et al. | 382/232 |
| 5,729,228 A | 3/1998 | Franaszek et al. | |
| 5,771,011 A | 6/1998 | Masenas | |
| 5,778,255 A | 7/1998 | Clark et al. | |
| 5,793,937 A * | 8/1998 | Chura et al. | 358/1.16 |
| 5,798,718 A | 8/1998 | Hadady | |
| 5,812,817 A | 9/1998 | Hovis et al. | 395/497.04 |
| 5,828,877 A | 10/1998 | Pearce et al. | 395/670 |
| 5,836,003 A | 11/1998 | Sadeh | |
| 5,838,334 A | 11/1998 | Dye | |
| 5,847,762 A * | 12/1998 | Canfield et al. | 375/240.15 |
| 5,852,742 A * | 12/1998 | Vondran et al. | 710/1 |
| 5,874,908 A | 2/1999 | Craft | |
| 5,877,711 A | 3/1999 | Craft | |
| 5,883,588 A | 3/1999 | Okamura | |
| 5,933,104 A | 8/1999 | Kimura | |
| 5,936,560 A | 8/1999 | Higuchi | |
| 5,945,933 A | 8/1999 | Kalkstein | |
| 5,956,372 A | 9/1999 | Vaman et al. | |
| 5,961,617 A * | 10/1999 | Tsang | 710/100 |
| 5,973,630 A | 10/1999 | Heath | |
| 6,002,411 A | 12/1999 | Dye | 345/521 |
| 6,002,814 A * | 12/1999 | Chadez | 358/1.15 |
| 6,067,098 A | 5/2000 | Dye | |
| 6,145,069 A | 11/2000 | Dye | |
| 6,170,047 B1 | 1/2001 | Dye | |
| 6,173,381 B1 | 1/2001 | Dye | |
| 6,198,850 B1 * | 3/2001 | Banton | 358/426.02 |
| 6,208,273 B1 | 3/2001 | Dye | |
| 6,292,194 B1 * | 9/2001 | Powell, III | 236/92 B |
| 6,333,745 B1 | 12/2001 | Shimomura et al. | |
| 2004/0017483 A1 * | 1/2004 | Kitsugi et al. | 348/207.99 |

FOREIGN PATENT DOCUMENTS

| | | |
|---|---|---|
| EP | 0 702 457 | 3/1996 |
| JP | 05204747 A * | 8/1993 |
| WO | 95/19662 | 7/1995 |

OTHER PUBLICATIONS

Brenza, "Synonym Avoidance Cache," IBM Technical Disclosure Bulletin, vol. 34, No. 1, Jun. 1991, pp. 377-381.
International Search Report for Application No. PCT/US 00/02355, mailed Jun. 16, 2000.
U.S. Appl. No. 08/463,106, filed Jun. 5, 1995, Dye.
U.S. Appl. No. 60/144,125, filed Jul. 16, 1999, Dye.
U.S. Appl. No. 09/491,343, filed Jan. 26, 2000, Dye.
U.S. Appl. No. 09/818,283, filed Mar. 27, 2001, Dye.
Yabe et al., Compression/Decompression DRAM for Unified Memory Systems: A 16 Mb, 200MHz, 90% to 50% Graphics-Bandwidth Reduction Prototype, IEEE 1998 Solid-State Circuits Conference, Feb. 1998, pp. 342-343.
Kjelso et al., Design and Performance of a Main Memory Hardware Data Compressor, EuroMicro 96 Conference, IEEE, Sep. 1996, pp. 423-430.

* cited by examiner

*Primary Examiner*—Hong Kim

(57) ABSTRACT

An integrated memory controller (IMC) including MemoryF/X Technology which includes data compression and decompression engines for improved performance. The memory controller (IMC) of the present invention preferably selectively uses a combination of lossless, lossy, and no compression modes. Data transfers to and from the integrated memory controller of the present invention can thus be in a plurality of formats, these being compressed or normal (non-compressed), compressed lossy or lossless, or compressed with a combination of lossy and lossless. The invention also indicates preferred methods for specific compression and decompression of particular data formats such as digital video, 3D textures and image data using a combination of novel lossy and lossless compression algorithms in block or span addressable formats. To improve latency and reduce performance degradations normally associated with compression and decompression techniques, the MemoryF/X Technology encompasses multiple novel techniques such as: 1) parallel lossless compression/decompression; 2) selectable compression modes such as lossless, lossy or no compression; 3) priority compression mode; 4) data cache techniques; 5) variable compression block sizes; 6) compression reordering; and 7) unique address translation, attribute, and address caches. The parallel compression and decompression algorithm allows high-speed parallel compression and high speed parallel decompression operation. The IMC also preferably uses a special memory allocation and directory technique for reduction of table size and low latency operation. The integrated data compression and decompression capabilities of the IMC remove system bottle-necks and increase performance. This allows lower cost systems due to smaller data storage, reduced bandwidth requirements, reduced power and noise.

16 Claims, 34 Drawing Sheets

(New Art)

| Input Matches | | | | New Counter Value | Output Counter | Output Mask | Reset Value |
|---|---|---|---|---|---|---|---|
| D0 | C1 | B2 | A3 | | | | |
| 1 | 1 | 1 | 1 | Saved+4 | Saved +4 | 10000 | 0 |
| 1 | 1 | 1 | 0 | 0 | Saved+3 | 10001 | 1 |
| 1 | 1 | 0 | 1 | 1 | Saved+2 | 10010 | 2 |
| 1 | 1 | 0 | 0 | 0 | Saved+2 | 10011 | 2 |
| 1 | 0 | 1 | 1 | 2 | Saved+1 | 10100 | 3 |
| 1 | 0 | 1 | 0 | 0 | Saved+1 | 10101 | 3 |
| 1 | 0 | 0 | 1 | 1 | Saved+1 | 10110 | 3 |
| 1 | 0 | 0 | 0 | 0 | Saved+1 | 10111 | 3 |
| 0 | 1 | 1 | 1 | 3 | Saved | 11000 | 4 |
| 0 | 1 | 1 | 0 | 0 | Saved | 01111 | 1 |
| 0 | 1 | 0 | 1 | 1 | Saved | 11010 | 4 |
| 0 | 1 | 0 | 0 | 0 | Saved | 11011 | 4 |
| 0 | 0 | 1 | 1 | 2 | Saved | 11100 | 4 |
| 0 | 0 | 1 | 0 | 0 | Saved | 11101 | 4 |
| 0 | 0 | 0 | 1 | 1 | Saved | 11110 | 4 |
| 0 | 0 | 0 | 0 | 0 | Saved | 11111 | 4 |

Fig. 11

|            | Entry | 0  | 1  | 2  | 3  | 4  | 5  | 6  | 7  | 8  | 9  | 10 | 11 | 12 | 13 | 14 | 15 |
|------------|-------|----|----|----|----|----|----|----|----|----|----|----|----|----|----|----|----|
| State 0    | Data  | F0 | F1 | F2 | F3 | F4 | F5 | F6 | F7 | F8 | F9 | FA | FB | FC | FD | FE | FF |
|            | Count | 0  | 0  | 0  | 0  | 0  | 0  | 0  | 0  | 0  | 0  | 0  | 0  | 0  | 0  | 0  | 0  |
| Input D3:0 | C0F7F8F9 | | | | | | | | | | | | | | | | |
|            | Count Out | 0 | 0 | 0 | 0 | 0 | 0 | 0 | 0 | 0 | 0 | 0 | 0 | 0 | 0 | 0 | 0 |
|            | Mask Out  | 1F| 1F| 1F| 1F| 1F| 1F| 1F| 1F| 1F| 1F| 1F| 1F| 1F| 1F| 1F| 1F|

Output: C0(9,3)

|            | Entry | 0  | 1  | 2  | 3  | 4  | 5  | 6  | 7  | 8  | 9  | 10 | 11 | 12 | 13 | 14 | 15 |
|------------|-------|----|----|----|----|----|----|----|----|----|----|----|----|----|----|----|----|
| State 1    | Data  | C0 | F7 | F8 | F9 | F0 | F1 | F2 | F3 | F4 | F5 | F6 | F7 | F8 | F9 | FA | FB |
|            | Count | 0  | 0  | 0  | 0  | 0  | 0  | 0  | 0  | 0  | 0  | 0  | 0  | 0  | 0  | 0  | 0  |
| Input D3:0 | F0F1F2B5 | | | | | | | | | | | | | | | | |
|            | Count Out | 0 | 0 | 0 | 0 | 0 | 0 | 0 | 0 | 0 | 0 | 0 | 0 | 0 | 0 | 0 | 0 |
|            | Mask Out  | 1F| 1F| 1F| 1F| 1F| 1F| 1F| 1F| 1F| 1F| 1F| 1F| 1F| 1F| 1F| 1F|

Output: B5

|            | Entry | 0  | 1  | 2  | 3  | 4  | 5  | 6  | 7  | 8  | 9  | 10 | 11 | 12 | 13 | 14 | 15 |
|------------|-------|----|----|----|----|----|----|----|----|----|----|----|----|----|----|----|----|
| State 2    | Data  | F0 | F1 | F2 | B5 | C0 | F7 | F8 | F9 | F0 | F1 | F2 | F3 | F4 | F5 | F6 | F7 |
|            | Count | 0  | 0  | 0  | 0  | 0  | 0  | 0  | 0  | 0  | 0  | 0  | 0  | 0  | 0  | 0  | 0  |
| Input D3:0 | B5F7F8F9 | | | | | | | | | | | | | | | | |
|            | Count Out | 0 | 0 | 0 | 0 | 0 | 0 | 0 | 0 | 0 | 0 | 0 | 0 | 0 | 0 | 0 | 0 |
|            | Mask Out  | 1F| 1F| 1F| 1F| 1F| 1F| 1F| 1F| 1F| 1F| 1F| 1F| 1F| 1F| 1F| 1F|

Output: (7,6)

|            | Entry | 0  | 1  | 2  | 3  | 4  | 5  | 6  | 7  | 8  | 9  | 10 | 11 | 12 | 13 | 14 | 15 |
|------------|-------|----|----|----|----|----|----|----|----|----|----|----|----|----|----|----|----|
| State 3    | Data  | B5 | F7 | F8 | F9 | F3 | F4 | F5 | B5 | C0 | F7 | F8 | F9 | F0 | F1 | F2 | F3 |
|            | Count | 0  | 0  | 0  | 0  | 0  | 0  | 0  | 0  | 0  | 0  | 0  | 0  | 0  | 0  | 0  | 0  |
| Input D3:0 | F3B5C0E2 | | | | | | | | | | | | | | | | |
|            | Count Out | 0 | 0 | 0 | 0 | 0 | 0 | 0 | 0 | 0 | 0 | 0 | 0 | 0 | 0 | 0 | 0 |
|            | Mask Out  | 1F| 1F| 1F| 1F| 1F| 1F| 1F| 1F| 1F| 1F| 1F| 1F| 1F| 1F| 1F| 1F|

Output: (9,2)E2(6,1)

|            | Entry | 0  | 1  | 2  | 3  | 4  | 5  | 6  | 7  | 8  | 9  | 10 | 11 | 12 | 13 | 14 | 15 |
|------------|-------|----|----|----|----|----|----|----|----|----|----|----|----|----|----|----|----|
| State 4    | Data  | F3 | B5 | C0 | E2 | B5 | F7 | F8 | F9 | F3 | F4 | F5 | B5 | C0 | F7 | F8 | F9 |
|            | Count | 0  | 0  | 0  | 0  | 0  | 0  | 1  | 0  | 0  | 0  | 0  | 0  | 0  | 0  | 0  | 0  |

(9,2)E2B5 Alternate Output

Final Output: (7,1)

F3 Alternate Output

Fig. 13

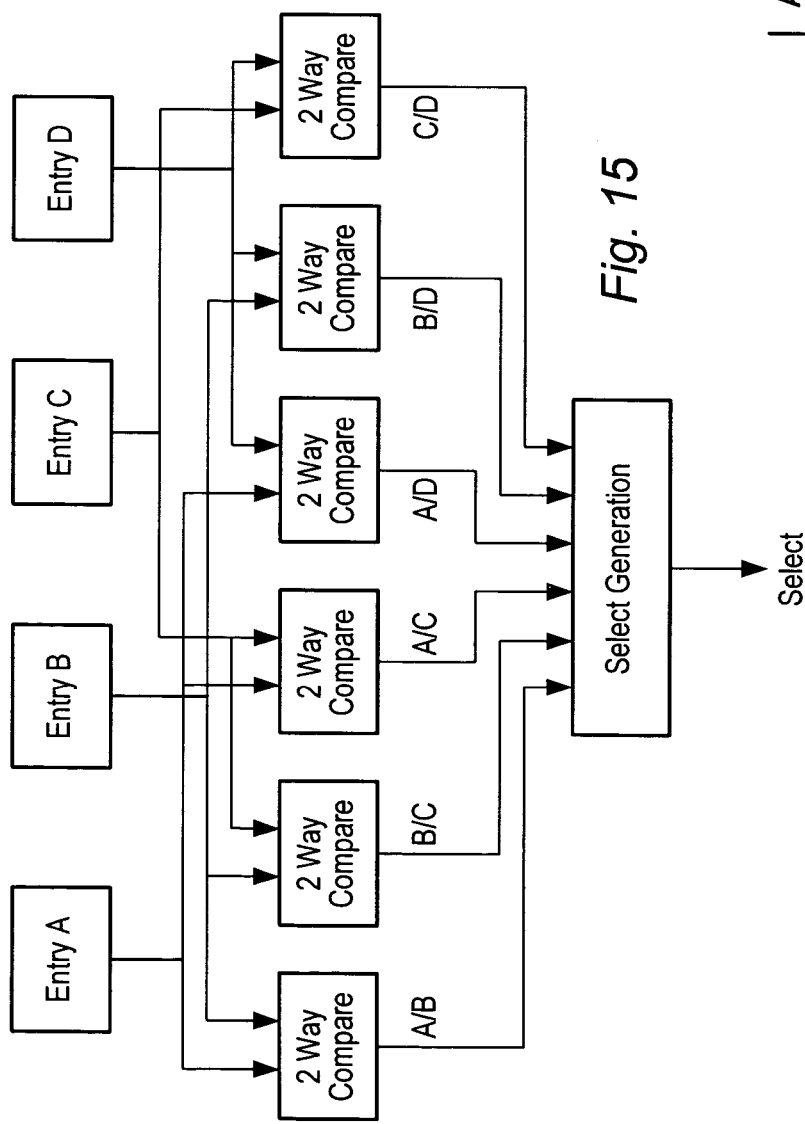

Fig. 18

| | | | | | | | | | |
|---|---|---|---|---|---|---|---|---|---|
| Ymax = Ymin | 1 color | Ymax 6 bits | Ymin 6 bits | Rmax 5 bits | Bmax 5 bits | 11 2 bits | | | 3 Bytes |
| Ymax != Ymin | 2 colors | Ymax 6 bits | Ymin 6 bits | Rmax 5 bits | Rmin 5 bits | Bmax 5 bits | Bmin 5 bits | P bits 16 bits | 6 Bytes |
| Ymax != Ymin | >2 colors | Ymax 6 bits | Ymin 6 bits | Rmax 5 bits | Rmin 5 bits | Bmax 5 bits | Bmin 5 bits | P bits 32 bits | 8 Bytes |

Fig. 19

| | | | | | | | | | | | | |
|---|---|---|---|---|---|---|---|---|---|---|---|---|
| Ymax = Ymin | Amax = Amin = 0x00 | 1 color | Ymax 6 bits | Ymin 6 bits | Rmax 5 bits | Bmax 5 bits | 00 2 bits | | | | | 3 Bytes |
| Ymax != Ymin | Amax = Amin = 0xFF | 1 color | Ymax 6 bits | Ymin 6 bits | Rmax 5 bits | Bmax 5 bits | 11 2 bits | | | | | 3 Bytes |
| Ymax != Ymin | Amax = Amin != 00 or FF | 1 color | Ymax 6 bits | Ymin 6 bits | Rmax 5 bits | Bmax 5 bits | 01 2 bits | | Amax 4/8 bits | | | 4/5 Bytes |
| Ymax = Ymin | Amax != Amin | 1 color, 2 Alphas | Ymax 6 bits | Ymin 6 bits | Rmax 5 bits | Bmax 5 bits | 01 2 bits | | Amax 4/8 bits | Amin 4/8 bits | | 6/7 Bytes |
| Ymax != Ymin | Amax != Amin | 1 color, >2 Alphas | Ymax 6 bits | Ymin 6 bits | Rmax 5 bits | Bmax 5 bits | 10 2 bits | | Amax 4/8 bits | Amin 4/8 bits | P bits 16 bits | 8/9 Bytes |
| Ymax != Ymin | X | 2 colors | Ymax 6 bits | Ymin 6 bits | Rmax 5 bits | Rmin 5 bits | Bmax 5 bits | Bmin 5 bits | Amax 4/8 bits | Amin 4/8 bits | P bits 32 bits | 7/8 Bytes |
| Ymax != Ymin | X | >2 colors | Ymax 6 bits | Ymin 6 bits | Rmax 5 bits | Rmin 5 bits | Bmax 5 bits | Bmin 5 bits | Amax 4/8 bits | Amin 4/8 bits | P bits 32 bits | 9/10 Bytes |

Memory Allocation Fields

| Compressed Address Translation Table (CATT)-128 Entry Design Limit ||||
|---|---|---|---|
| Starting Addr | Ending Addr | Type | Data Ptr | OAT Ptr |
| 20 bits | 20 bits | 4 bits | 20 bits | 8 bits |
| 4GB Addressability | | Compressed | | |
| 4K Boundry | 4K Boundry | | 4K Boundry | |

| Overflow Address Table (OAT)-256 Entry Max |||
|---|---|---|
| Overflow Ptr | Next Block Ptr | Next OAT Ptr | Next OAT Valid |
| 20 bits | 24 bits | 8 bits | 1 bit |
| 4 GB Addressability | | Points to next entry in this table | |
| 4K Boundry | | | |

| Initial Header Description |||
|---|---|---|
| Value | # of bits | Meaning |
| 0 | 1 | Last Block/Unused |
| 10 A (20 bits) | 22 | The next block is at offset A in the Overflow Area |
| 11 IA(8+20 bits) | 30 | The next block is at offset A in the Overflow Area of OAT entry I |

| Overflow Header Description |||
|---|---|---|
| Value | # of bits | Meaning |
| 00 | 2 | Last Block/Unused |
| 01 | 2 | The next block follows physically after this one |
| 10A (8 bits) | 10 | The next block is A blocks before this one (or after?) |
| 110A (20 bits) | 23 | The next block is at offset A in the Overflow Area |
| 111 IA (8+20 bits) | 31 | The next block is at offset A in the Overflow Area of OAT entry I |

Fig. 25

| Uncomp Block Bytes | Type | Initial Block Size Bytes | Overflow Block Size Bytes | Max Comp Ratio (X:1) | Initial Allocation | Header w/o OF | Header w/ OF Non-Frag | Header w/ OF Fragmented |
|---|---|---|---|---|---|---|---|---|
| 4096 | 8 | 256 | 64 | 16 | 6% | 0.0% | 0.4% | 4.1% |
| 2048 | 7 | 128 | 64 | 16 | 6% | 0.1% | 0.5% | 4.2% |
| 1024 | 6 | 64 | 64 | 16 | 6% | 0.2% | 0.6% | 4.3% |
| 512 | 5 | 64 | 64 | 8 | 13% | 0.2% | 0.9% | 4.3% |
| 256 | 4 | 64 | 64 | 4 | 25% | 0.2% | 1.4% | 4.3% |
| 128 | 3 | 32 | 32 | 4 | 25% | 0.4% | 2.8% | 8.8% |
| 64 | 2 | 32 | 16 | 2 | 50% | 0.4% | 5.1% | 13.6% |
| 32 | 1 | 32 | 8 | 1 | 100% | 0.4% | 8.9% | 11.5% |

Fig. 30

| Bytes Compressed | Flag | Index | Count | Data | Bits Used |
|---|---|---|---|---|---|
| 0 | 0 | - | - | 8b | 9 |
| 1 | 10 | 6b | - | - | 8 |
| 2 | 1100 | 6b | - | - | 10 |
| 3 | 1101 | 6b | - | - | 10 |
| 4 | 1110 | 6b | - | - | 10 |
| 5 | 1111000 | 6b | - | - | 13 |
| 6 | 1111001 | 6b | - | - | 13 |
| 7 | 1111010 | 6b | - | - | 13 |
| 8 | 1111011 | 6b | - | - | 13 |
| 9 | 1111100 | 6b | - | - | 13 |
| 10 | 1111101 | 6b | - | - | 13 |
| 11 | 1111110 | 6b | - | - | 13 |
| >11 | 1111111 | 6b | 12b | - | 25 |

Fig. 32

| Previous Select | 10 | 08 | 04 | 02 | 01 | 00 |
|---|---|---|---|---|---|---|
| My ID=01 | 1F | 1F | 1F | 1F | 1F | 00 |
| My ID=02 | 1F | 1F | 1F | 1F | 1F | 00 |
| My ID=04 | 1F | 1F | 1F | 1F | 1F | 00 |
| My ID=08 | 1F | 1F | 1F | 1F | 1F | 00 |
| My ID=10 | 1F | 1E | 1E | 1E | 1E | 00 |
| My ID=20 | 1E | 1E | 1E | 1E | 00 | 00 |
| My ID=40 | 1E | 00 | 1C | 00 | 00 | 00 |
| My ID=80 | 08 | 00 | 00 | 00 | 00 | 00 |

Figure 36a

| Select | 10 | 08 | 04 | 02 | 01 | 00 |
|---|---|---|---|---|---|---|
| Data Byte | X | D1:D8 | X | X | X | X |
| Index | D2:D7 | X | D4:D9 | D7:D12 | D7:D12 | X |
| Count | PC+1 | PC+1 | D2:D3+PC+2 | D4:D6+PC+5 | D13:D24+PC | X |

Figure 36b

SELECTIVE LOSSLESS, LOSSY, OR NO COMPRESSION OF DATA BASED ON ADDRESS RANGE, DATA TYPE, AND/OR REQUESTING AGENT

CONTINUATION DATA

This application is a continuation-in-part (CIP) of Ser. No. 08/916,464, filed Aug. 8, 1997, and now U.S. Pat. No. 6,173,381, issued on Jan. 9, 2001;

which is a continuation-in-part (CIP) of Ser. No. 08/463,106, filed Jun. 5, 1995, now abandoned;

which is a continuation-in-part (CIP) of Ser. No. 08/340,667, filed on Nov. 16, 1994, which is now U.S. Pat. No. 6,002,411, issued on Dec. 14, 1999.

FIELD OF THE INVENTION

The present invention relates to computer system architectures, and more particularly to a memory controller which includes an embedded data compression and decompression engine for the reduction of system bandwidth and improved efficiency.

DESCRIPTION OF THE RELATED ART

Since their introduction in 1981, the architecture of personal computer systems has remained substantially unchanged. The current state of the art in computer system architectures includes a central processing unit (CPU) which couples to a memory controller interface that in turn couples to system memory. The computer system also includes a separate graphical interface for coupling to the video display. In addition, the computer system includes input/output (I/O) control logic for various I/O devices, including a keyboard, mouse, floppy drive, hard drive, etc.

In general, the operation of modern computer architecture is as follows. Programs and data are read from a respective I/O device such as a floppy disk or hard drive by the operating system, and the programs and data are temporarily stored in system memory. Once a user program has been transferred into the system memory, the CPU begins execution of the program by reading code and data from the system memory through the memory controller. The application code and data are presumed to produce a specified result when manipulated by the system CPU. The CPU processes the code and data, and data is provided to one or more of the various output devices. The computer system may include several output devices, including a video display, audio (speakers), printer, etc. In most systems, the video display is the primary output device.

Graphical output data generated by the CPU is written to a graphical interface device for presentation on the display monitor. The graphical interface device may simply be a video graphics array (VGA) card, or the system may include a dedicated video processor or video acceleration card including separate video RAM (VRAM). In a computer system including a separate, dedicated video processor, the video processor includes graphics capabilities to reduce the workload of the main CPU. Modern prior art personal computer systems typically include a local bus video system based on the Peripheral Component Interconnect (PCI) bus, the Advanced Graphics Port (AGP), or perhaps another local bus standard. The video subsystem is generally positioned on the local bus near the CPU to provide increased performance.

Therefore, in summary, program code and data are first read from the hard disk to the system memory. The program code and data are then read by the CPU from system memory, the data is processed by the CPU, and graphical data is written to the video RAM in the graphical interface device for presentation on the display monitor.

The system memory interface to the memory controller requires data bandwidth proportional to the application and system requirements. Thus, to achieve increased system performance, either wider data buses or higher speed specialty memory devices are required. These solutions force additional side-effects such as increased system cost, power and noise. FIG. 1 illustrates the data transfer paths in a typical computer memory controller and system memory using prior art technology.

The CPU typically reads data from system memory across the local bus in a normal or non-compressed format, and then writes the processed data or graphical data back to the I/O bus or local bus where the graphical interface device is situated. The graphical interface device in turn generates the appropriate video signals to drive the display monitor. It is noted that prior art computer architectures and operation typically do not perform data compression and/or decompression during the transfer between system memory and the CPU or between the system memory and the local I/O bus. Prior art computer architecture also does nothing to reduce the size of system memory required to run the required user applications or software operating system. In addition, software controlled compression and decompression algorithms typically controlled by the CPU for non-volatile memory reduction techniques can not be applied to real time applications that require high data rates such as audio, video, and graphics applications. Further, CPU software controlled compression and decompression algorithms put additional loads on the CPU and CPU cache subsystems.

Certain prior art systems utilize multiple DRAM devices to gain improved memory bandwidth. These additional DRAM devices may cost the manufacturer more due to the abundance of memory that is not fully utilized or required. The multiple DRAM devices are in many instances included primarily for added bandwidth, and when only the added bandwidth is needed, additional cost is incurred due to the multiple DRAM packages. For example, if a specific computer system or consumer computing appliance such as a Digital TV set-top box uses DRDRAM memory and requires more than 1.6 Gbytes/sec of bandwidth, then the minimum amount of memory for this bandwidth requirement will be 16 Mbytes. In such a case the manufacture pays for 16 Mbytes even if the set-top box only requires 8 Mbytes.

Computer systems are being called upon to perform larger and more complex tasks that require increased computing power. In addition, modern software applications require computer systems with increased graphics capabilities. Modern software applications include graphical user interfaces (GUIs) which place increased burdens on the graphics capabilities of the computer system. Further, the increased prevalence of multimedia applications also demands computer systems with more powerful graphics capabilities. Therefore, a new system and method is desired to reduce the bandwidth requirements required by the computer system application and operating software. A new system and method is desired which provides increased system performance without specialty high speed memory devices or wider data I/O buses required in prior art computer system architectures.

SUMMARY OF THE INVENTION

The present invention comprises a memory controller, also referred to as the integrated memory controller (IMC), which provides improved data efficiency and bandwidth. The memory controller includes a compression/decompression engine, preferably parallel data compression and decompression slices, that are embedded into the memory control logic of the memory controller. Further, the present invention does not require specialty memory devices or system software changes for operation. The memory controller logic of the present invention preferably interfaces to the system CPU either external or internal to the memory controller. Further, the memory controller interfaces to the main system memory and other interface buses such as a high-speed system peripheral bus, e.g., the PCI bus or the AGP. Additionally the IMC may contain graphics, video and/or audio control functions. The IMC includes one or more symmetric memory ports for connecting to system memory. The IMC also may include video outputs to directly drive the display device, as well as an audio interface for digital audio delivery to an external stereo digital-to-analog converter (DAC).

The IMC includes an embedded Technology termed "MemoryF/X" designed for the reduction of data bandwidth between the main or system memory and the memory controller. The MemoryF/X Technology reduces the bandwidth requirements while increasing the memory efficiency for almost all data types within the computer system. Thus, conventional standard (JDEC) memory devices can achieve higher bandwidth with less system power and noise than when used in conventional systems without the MemoryF/X Technology.

The IMC transfers data between the local bus, the embedded MemoryF/X Technology and system memory. In addition, the IMC also transfers data between the system memory and the display output. Therefore, the MemoryF/X technology of the present invention typically resides between the CPU local bus, peripheral interconnect buses, and the main system memory.

The MemoryF/X Technology is designed to embed into memory control circuits and has a novel architecture to compress and decompress parallel data streams within the computing system. In addition, the MemoryF/X Technology has a "scalable" architecture designed to function in a plurality of memory configurations or compression modes with a plurality of performance requirements.

The MemoryF/X Technology's system level architecture reduces data bandwidth requirements and thus improves memory efficiency. Efficiency is improved by the reduction of device I/O pins between the main memory bank and the memory controller. Compared to conventional systems, the MemoryF/X Technology obtains equivalent bandwidth to conventional architectures that use wider buses, specialty memory devices, and/or more attached memory devices. Both power and noise are reduced, improving system efficiency. Thus, systems that are sensitive to the cost of multiple memory devices, size, power and noise can reduce costs and improve system efficiency.

Systems that require a minimum of DRAM memory but also require high bandwidth do not need to use multiple memory devices or specialty DRAM devices in a wider configuration to achieve the required bandwidth when the MemoryF/X technology is utilized. Thus, minimum memory configurations can be purchased that will still achieve the bandwidth required by high-end applications such as video and graphics.

As mentioned above, according to the present invention the MemoryF/X Technology embedded within the IMC includes one or more compression and decompression engines for compressing and decompressing data within the system. In the preferred embodiment the MemoryF/X Technology comprises separate compression and decompression engines. In an alternate embodiment, a single combined compression/decompression engine can be implemented. The IMC preferably, primarily uses a lossless data compression and decompression scheme. Data transfers to and from the integrated memory controller of the present invention can thus be in either two formats, these being compressed or normal (non-compressed). The IMC may also include one or more lossy compression schemes for audio/video/graphics data.

Thus compressed data from system I/O peripherals such as the non-volatile memory, floppy drive, or local area network (LAN) are decompressed in the IMC and stored into system memory or saved in the system memory in compressed format. Thus, data can be saved in either a normal or compressed format, retrieved from the system memory for CPU usage in a normal or compressed format, or transmitted and stored on a medium in a normal or compressed format.

To improve latency and reduce performance degradations normally associated with compression and decompression techniques, the MemoryF/X Technology encompasses multiple novel techniques such as: 1) parallel lossless compression/decompression; 2) selectable compression modes such as lossless, lossy or no compression; 3) priority compression mode; 4) data cache techniques; 5) variable compression block sizes; 6) compression reordering; and 7) unique address translation, attribute, and address caches.

The MemoryF/X Technology preferably includes novel parallel compression and decompression engines designed to process stream data at more than a single byte or symbol (character) at one time. These parallel compression and decompression engines modify the single stream dictionary based (or history table based) data compression method described by Lempel and Ziv to provide a scalable, high bandwidth compression and decompression operation. The parallel compression method examines a plurality of symbols in parallel, thus providing greatly increased compression performance.

The MemoryF/X Technology can selectively use different compression modes, such as lossless, lossy or no compression. Thus, in addition to lossless compression/decompression, the IMC also can include one or more specific lossy compression and decompression modes for particular data formats such as image data, texture maps, digital video and digital audio. The MemoryF/X technology may selectively apply different compression/decompression algorithms depending on one or more of the type of the data, the requesting agent, or a memory address range. In one embodiment, internal memory mapping allows for format definition spaces (compression mode attributes) which define the compression mode or format of the data to be read or written.

The MemoryF/X Technology may use a priority compression and decompression mode which is designed for low latency operation. In the priority compression format, memory address blocks assigned by the operating system for uncompressed data are used to store the compressed data. Hence data-path address translation is not necessary, which optimizes bandwidth during data transfers. This also allows use of the MemoryF/X Technology with minimal or no changes to the computer operating system. Thus, for priority memory transfers, memory size is equivalent to that of data storage for non-compressed formats. The excess memory space resulting from the compression is preferably allocated as overflow storage or otherwise is not used. Thus the priority mode optimizes data transfer bandwidth, and may not attempt to reduce utilized memory.

The compression/decompression engine in the MemoryF/X Technology uses multiple data and address caching techniques to optimize data throughput and reduce latency. The MemoryF/X Technology includes a data cache, referred to as the L3 data cache, which preferably stores most recently used data in an uncompressed format. Thus cache hits result in lower latency than accesses of data compressed in the system memory. The L3 data cache can also be configured to store real time data, regardless of most recently used status, for reduced latency of this data.

The MemoryF/X Technology preferably dynamically (or statically) allocates variable block sizes based on one or more of data type, address range and/or requesting agent for reduced latency. In general, a smaller block size results in less latency than a larger block size, at the possible expense of lower compression ratios and/or reduced bandwidth. The memory controller preferably allocates smaller block sizes to data with faster access requirements, such as real time or time sensitive data. As noted above, the memory controller may also designate certain data with a "no compression" mode for optimum speed and minimal latency.

The MemoryF/X Technology also includes a compression reordering algorithm to optimally reorder compressed data based on predicted future accesses. This allows for faster access of compressed data blocks. During decompression, the longest latency to recover a compressed portion of data in a compressed block will be the last symbol in the portion of the data being accessed from the compressed block. As mentioned above, larger compression block sizes will increase latency time when the symbol to be accessed is towards the end of the compressed data stream. This method of latency reduction separates a compression block at intermediate values and reorders these intermediate values so that the portions most likely to be accessed in the future are located at the front of the compressed block. Thus the block is reordered so that the segment(s) most likely to be accessed in the future, e.g. most recently used, are placed in the front of the block. Thus these segments can be decompressed more quickly. This method of latency reduction is especially effective for program code loops and branch entry points and the restore of context between application subroutines. This out of order compression is used to reduce read latency on subsequent reads from the same compressed block address.

The MemoryF/X Technology in an alternate embodiment reduces latency further by use of multiple history windows to context switch between decompression operations of different requesting agents or address ranges. A priority can be applied such that compression and decompression operations are suspended in one window while higher priority data is transferred into one of a number of compression/decompression stages in an alternate window. Thus, reduction of latency and improved efficiency can be achieved at the cost of additional parallel history window buffers and comparison logic for a plurality of compression/decompression stages.

The MemoryF/X Technology includes an address translation mode for reduction of memory size. This reduction of memory size is accomplished at the cost of higher latency transfers than the priority compression mode, due to the address translation required. An address translation cache may be utilized for the address translation for reduced latency. An internal switch allows for selection of priority mode compression, normal mode compression, or no compression transfers. An attribute or tag field, which in-turn may be controlled by address ranges on a memory page boundary, preferably controls the switch.

In one embodiment, the operating system, memory controller driver or BIOS boot software allocates memory blocks using a selected compression ratio. Thus the allocated memory block size is based on a compression ratio, such as 2:1 or 4:1. Hence the allocated block size assumes the data will always compress to at least the smaller block size.

The MemoryF/X Technology also accounts for overflow conditions during compression. Overflow occurs when the data being compressed actually compresses to a larger size than the original data size, or when the data compresses to a smaller size than the original data, but to a larger size than the allocated block size. The MemoryF/X Technology handles the overflow case by first determining whether a block will overflow, and second storing an overflow indicator and overflow information with the data. The memory controller preferably generates a header stored with the data that includes the overflow indicator and overflow information. Thus the directory information is stored with the data, rather than in separate tables. Compression mode information may also be stored in the header with the data. The MemoryF/X Technology thus operates to embed directory structures directly within the compressed data stream.

The MemoryF/X Technology also includes a combined compression technique for lossy compression. The combined compression technique performs lossless and lossy compression on data in parallel, and selects either the lossless or lossy compressed result depending on the degree of error in the lossy compressed result.

The integrated data compression and decompression capabilities of the MemoryF/X Technology remove system bottlenecks and increase performance. This allows lower cost systems due to smaller data storage requirements and reduced bandwidth requirements. This also increases system bandwidth and hence increases system performance. Thus the IMC of the present invention is a significant advance over the operation of current memory controllers.

BRIEF DESCRIPTION OF THE DRAWINGS

A better understanding of the present invention can be obtained when the following detailed description of the preferred embodiment is considered in conjunction with the following drawings, in which:

FIG. 11 shows the operation of the counter values, output counter and output mask used for output selection during the parallel compression operation of the present invention;

FIG. 13 illustrates an example of the parallel compression operation indicating the data flow through multiple cycles;

FIG. 15 further illustrates the select generation logic and entry compare logic designed for high data clocking rates;

FIG. 16 illustrates the logic table for the high speed parallel comparison;

FIG. 18 is a table which shows the lossy compression output format for image data that does not include alpha values;

FIG. 19 is a table which shows the lossy compression output format for image data that includes alpha values;

FIG. 25 is a table illustrating the memory allocation fields for the compression allocation table and the Overflow table, compression memory area and the overflow memory area;

FIG. 30 is a table illustrating the memory allocation space and compression ratios according to one implementation of the present invention;

FIG. 32 is a table illustrating the header information presented to the lossless decompression engine;

FIG. 36*a* is a table indicating the check valid results table of the decode block; and FIG. 36*b* is a table describing the Data Generate outputs based on the Data Input and the Byte Check Select logic.

DETAILED DESCRIPTION OF THE PREFERRED EMBODIMENT

This application is a continuation-in-part (CIP) of Ser. No. 08/916,464, filed Aug. 8, 1997, titled "Memory Controller Including Embedded Data Compression And Decompression Engines," whose inventor is Thomas A. Dye, and now U.S. Pat. No. 6,173,381, issued on Jan. 9, 2001.

which is a continuation-in-part (CIP) of Ser. No. 08/463,106, filed Jun. 5, 1995, titled "Memory Controlled Including Embedded Data Compression And Decompression Engines," whose inventor is Thomas A, Dye, now abandoned;

which is a continuation-in-part (CIP) of Ser. No. 08/340,667, filed on Nov. 16, 1994, titled "Integrated Video And Memory Controller With Data Processing And Graphical Processing Capabilities," whose inventor is Thomas A. Dye, and is now U.S. Pat. No. 6,002,411, issued on Dec. 14, 1999.

Prior Art Computer System Architecture

Figure 1:
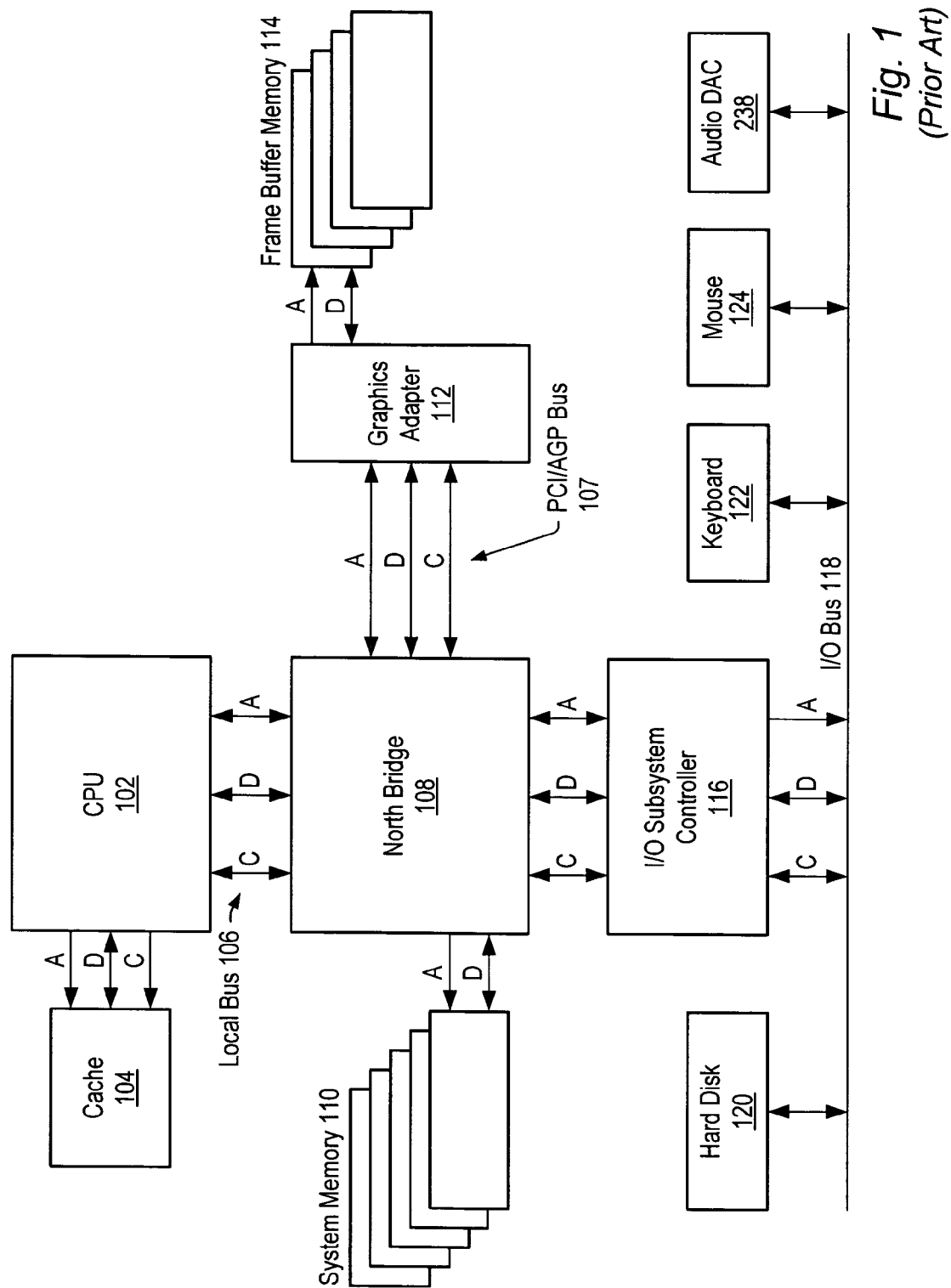
FIG. 1 illustrates a prior art computer system architecture.

FIG. 1 illustrates a block diagram of a prior art computer system architecture. As shown, prior art computer architectures typically include a CPU 102 coupled to a cache system 104. The CPU 102 couples to the cache system 104 and couples to a local bus 106. A memory controller 108, referred to as North Bridge 108, is coupled to the local bus 106, and the memory controller 108 in turn couples to system memory 110. The graphics adapter 112 is typically coupled to a separate local expansion bus such as the peripheral component interface (PCI) bus or the Accelerated Graphics Port (AGP) bus. Thus the north-bridge memory controller 108 is coupled between the CPU 102 and the main system memory 110 wherein the north-bridge logic also couples to the local expansion bus where the graphics adapter 112 is situated. The graphics adapter 112 couples to frame buffer memory 114 which stores the video data, also referred to as pixel data, that is actually displayed on the display monitor. Modern prior art computer systems typically include between 1 to 8 Megabytes of video memory. An I/O subsystem controller 116 is shown coupled to the local bus 106. In computer systems which include a PCI bus, the I/O subsystem controller 116 typically is coupled to the PCI bus. The I/O subsystem controller 116 couples to a secondary input/output (I/O) bus 118. Various peripheral I/O devices are generally coupled to the I/O bus 18, including a non-volatile memory, e.g., hard disk 120, keyboard 122, mouse 124, and audio digital-to-analog converter (DAC) 238.

Prior art computer system architectures generally operate as follows. First, programs and data are generally stored on the hard disk 120. If a software compression application is being used, data may be stored on the hard disk 120 in compressed format. At the direction of the CPU 102, the programs and data are transferred from the hard disk 120 through the I/O subsystem controller 116 to system memory 110 via the memory controller 108. If the data being read from the hard disk 120 is stored in compressed format, the data is decompressed by software executing on the CPU 102 prior to being transferred to system memory 110. Thus software compression applications require the compressed data to be transferred from the hard disk 120 to the CPU 120 prior to storage in the system memory 110.

The CPU 102 accesses programs and data stored in the system memory 110 through the memory controller 108 and the local bus 106. In processing the program code and data, the CPU 102 generates instructions and data that are then provided over the local bus 106 and generally the PCI bus or AGP bus to the graphics adapter 112. The graphics adapter 112 receives graphical instructions or pixel data from the CPU 102 and generates pixel data that is stored in the frame buffer memory 114. The graphics adapter 112 generates the necessary video signals to drive the video display device (not shown) to display the pixel data that is stored in the frame buffer memory 114. When a window on the screen is updated or changed, the above process repeats whereby the CPU 102 reads data across the local bus 106 from the system memory 110 and then transfers data back across the local bus 106 and local expansion bus to the graphics adapter 112 and frame buffer memory 114.

When the computer system desires to store data on the hard disk 120 in a compressed format, the data is read by the CPU 102 and compressed by the software compression application. The compressed data is then stored on the hard disk 120. If compressed data is stored in system memory 110 which must be decompressed, the CPU 102 is required to read the compressed data, decompress the data and write the decompressed data back to system memory 110.

However, it is noted that in modern computer systems or computing appliances, the system memory controller does not contain compression and decompression technology to optimize bandwidth efficiency for the main system memory. Specialty technology such as RAMBUS can be used both in the memory device and memory control unit to supply high bandwidth at low pin count. For more information on the RAMBUS memory architecture, please see "RAMBUS Architectural Overview," version 2.0, published July 1993 by RAMBUS, Inc., and "Applying RAMBUS Technology to Desktop Computer Main Memory Subsystems," version 1.0, published March 1992 by RAMBUS, Inc., which are both hereby incorporated by reference. While the RAMBUS technology achieves higher bandwidth with lower memory chip count, making concessions for the ultra high frequency transmission effects of the RAMBUS channel can cause power and noise as well as cost problems. In addition, to achieve higher bandwidth the transmission channel requires additional logic in both the memory controller and the memory itself, again causing higher power and additional cost.

Main memory DRAM devices at the 64-Mbit levels and higher continue to increase the package sizes and number of address and data pins. The increased pin count due to this trend eliminates the ability to "bank" DRAMS for higher effective bandwidth as in smaller DRAM architectures of the past. In addition, to lower effective bandwidth the "wide" DRAM devices cost more to manufacture due to increased package cost, test equipment, and testing time. In order to increase bandwidth the system memory controller must be designed with additional I/O data pins to compensate for wider DRAM devices. Thus higher power and noise results.

For computer appliances that require minimum main memory configuration and also require high bandwidth, the current choices are currently limited to specialty high speed memory devices such as RAMBUS or DDRDRAM which cost more, consume more power and generate more noise, or multiple smaller DRAM packages that typically require more PC board real-estate.

Computer Architecture of the Preferred Embodiment

Figure 2:
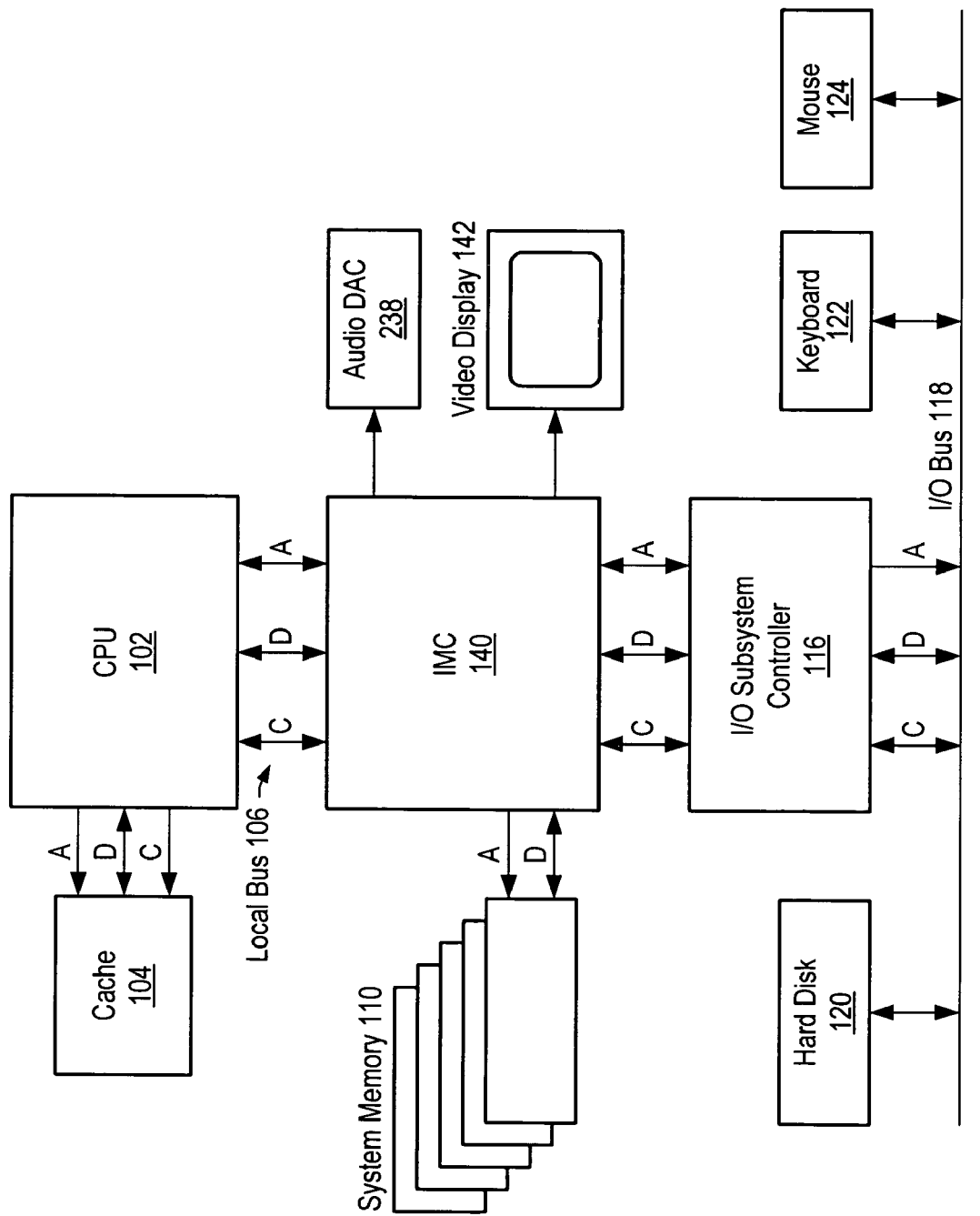
FIG. 2 illustrates a computer system including an integrated memory controller (IMC) according to the present invention.

FIG. 2 is a block diagram illustrating one embodiment of the architecture of a system incorporating the present invention. FIG. 2 is an example of one embodiment, and it is noted that the technology described herein may be included in any of various systems or architectures. For example, the technology of the present invention may be included in a computer system, a television system (such as HDTV), a set top box, Internet appliance, PDA (Personal Digital Assistant), or other systems which include memory for storing data. The technology of the present invention is described below with reference to a computer system architecture, which is one example of the use of the present invention. Elements in FIG. 2 that are similar or identical to those in FIG. 1 include the same reference numerals for convenience.

As shown, the computer system of the present invention includes a CPU 102 preferably coupled to a cache system 104. The CPU 102 may include an internal first level cache system and the cache 104 may comprise a second level cache. Alternatively, the cache system 104 may be a first level cache system or may be omitted as desired. The CPU 102 and cache system 104 are coupled to a Local bus 106. The CPU 102 and cache system 104 are directly coupled through the Local bus 106 to an integrated memory controller (IMC) 140 according to the present invention.

The integrated memory controller (IMC) 140 performs memory control functions and includes a compression/decompression engine for greatly increasing the performance of the computer system. It is noted that the IMC 140 can be used as the controller for main system memory 110 or can be used to control other memory subsystems as desired. The IMC 140 couples to system memory 110, wherein the system memory 110 comprises one or more banks of DRAM memory and may comprise a plurality of different type memory devices. The IMC 140 includes a memory controller core, also referred to as the MemoryF/X Technology core at present invention. The MemoryF/X Technology core is preferably embedded in the IMC 140, but alternately may be external to the IMC or may be comprised in the CPU 102. The entire IMC 140 may also be integrated with the CPU 102. The MemoryF/X Technology core in the preferred embodiment performs memory compression and decompression, system memory control, compression format, cache directory, data cache control and data multiplexing to improve the effective data bandwidth and efficiency of system memory data transfers.

The IMC 140 of the present invention may couple to any of various types of memory, as desired. In the preferred embodiment, the IMC 140 couples to the system memory 110 through a RAMBUS implementation. For more information on the RAMBUS memory architecture, please see the RAMBUS references mentioned above, which were incorporated by reference. In an alternate embodiment, the system memory 110 comprises SGRAM or single in-line memory modules (SIMMs). As noted above, the IMC 140 of the present invention may couple to any of various types of memory, as desired.

In the preferred embodiment, the IMC 140 also generates appropriate video signals for driving video display device 142. The IMC 140 preferably generates red, green, blue (RGB) signals as well as vertical and horizontal synchronization signals for generating images on the video display 142. Therefore, the integrated memory controller 140 of the present invention integrates memory controller and video and graphics controller capabilities into a single logical unit. This greatly reduces bus traffic and increases system performance. In one embodiment, the IMC 140 also generates appropriate data signals that are provided to Audio DAC 238 for audio presentation. Alternatively, the IMC 140 integrates audio processing and audio DAC capabilities and provides audio signal outputs that are provided directly to speakers.

Figure 3:
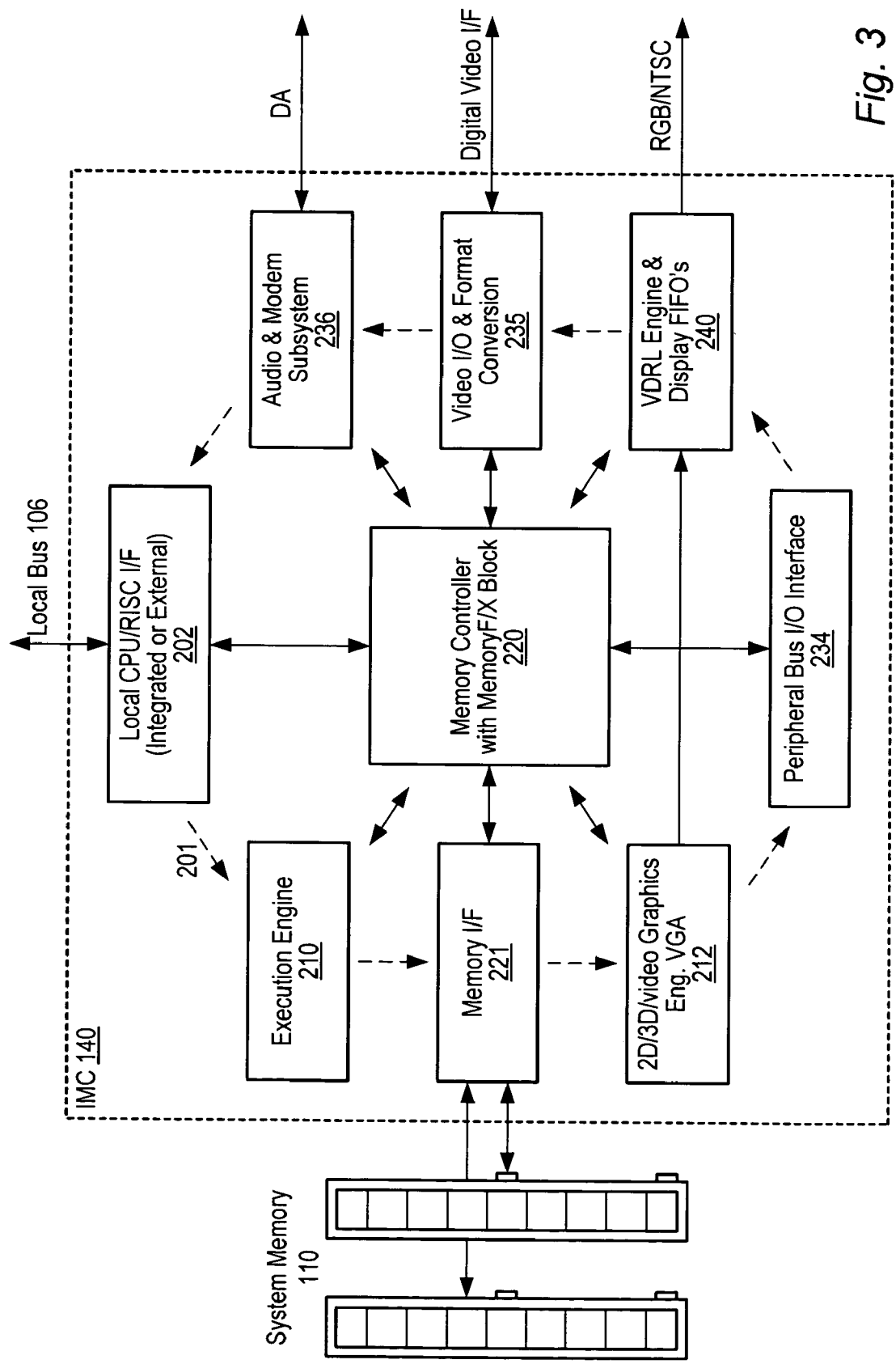
FIG. 3 illustrates the internal architecture of the IMC according to the preferred embodiment.

The IMC 140 of the present invention is preferably situated either on the main CPU bus or a high speed system peripheral bus. The IMC 140 may also be closely or directly integrated with the CPU 102, e.g., comprised on the same chip as the CPU 102. In the preferred embodiment, as shown in FIGS. 2 and 3, the IMC 140 is coupled directly to the Local bus 106 or CPU bus, wherein in the preferred embodiment the IMC 140 interfaces through a L2 cache system 104 to the CPU 102. In an alternate embodiment, the L2 cache and controller 104 may be integrated into the CPU 102 or into the IMC 140, or not used.

An I/O subsystem controller 116 is coupled to the Local bus 106. The I/O subsystem controller 116 in turn is coupled to an optional I/O bus 118. Various I/O devices are coupled to the I/O bus including a non-volatile memory, e.g., hard disk 120, keyboard 122, and mouse 124, as shown. In one embodiment the I/O bus is the PCI bus, and the I/O subsystem Controller 116 is coupled to the PCI bus.

Typical computer programs require more Local bus bandwidth for the transfer of application data than the transfer of program code executed by the CPU. Examples of application data include a bit mapped image, font tables for text output, information defined as constants, such as table or initialization information, etc. Graphical and/or video data, for example, is processed by the CPU 102 for display before the video data is written to the graphical output device. Therefore, in most cases, the actual program code executed by the CPU 102 which manipulates the application data consumes considerably less system memory 110 for storage than the application data itself.

The IMC 140 includes a novel system architecture which helps to eliminate system bandwidth bottlenecks and removes extra operations required by the CPU 102 to move and manipulate application data and/or program code. According to the present invention, the IMC 140 includes a data compression/decompression engine which allows application data and/or program code, i.e., any data in the system, to move about the system in a compressed format. The operation of the compression/decompression engine in the IMC 140 is discussed in greater detail below.

The IMC 140 also includes a high level protocol for the graphical manipulation of graphical data or video data which greatly reduces the amount of bus traffic required for video operations and thus greatly increases system performance. This high level protocol includes a display list based video refresh system and method whereby the movement of objects displayed on the video display device 142 does not necessarily require movement of pixel data in the system memory 110, but rather only requires the manipulation of display address pointers in a Display Refresh List, thus greatly increasing the performance of pixel bit block transfers, animation, and manipulation of 2D and 3D objects. For more information on the video/graphics operation of the IMC 140, please see U.S. Pat. No. 5,838,334. The IMC 140 also includes an improved system and method for rendering and displaying 3D objects.

FIG. 2 illustrates an example of the data transfer path of data within a computer system including the IMC 140 according to the present invention. As mentioned above, in typical computer systems, the program code and data is initially stored on the non-volatile memory 120. First, the IMC 140 reads program code and data stored on the non-volatile memory 120 using a direct memory access (DMA) method and/or burst control method, where the IMC 140 may act as a master on the local bus 106. The program code and data are read from the non-volatile memory 120 by the IMC 140 and stored in the system memory 110. In an alternative embodiment, the program code and data are transferred from the non-volatile memory 120 to the IMC 140 under CPU control. The data is transferred from the non-volatile memory 120 to the system memory 110 preferably in a compressed format, and thus the data requires less disk storage and reduced Local bus bandwidth. As the data is transferred from the non-volatile memory 120 to the IMC 140, the data is preferably decompressed by the decompression engine within the IMC 140 and stored in the system memory bank 110 in an uncompressed format. In general, magnetic media (hard disk) I/O transfer rates are sufficiently slow to allow decompression and storage of the data as the compressed data is received from the disk 120. Alternatively, the data is stored in the system memory in a compressed format. The data may also be stored in a cache in an uncompressed format.

The CPU 102 begins program execution by reading the recently decompressed program code from the system memory 110 from the cache. Alternatively, the decompression engine within the IMC 140 provides the uncompressed data to the CPU 102 in parallel with storing the uncompressed data in the system memory 110. In another alternate embodiment, where the data is stored in the memory in a compressed format, a CPU access of the data results in the data being decompressed and provided to the CPU 102.

Portions of the program code contain information necessary to write data and/or instructions back to the IMC 140 using a special graphical protocol to direct the IMC 140 to control the display output on the video display 142. In many cases, the graphical data correctly stored in the system memory 110 is not required to leave the system memory 110 and is not required to move to another location in system memory 110, but rather the display list-based operation and high level graphical protocol of the IMC 140 of the present invention enables the CPU 102 to instruct the IMC 104 how window and other graphical data is presented on the screen. This provides a tremendous improvement over prior art systems.

FIG. 3—IMC Block Diagram

FIG. 3 is a block diagram illustrating the internal components comprising the IMC 140 in the preferred embodiment. The IMC 140 preferably incorporates the MemoryF/X Technology according to the present invention. As shown, the present invention integrates a data compression/decompression engine and control functions into the memory controller unit 220 of the IMC 140. This reduces the amount of non-volatile (disk) storage or archive storage requirements and reduces the amount of bandwidth required to move data in the system, and thus reduces overall system costs. This also reduces the required amount of system memory because, when data is compressed for storage, more non-recently-used or off-screen data can be stored in system memory 110.

It is noted that the present invention may be incorporated into any of various types of computer systems or devices having various system architectures. In alternate embodiments of the present invention, the data compression/decompression engine can be integrated into any device that connects to memory. In some embodiments the present invention improves bandwidth and efficiency without increase in cost to the system or increased I/O bus requirements.

The memory controller may operate in different compression modes. One mode, referred to as normal compression mode, reduces the amount of memory used by translating addresses allocated by the operating system into new addresses which minimize the memory usage according to the compression that is performed. While this embodiment may reduce the amount of memory used, an alternate mode, referred to as priority compression mode, does not make use of memory size savings and instead trades off the additional saved memory for higher bandwidth and lower overall latency. In the priority compression mode, no changes to the software or operating system software are necessary (other than initialization code) to implement the compression/decompression improvements. The normal and priority compression modes are discussed below.

It is noted that various of the elements in FIG. 3 are interconnected with each other, wherein many of the various interconnections are not illustrated in FIG. 3 for simplicity.

As shown, the IMC 140 includes bus interface logic 202 for coupling to the host computer system, for coupling to the Local bus 106. In the preferred embodiment, the Local bus 106 is the CPU bus or host bus. Alternatively, the Local bus 106 is the PCI bus, and the bus interface logic 202 couples to the PCI bus. Instruction storage/decode logic (not shown) may be coupled to the bus interface logic 202.

The bus interface logic 202 couples to the memory control unit 220. The MemoryF/X technology preferably resides internal to the memory controller block 220. A control bus 201 connects all units to the local CPU interface 202. An execution engine 210 is coupled through the control bus 201 to the local CPU interface 202 and the memory interface 221 and the execution engine 210 also couples to the memory controller. Local bus 106 data and commands are routed through the local CPU interface to the control bus 201 which in turn is coupled to the execution engine 210, the memory interface 221, the graphics engine 212, the Peripheral I/O bus interface 234, the VDRL engine 240, a video input and format conversion unit 235 and finally the audio & modem subsystem 236. In addition the execution engine 210 is coupled to the main system memory 110 through the memory controller 220 and the memory interface 221.

The graphics engine 212 is also coupled to the main system memory 110 through the memory controller 220 and the memory interface 221. Thus, data is read and written for rasterization and pixel draw output by the graphics engine 212 with assistance for data transfer and efficiency by the memory controller 220. In addition, the other blocks are coupled under similar circumstances through the memory controller 220 and memory interface 221 to the system memory 110.

As shown in FIG. 3 the memory controller 220 transfers data between the system memory 110 and the requesting units. The requesting units include the execution engine 210, local CPU or RISC interface 202, audio and modem subsystem 236, Video I/O interface 235, VDRL engine 240, peripheral bus interface 234 and graphics engine 212. The requesting units will request the memory controller 220 for data transfer operations to the system memory 110 through the system memory interface 221. Each requesting unit may represent or utilize a different compression format, allowing higher memory efficiency. Thus, there are pluralities of data compression formats under control of the requesting units and supported by the memory controller block 220.

Figure 4:
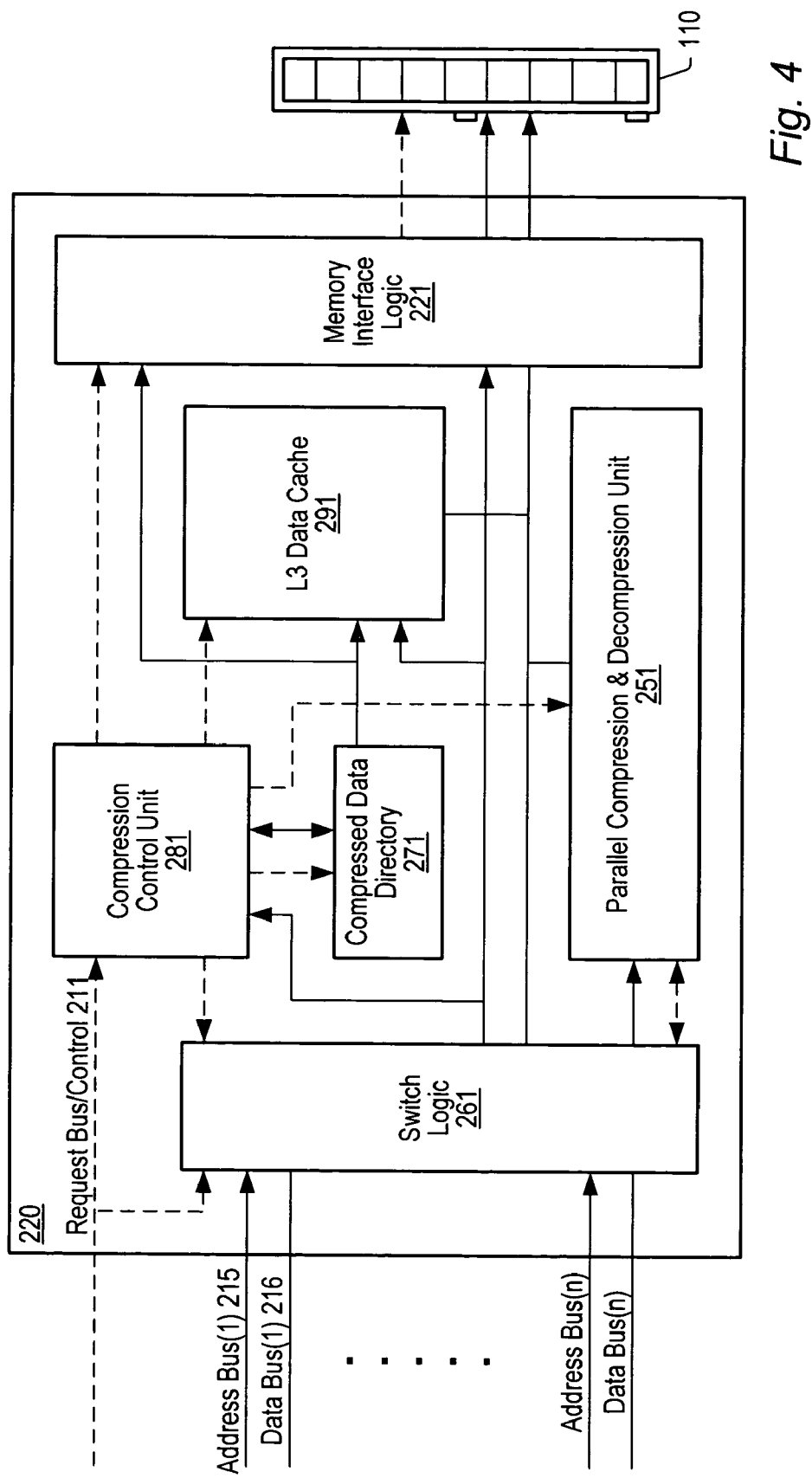
FIG. 4 is a block diagram illustrating the internal architecture of the Memory Controller unit of the IMC.

FIG. 4—Memory Controller Unit

FIG. 4 illustrates the memory controller block 220. In the preferred embodiment the memory controller 220 includes a parallel compression and decompression engine 251. In an alternate embodiment the memory controller 220 includes a single or serial compression engine and a single or serial decompression engine. Also, in the preferred embodiment, the parallel compression and decompression unit 251 includes a separate lossy compression and decompression engine (discussed later in this disclosure) which also may be designed as separate or unified units. Additional alternate embodiments may apply individual compression and/or decompression units located in multiple areas of the IMC 140 for optimal efficiency of compression or decompression.

The memory controller block 220 may include one or more parallel or serial compression/decompression engines, including one or more parallel and/or serial lossless compression/decompression engines and/or one or more parallel and/or serial lossy compression/decompression engines. The term "compression/decompression engine" as used herein is intended to include all such combinations of one or more parallel, serial, lossless and/or lossy compression/decompression engines, whether they be integrated or separate blocks, and whether they be comprised in or external to the memory controller, or comprised in another unit, such as the CPU 102.

Support blocks for the preferred embodiment of the memory controller 220 preferably include the switch logic 261, compression control unit 281, compressed data directory 271, L3 data cache memory 291, and the memory interface logic 221. Main system memory 110 in FIG. 4 is preferably external to the memory controller block 220 and is shown only for reference. In addition, the L3 data cache 291 may also be standard memory (SRAM or Embedded DRAM) in absence of external memory and may be configured other than as cache type memory. Input signals to the memory controller 220 preferably comprises a request bus and control bus 211, and a plurality of address buses 215 and data buses 216 from each requesting unit in the IMC 140 as indicated in FIG. 4. Alternatively, each of the requesting agents may share common address/data buses. The memory controller 220 generates output signals which interface to the main system memory 110. These output signals comprise a plurality control signals required to drive multiple DRAM memory devices as previously indicated.

Again referring to FIG. 4, the switch logic 261 preferably interfaces to all the requesting unit's address and data buses, including control buses and strobes necessary to indicate valid data and address cycles presented to the memory controller 220. The switch logic 261 also includes the necessary ports to drive address and data to the other units within the memory controller 220. The switch logic 261 controls read and write data to and from the parallel compression and decompression unit 251 and the compression control unit 281. In addition, for data that is not to be compressed or decompressed (normal or bypass data), the switch logic 261 controls an interface directly to the memory interface logic 221. In order to properly control the switching direction of the address and data for different data compression formats, the switch logic 261 receives control inputs from the compression control unit 281 and the Request bus 211. The switch logic 261 also interacts with the parallel compression and decompression unit 251 as described in detail later. Thus, the switch logic 261 arbitrates the incoming requests for memory control and data transfer operations, ranking requests in a priority scheme and filtering the requests for normal or compressed memory transactions.

Again referring to FIG. 4, the compression control unit 281 receives memory transaction requests from the request and control bus 211 and receives addresses from the switch unit 261 for control of each memory transaction. The compression control unit 281 directs the switch logic 261, the compression data directory 271, the local data cache memory (L3 data cache) 291, the memory interface logic 221, and the parallel compression and decompression unit 251 for proper operation and set-up for each memory transaction request. The compression control unit 281 interfaces to the compressed data directory 271. The compressed data directory 271 is used for look up of the address block start location for either the L3 data cache 291, the SRAM buffers (located in the Parallel Compression and Decompression unit 251) or the system memory 110. Thus, the compression control unit 281 receives requests from other units in the IMC 140, translates the location by address, determines the compression block size, and controls the sub-units of the memory controller 220 for the proper address and data transactions as required to read or write data to and from the main system memory 110.

The data cache 291 shown in FIG. 4 is used to minimize the latency of operation by returning requested data that has been recently used. The data cache 291 is an L3 data cache where the CPU 102 or system includes L1 and L2 caches. The cache 291 may also operate as an L2 or L1 cache for the CPU 102, as desired. The cache 291 is referred to as an L3 cache in this description.

The L3 data cache size will determine the average number of clocks required to return data to the requesting units of the IMC 140. In the present embodiment, most recently used data is stored in a non-compressed format in the L3 data cache 291. For data that resides in the L3 data cache 291, no compression or decompression action is required by the parallel compression and decompression unit 251. Thus, a transaction request with an L3 data cache hit can return data with less latency than a transaction request that requires a main memory 110 transaction. The L3 data cache 291 typically contains only uncompressed data, although in alternate embodiments the L3 cache 291 may store most recently used data in a compressed format, or in a combination of compressed and non-compressed formats. Thus the L3 data cache 291 located in the memory controller 210 can return most recently used data without the normal latency delay associated with conventional memory controllers.

In one embodiment where the parallel compression and decompression engine 251 does not contain SRAM buffer storage, the L3 data cache 291 can double for such SRAM buffers used to store write blocks for future compression and read blocks for future decompression. Thus the L3 data cache 290 may be used to store compressed blocks which await future decompression for either read or write operations. For example, the L3 data cache 291 may be used to store LRU pages that are waiting to be compressed and transferred to the non-volatile memory. Thus the L3 data cache 291 and associated cache control logic 281 buffer the transactions to improve memory access latency for both read and write operations of both compressed/decompressed transactions or transactions which require uncompressed operation (no compression or decompression).

Again referring to FIG. 4, the memory interface logic 221 receives control signals form the compression control unit, receives address and data from either the switch logic 261 (non-compressed transactions), or the compression data directory 271 and controls the timing and delivery voltage levels to the main memory 110 depending on the DRAM device type. Thus the memory interface logic 221 is used to interface to the main system memory 110 matching the memory configuration and device type.

The Parallel compression and decompression unit 251 is described in detail in the following sections.

Figure 5:
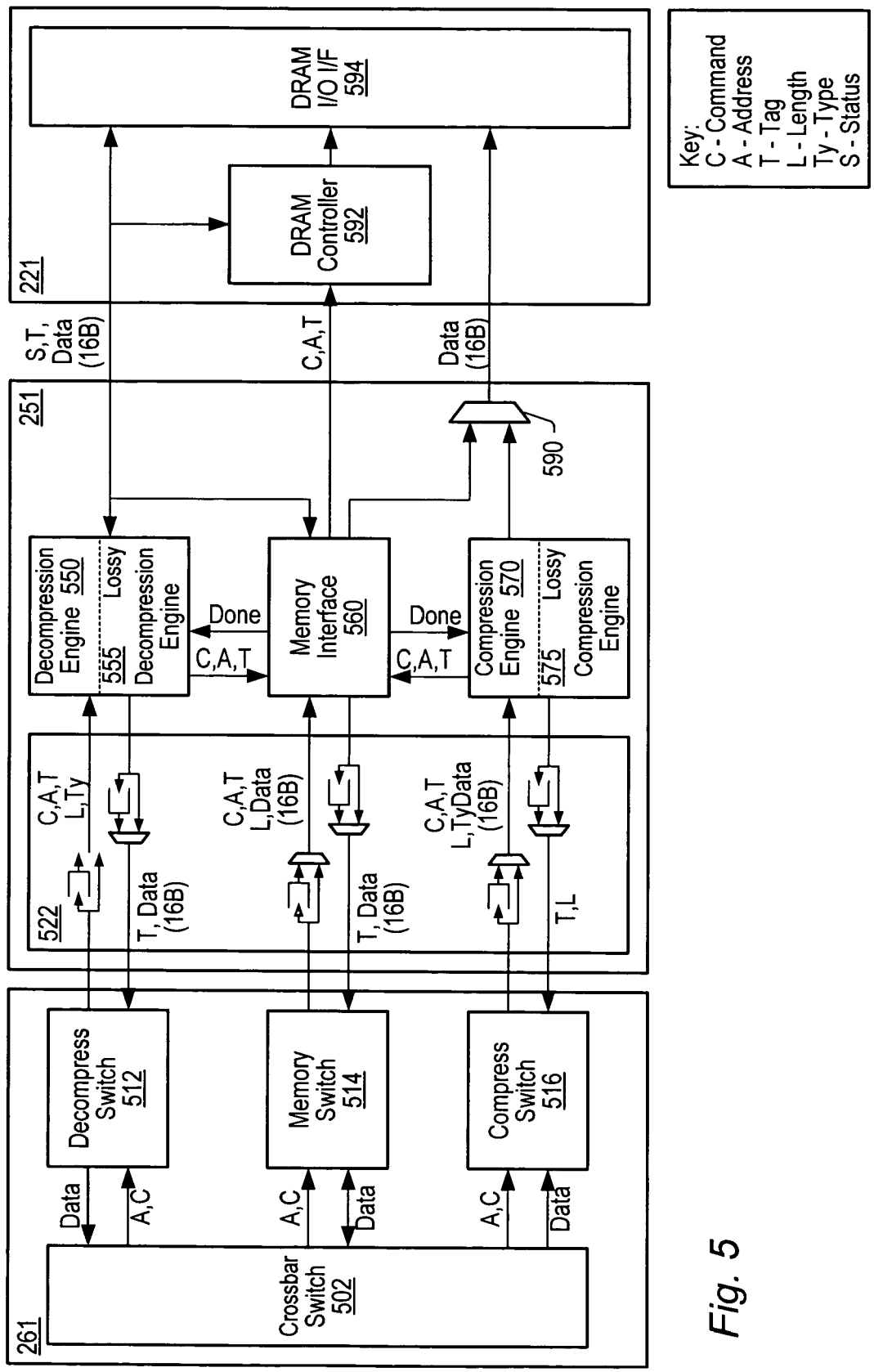
FIG. 5 is a more detailed block diagram illustrating the compression/decompression logic comprised in the IMC 140.

FIG. 5—Compression/Decompression Engine

As shown in FIG. 5, the parallel compression and decompression 251 block preferably includes compression engines 570/575 and decompression engines 550/555. As noted above, the parallel compression and decompression unit 251 may contain a single lossless parallel compression and decompression engine and/or a single lossy compression and decompression engine, or a combination of lossless and/or lossy engines.

The parallel compression and decompression unit 251 performs high speed parallel compression and decompression using a parallel symbol data stream, instead of a serial symbol data stream as in conventional implementations. The parallel operation of the compression and decompression unit 251 is optimized for bandwidth reduction and reduced latency. Thus the parallel compression and decompression engines allows a higher speed decompression and compression rate, which substantially increases bandwidth and reduces latency of that over prior art compression and decompression engines. The algorithm for the parallel compression invention is further described in detail below.

FIG. 5 also illustrates the internal diagram of the switch logic 261. The switch 261 performs data format and address conversion as well as the arbitration of multiple requests from a plurality of other units in the IMC 140. The switch logic 261 includes a crossbar switch 502 that performs the selection of the current memory transaction request. This selection is performed by one of a plurality of arbitration methods with the intention to deliver data first to units that must operate real time memory transactions. In the preferred embodiment, the order of priority for such requesting units is first the display refresh requests from the VDRL engine 240, followed by the Video I/O unit 235, the Audio and Modem 236, the Local CPU/RISC interface 202, the Graphics engine 212 and execution engine 210, followed by the Peripheral I/O bus interface 234. The priority order, block size, and request latency is software programmable by the interface driver software for the IMC 140. Thus, the system performance and memory transaction efficiency and/or response can be adjusted dynamically by software control executed by the interface drivers. Such interface software is preferably executed on the CPU 102 but alternatively can be executed by the execution engine 210.

The switch logic 261 preferably contains specific data selection units separating normal uncompressed reads and writes from compressed reads and writes. Decompression switch 512 determines a block read operation by sending command, address, block tags, data type and length information to the decompression engine 550 and 555. In addition the decompression switch 512 receives decompressed data and transaction tag information from the decompression engine 550 and/or 555. The decompression switch 512 is preferably pipelined for a plurality of system memory read requests at the same time. The tag field allows multiple outstanding requests to be issued to the decompression engines 550 and/or 555 in parallel.

Similarly, the switch logic 261 contains a normal memory switch 514 for read and write transactions that require no compression or decompression operation. In the preferred embodiment, some data address ranges or requests from specific request units may not need or want to have compression operations. Thus the memory switch 514 generates block transfer, address generation, data tags, length and command information for interface to the memory interface unit 560.

The switch logic 261 includes compress switch 516 which performs command, address, tag, length and data type preparation for the compression engine 570 and/or 575. Data written to the memory controller 220 by a plurality of requesting units 211 are received by the compress switch 516 and will be either compressed and written to main memory 110 or, if in the valid address range of the L3 data cache 291, will be written to the L3 data cache 291 under control of the memory switch 514.

Thus, the compression cache control unit 281 along with the switch unit 261 determine the transaction type, priority and control required to complete the transaction by either the L3 data cache 291, the parallel compression and decompression unit 251 or the main memory interface 560. As indicated in FIG. 5, the preferred embodiment shows transaction sizes of 16 data bytes. In alternate embodiments the transaction sizes can be any number of data bytes.

As discussed above in FIG. 4, the L3 data cache 291 interacts with the cache control unit 281. For transactions that have address ranges with associated data located within the L3 data cache 291, the decompression engine 550, memory interface 560, and compression engine 570, are not used, and data is read or written directly into the L3 data cache 291. Thus, for L3 data cache 291 hits, data bypasses the parallel compression and decompression unit 251 and is read or written directly to/from the L3 data cache 291 in a non-compressed format.

In addition, again referring to FIG. 5, the parallel compression and decompression unit 251 includes data and command transfer multiplexers 522 and write data multiplexers 590. The command transfer multiplexers 522 perform data, command address, tag, length switching and interfacing to the decompression engine 550/555, memory interface 560, and compression engines 570/575. Alternate embodiments may include the transfer multiplexers 522 in the switch logic 261 in a single rather than multiple bus design. The write data multiplexers 590 perform the selection between normal (uncompressed) data writes and compressed data writes to the main memory 110.

The memory interface unit 221 interfaces to the decompression engines 550 and/or 555 for status, tags and read data, interfaces to the memory interface 560 for both read, write control, address and tags, and interfaces to the compression engines 570 and/or 575 for write data. The memory interface unit 221 includes a DRAM controller 592 and a DRAM I/O interface 594. The DRAM controller 592 performs the timing of the control signals and address to the DRAM I/O interface 594 to control the main memory bank 110. In the preferred embodiment the control of RDRAM memory is controlled by the high speed analog RAC located within the DRAM I/O interface 594. In alternate embodiments other memory types such as SDRAM, DRDRAM, SLDRAM, or VMC require additional logic in the DRAM I/O interface 594. Thus, the memory interface logic 221 is internal to the memory controller 220 and interfaces to the compression control unit 281 for control signals, the switch logic 261 for address, tags, control and data signals, the parallel compression and decompression unit 251 for address, control and data transactions. In addition the memory interface logic 221 performs the memory interface and signal conditioning for interfacing to the main system memory 110.

Parallel Lossless Compression and Decompression

The parallel compression/decompression unit or engine 251, which performs parallel compression and decompression functions, is now discussed. The engine 251 is preferably a dedicated codec hardware engine, e.g., the engine is comprised of logic circuitry. In one embodiment, the codec engine 251 comprises a programmable DSP or CPU core, or programmable compression/decompression processor, with one or more ROMs or RAMs which store different sets of microcode for certain functions, such as compression, decompression, special types of graphical compression and decompression, and bit blit operations, as desired. In this embodiment, the codec engine 251 dynamically shifts between the different sets of microcode in the one or more memories, depending on the function being performed. The compression/decompression engine may also be implemented using reconfigurable or programmable logic, e.g., one or more FPGAs.

As shown in FIG. 5, in one embodiment, the engine 251 preferably includes an embedded lossless parallel data compression engine 570 and parallel decompression engine 550 designed to compress and decompress data as data is transferred to/from system memory 110. The compression engine 570 and decompression engine 550 may be constructed using any of the techniques described with reference to the engine 251, including hardware engines comprised of logic circuitry, programmable CPUs, DSPs, a dedicated compression/decompression processor, or reconfigurable or programmable logic, to perform the parallel compression and decompression method of the present invention. Various other implementations may be used to embed a compression/decompression within the memory controller according to the present invention. In the preferred embodiment, the compression engine 570 and decompression engine 550 comprise hardware engines in the IMC 140, or alternatively use pieces of the same engine for compression and decompression. In the following description, the parallel compression and decompression unit is described as having separate compression and decompression engines 570 and 550.

For a general overview of the benefits and methods for using compression and decompression engines in the main system memory controller, refer to US patent disclosure titled "Memory Controller Including Embedded Data Compression and Decompression Engines", filed Jun. 5, 1995, Ser. No. 08/463,106, whose inventor is Thomas A. Dye.

Thus, the IMC 140 includes two data formats referred to as "compressed" data and "non-compressed" data. The compressed data format requires less storage and thus is less expensive. The compressed format also requires less system bandwidth to transfer data between system memory 110 and I/O subsystems. The decompression from compressed data format to normal data format results in a small performance penalty. However, the compression of non-compressed data format to compressed data format does not have an associated penalty, although there may be an added latency which would normally be hidden. However, if the data doesn't compress well, and there is a long series of stores which need compressed, the bus could be backed up causing read and snoop delays to the processor. In one embodiment, the compression engine 570 is implemented in software by the CPU 102.

In the preferred embodiment, the compression engine 570 and decompression engine 550 in the IMC 140 comprise one or more hardware engines that perform a novel parallel lossless compression method, preferably a "parallel" dictionary based compression and decompression algorithm. The parallel algorithm may be based on a serial dictionary based algorithm, such as the LZ77 (preferably LZSS) dictionary based compression and decompression algorithm. The parallel algorithm may be based on any variation of conventional serial LZ compression, including LZ77, LZ78, LZW and/or LZRW1, among others.

The parallel algorithm could also be based on Run Length Encoding, Predictive Encoding, Huffman, Arithmetic, or any other lossless compression algorithm. However, the parallelizing of these is less preferred due to their lower compression capabilities and/or higher hardware costs.

As a base technology, any of various lossless compression methods may be used as desired. As noted above, a parallel implementation of LZSS compression is preferably used, although other lossless compression methods may allow for fast parallel compression and decompression specifically designed for the purpose of improved memory bandwidth and efficiency.

For more information on a data compression and decompression system using serial LZ compression, please see U.S. Pat. No. 4,464,650 which is hereby incorporated by reference. The above patent presents implementations of the LZ77 data compression method described by Lempel and Ziv in "Compression of Individual Sequences Via Variable-Rate Coding," IEEE Transactions on Information Theory, IT-5, September 1977, pages 530–537, and "A Universal Algorithm for Sequential Data Compression," IEEE Transactions on Information Theory, Volume 23, No. 3 (IT-23-3), May 1977, pages 337–343, wherein the above two articles are both hereby incorporated by reference. U.S. Pat. No. 4,701,745, titled "Data Compression System," which issued Oct. 20, 1987, describes a variant of LZ77 called LZRW1, and this patent is hereby incorporated by reference in its entirety. A modified version of the LZ78 algorithm is referred to as LZW and is described in U.S. Pat. No. 4,558,302. Another variant of LZW compression is described in U.S. Pat. No. 4,814,746.

In an alternate embodiment, the data compression and decompression engines 570 and 550 utilize parallel data compression/decompression processor hardware based on the technology disclosed in U.S. Pat. No. 5,410,671, titled "Data Compression/Decompression Processor," which issued Apr. 25, 1995 and which is hereby incorporated by reference in its entirety.

The IMC 140 may also utilize parallel data compression/decompression techniques of the present invention based on the serial techniques described in U.S. Pat. No. 5,406,279 titled "General Purpose, Hash-Based Technique for Single Pass Lossless Data Compression,"; U.S. Pat. No. 5,406,278 titled "Method and Apparatus for Data Compression Having an Improved Matching Algorithm which Utilizes a Parallel Hashing Technique,"; and U.S. Pat. No. 5,396,595 titled "Method and System for Compression and Decompression of Data." In alternate embodiments, other types of parallel or serial data compression/decompression methods may be used.

The compression/decompression engine 251 of the present invention may include specialized compression/decompression engines 575/555 for image data. The preferred embodiment of the lossy compression/decompression engine is described with reference to FIGS. 17–20, and a parallel version is described with reference to FIGS. 32–36.

Other embodiment may utilize image compression and decompression techniques shown and described in U.S. Pat. No. 5,046,119 titled "Method and Apparatus for Compressing and Decompressing Color Video Data with an Anti-Aliasing Mode," this patent being hereby incorporated by reference in its entirety. For related information on compression and decompression engines for video applications, please see U.S. Pat. No. 5,379,356 titled "Decompression Processor for Video Applications," U.S. Pat. No. 5,398,066 titled "Method and Apparatus for Compression and Decompression of Digital Color Images," U.S. Pat. No. 5,402,146 titled "System and Method for Video Compression with Artifact Disbursement Control," and U.S. Pat. No. 5,379,351 titled "Video Compression/Decompression Processing and Processors," all of which are hereby incorporated by reference in their entirety.

FIG. 6A—Prior Art

Figure 6A:
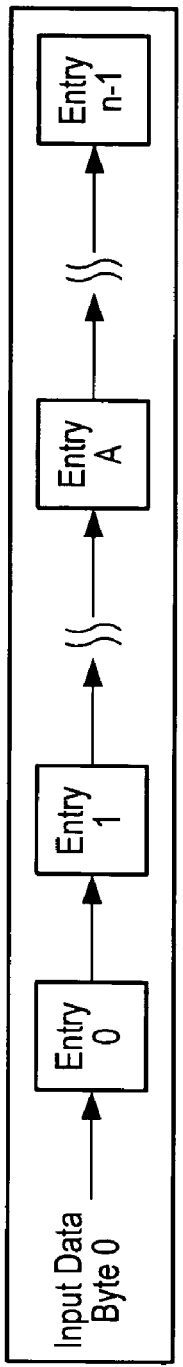
FIG. 6A illustrates the sequential compression technique of the prior art dictionary-based LZ serial compression algorithm.

Prior art has made use of the LZ compression algorithm for design of computer hardware, but the bandwidth of the data stream has been limited due to the need to serially review the incoming data to properly generate the compressed output stream. FIG. 6A depicts the prior art normal history table implementation.

The LZ compression algorithm attempts to reduce the number of bits required to store data by searching that data for repeated symbols or groups of symbols. A hardware implementation of an LZ77 algorithm would make use of a history table to remember the last n symbols of a data stream so that they could be compared with the incoming data. When a match is found between the incoming stream and the history table, the matching symbols from the stream are replaced by a compressed symbol, which describes how to recover the symbols from the history table.

Figure 6B:
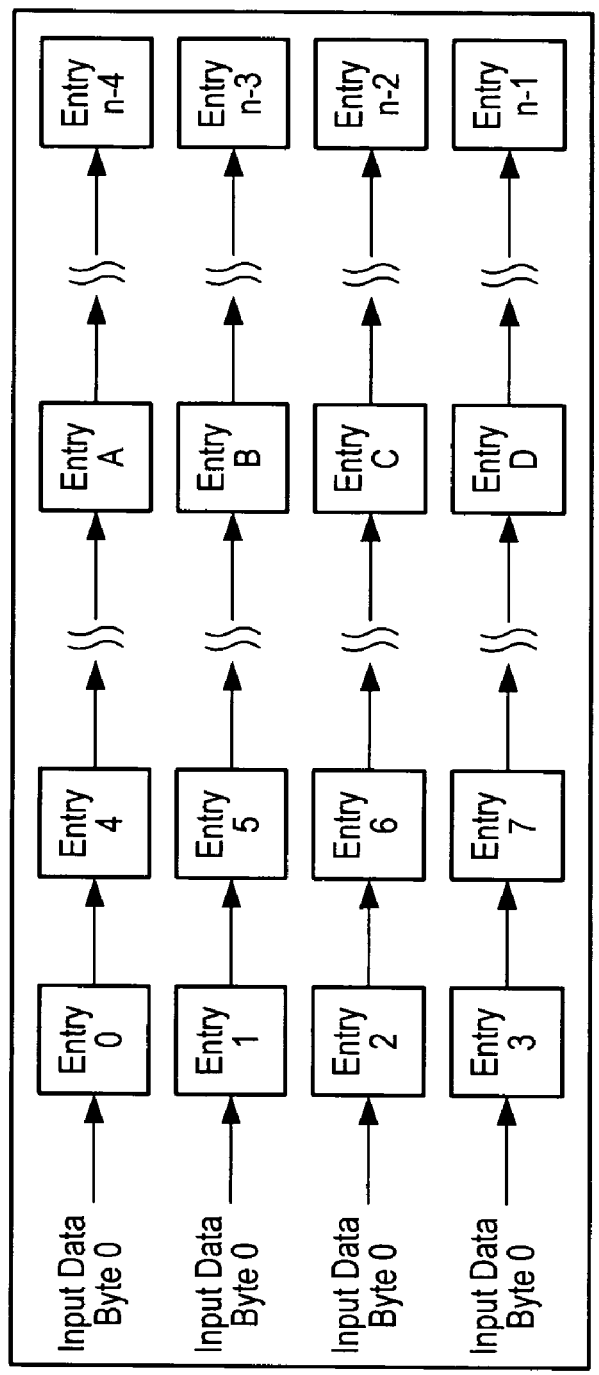
FIG. 6B illustrates the parallel compression algorithm according to the present invention.

FIG. 6B—Parallel Algorithm

The preferred embodiment of the present invention provides a parallel implementation of dictionary based (or history table based) compression/decompression. By designing a parallel history table, and the associated compare logic, the bandwidth of the compression algorithm can be increased many times. This specification describes the implementation of a 4 symbol parallel algorithm which results in a 4 times improvement in the bandwidth of the implementation with no reduction in the compression ratio of the data. In alternate embodiments, the number of symbols and parallel history table can be increased and scaled beyond four for improved parallel operation and bandwidth, or reduced to ease the hardware circuit requirements. In general, the parallel compression algorithm can be a 2 symbol parallel algorithm or greater, and is preferably a multiple of 2, e.g., 2, 4, 8, 16, 32, etc. The parallel algorithm is described below with reference to a 4 symbol parallel algorithm for illustrative purposes.

The parallel algorithm comprises paralleling three parts of the serial algorithm: the history table (or history window), analysis of symbols and compressed stream selection, and the output generation. In the preferred embodiment the data-flow through the history table becomes a 4 symbol parallel flow instead of a single symbol history table. Also, 4 symbols are analyzed in parallel, and multiple compressed outputs may also be provided in parallel. Other alternate embodiments may contain a plurality of compression windows for decompression of multiple streams, allowing a context switch between decompression of individual data blocks. Such alternate embodiments may increase the cost and gate counts with the advantage of suspending current block decompression in favor of other block decompression to reduce latency during fetch operations. For ease of discussion, this disclosure will assume a symbol to be a byte of data. Symbols can be any reasonable size as required by the implementation. FIG. 6B shows the data-flow for the parallel history table.

Figure 7:
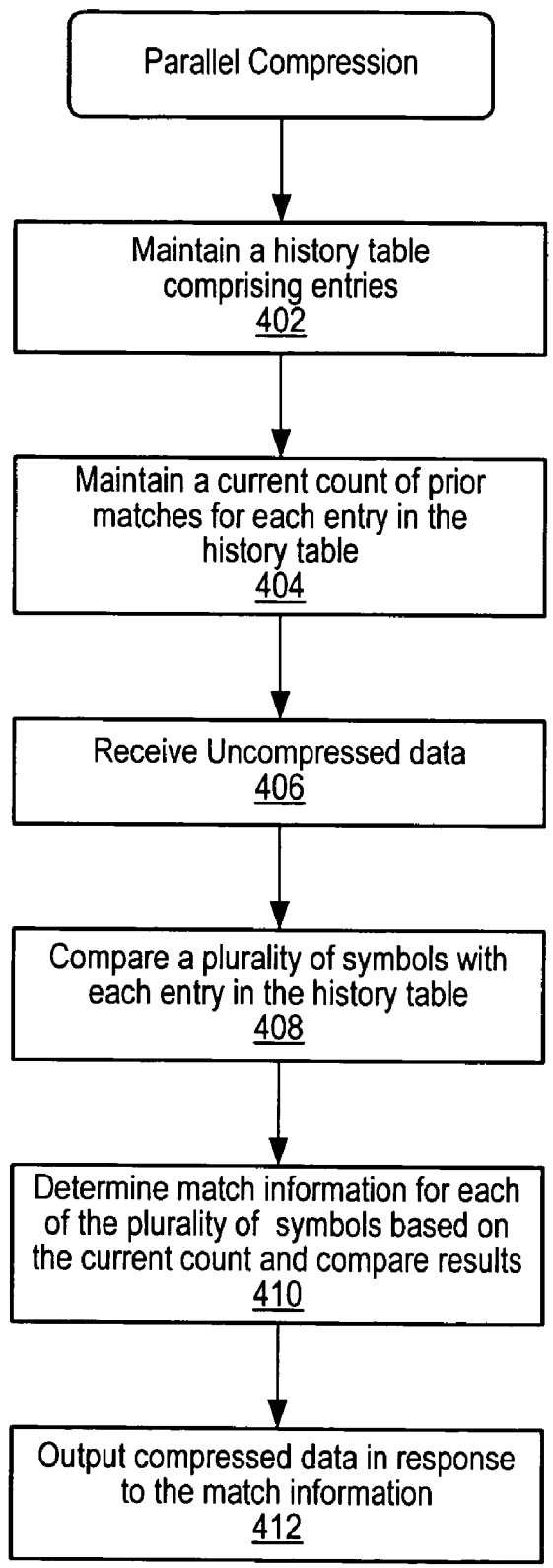
FIG. 7 is a high level flowchart diagram illustrating operation of the parallel compression.

FIG. 7—High Level Flowchart of the Parallel Compression Algorithm

FIG. 7 is a high level flowchart diagram illustrating operation of the parallel compression algorithm in the preferred embodiment. Steps in the flowchart may occur concurrently or in different orders.

In step 402 the method maintains a history table (also called a history window) comprising entries, wherein each entry may comprise one symbol. The history table is preferably a sliding window which stores the last n symbols of the data stream.

In step 404 the method maintains a current count of prior matches which occurred when previous symbols were compared with entries in the history table. A count is maintained for each entry in the history table.

It is noted that maintenance of the history table and the current counts are performed throughout the algorithm based on previously received symbols, preferably starting when the first plurality of symbols are received for compression.

In step 406 the method receives uncompressed data, wherein the uncompressed data comprises a plurality of symbols. Thus the parallel compression algorithm operates on a plurality of symbols at a time. This is different than conventional prior art serial algorithms, which operate in a serial manner on only one symbol at a time. The plurality of symbols comprises 2 or more symbols, preferably a power of 2. In the preferred embodiment, the parallel compression algorithm operates on 4 symbols at a time. However, implementations using 8, 16, 32 or more symbols, as well as other non-power of 2 numbers, may be readily accomplished using the algorithm described herein.

In step 408 the method compares the plurality of symbols with each entry in the history table in a parallel fashion. This comparison produces compare results. Each entry in the history table preferably compares with each of the plurality of symbols concurrently, i.e., in a parallel fashion, for improved speed.

In step 410 the method determines match information for each of the plurality of symbols based on the current count and the compare results. Step 410 of determining match information includes determining zero or more matches of the plurality of symbols with each entry in the history table. More specifically, step 410 may include determining a longest contiguous match based on the current count and the compare results, and then determining if the longest contiguous match has stopped matching. If the longest contiguous match has stopped matching, then the method resets or updates the current counts.

As noted above, step 410 also includes resetting the counts for all entries if the compare results indicate a contiguous match did not match one of the plurality of symbols. The counts for all entries are preferably reset based on the number of the plurality of symbols that did not match in the contiguous match. In the preferred embodiment, the method generates a reset value for all entries based on the compare results for a contiguous match. The reset value indicates a number of the plurality of symbols that did not match in the contiguous match as indicated in the compare results. The method then updates the current counts according to the compare results and the reset value.

In step 412 the method outputs compressed data information in response to the match information. Step 412 may involve outputting a plurality of sets of compressed data information in parallel, e.g., for different matches and/or for non-matching symbols. Step 412 includes outputting compressed data information corresponding to the longest contiguous match which stopped matching, if any. The contiguous match may involve a match from a prior plurality of symbols. Step 412 may also include outputting compressed data information solely from a prior match. Step 412 also includes, for non-matching symbols which do not match any entry in the history table, outputting the non-matching symbols in an uncompressed format.

For a contiguous match, the compressed data information includes a count value and an entry pointer. The entry pointer points to the entry in the history table which produced the contiguous match, and the count value indicates a number of matching symbols in the contiguous match. In one embodiment, an encoded value is output as the count value, wherein more often occurring counts are encoded with fewer bits than less often occurring counts.

Steps 402–412 are repeated one or more times until no more data is available. When no more data is available, then, if any current counts are non-zero, the method outputs compressed data for the longest remaining match in the history table.

Since the method performs parallel compression, operating on a plurality of symbols at a time, the method preferably accounts for symbol matches comprised entirely within a given plurality of symbols, referred to as the "special case". Here presume that the plurality of symbols includes a first symbol, a last symbol, and one or more middle symbols. Step 410 of determining match information includes detecting if at least one contiguous match occurs with one or more respective contiguous middle symbols, and the one or more respective contiguous middle symbols are not involved in a match with either the symbol before or after the respective contiguous middle symbols. If this condition is detected, then the method selects the one or more largest non-overlapping contiguous matches involving the middle symbols. In this instance, step 412 includes outputting compressed data for each of the selected matches involving the middle symbols.

Figure 8:
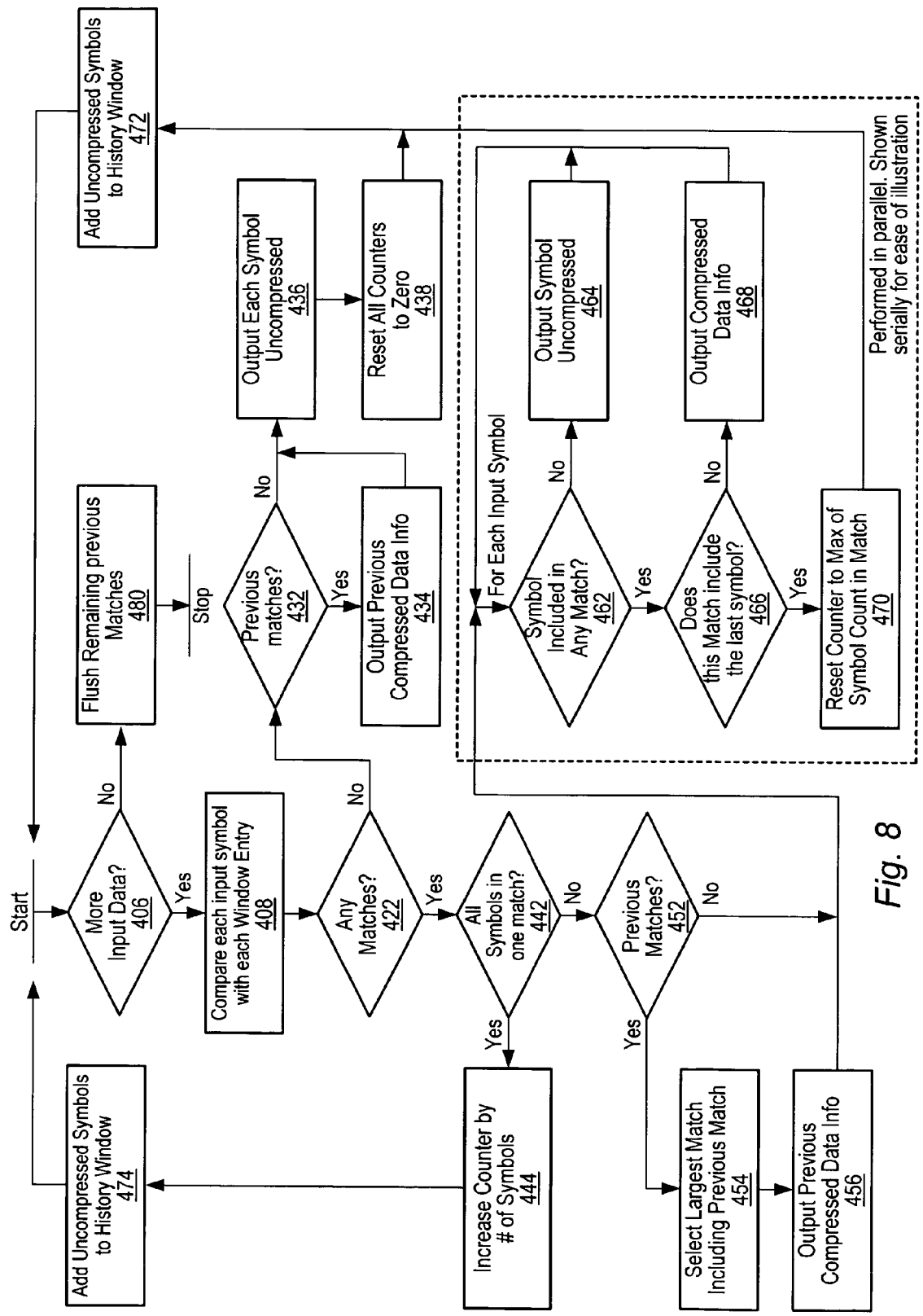
FIG. 8 is a more detailed flowchart diagram illustrating operation of the parallel compression.

FIG. 8—Detailed Flowchart of the Parallel Compression Algorithm

FIG. 8 is a more detailed flowchart diagram illustrating operation of the parallel compression algorithm in the preferred embodiment. Steps which are similar or identical to steps in FIG. 7 have the same reference numerals for convenience.

In the flowchart of FIG. 8, it is presumed that the method maintains a history table comprising entries, wherein each entry comprises one symbol. The history table is preferably a sliding window which stores the last n symbols of the data stream. It is also presumed that the method maintains a current count of prior matches which occurred when previous symbols were compared with entries in the history table. A count is maintained for each entry in the history table. As noted above, the maintenance of the history table and the current counts are performed throughout the algorithm, preferably starting when the first plurality of symbols are received for compression.

In step 406 the method receives uncompressed input data, wherein the uncompressed data comprises a plurality (or group) of symbols. Thus the parallel compression algorithm operates on a plurality of symbols at a time. This is different than conventional prior art algorithms, which operate in a serial manner on only one symbol at a time. The plurality of symbols comprises 2 or more symbols, preferably 4 symbols. As noted above, the parallel compression algorithm can operate on any number of symbols at a time. The input data may be the first group of symbols from a data stream or a group of symbols from the middle or end of the data stream.

In step 408 the method compares the plurality of symbols with each entry in the history table in a parallel fashion. This comparison produces compare results. Each entry in the history table preferably compares with each of the plurality of symbols concurrently, i.e., in a parallel fashion, for improved speed.

In step 422 the method determines zero or more matches of the plurality of symbols with each entry in the history table. In other words, in step 422 the method determines, for each entry, whether the entry matched any of the plurality of symbols. This determination is based on the compare results.

If no matches are detected for the plurality of symbols in step 422, then in step 432 the method determines if any previous matches existed. In other words, step 432 determines if one or more ending symbols from the prior group of symbols matched entries in the history table, and compressed information was not yet output for these symbols since the method was waiting for the new plurality of symbols to possibly determine a longer contiguous match. If one or more previous matches existed as determined in step 432, then in step 434 the method outputs the previous compressed data information. In this case, since the prior matches from the prior group of symbols are not contiguous with any symbols in the current group, the previous compressed data information is output. After step 434, operation proceeds to step 436.

If no previous matches existed as determined in step 432, or after step 434, then in step 436 the method outputs each symbol of the plurality of symbols as uncompressed symbols. Since each of the plurality of symbols does not match any entry in the history table, then each of the plurality of symbols are output in an uncompressed format. After step 436, in step 438 all counters are reset to 0. In step 472 the uncompressed symbols are added to the history window, and operation returns to step 406 to receive more input data, i.e., more input symbols.

If one or more matches are detected for the plurality of symbols in step 422, then in step 442 the method determines if all of the plurality of symbols are comprised in one match. If so, then in step 444 the method increases the count for the respective entry by the number of matching symbols, e.g., 4 symbols. In step 474 the uncompressed symbols are added to the history window, and operation returns to step 406 to receive more input data, i.e., more input symbols. In this case, the method defers providing any output information in order to wait and determine if any symbols in the next group contiguously match with the current matching symbols.

If all of the plurality of symbols are not comprised in one match as determined in step 442, then in step 452 the method determines if any previous matches existed. The determination in step 452 is similar to the determination in step 432, and involves determining if one or more ending symbols from the prior group of symbols matched entries in the history table, and compressed information was not yet output for these symbols since the method was waiting for the new plurality of symbols to possibly determine a longer contiguous match.

If one or more previous matches existed as determined in step 452, then in step 454 the method selects the largest contiguous match including the previous match. In step 456 the method outputs compressed data information regarding the largest contiguous match. This compressed data information will include previous compressed data information, since it at least partly involves a previous match from the previous group of symbols. If the first symbol in the current plurality of symbols is not a contiguous match with the previous match, then the compressed data information will comprise only the previous compressed data information. After step 456, operation proceeds to step 462.

Steps 462–470 are performed for each input symbol in a parallel fashion. In other words, steps 462–470 are performed concurrently for each input symbol. Steps 462–470 are shown in a serial format for ease of illustration.

In step 462 the method determines if the respective symbol is included in any match. If not, then in step 464 the method outputs the uncompressed symbol. In this case, the respective symbol does not match any entry in the history table, and thus the symbol is output uncompressed.

If the respective symbol is included in a match as determined in step 462, then in step 466 the method determines if the match includes the last symbol. If not, then in step 468 the method outputs compressed data information for the match. It is noted that this may involve a "special case" involving a match comprising only one or more middle symbols.

If the match does include the last symbol as determined in step 466, then in step 470 the method resets counters to the maximum of the symbol count in the match. In this case, compressed information is not output for these symbols since the method waits for the new plurality of symbols to possibly determine a longer contiguous match.

Once steps 462–470 are performed for each input symbol in parallel, then in step 472 the uncompressed symbols are added to the history window. Operation then returns to step 406 to receive more input data, i.e., a new plurality or group of input symbols. If no more input data is available or is received, then in step 480 the method flushes the remaining previous matches, i.e., provides compressed information for any remaining previous matches.

The method of FIG. 8 also accounts for matches within the middle symbols as described above.

Figure 9:
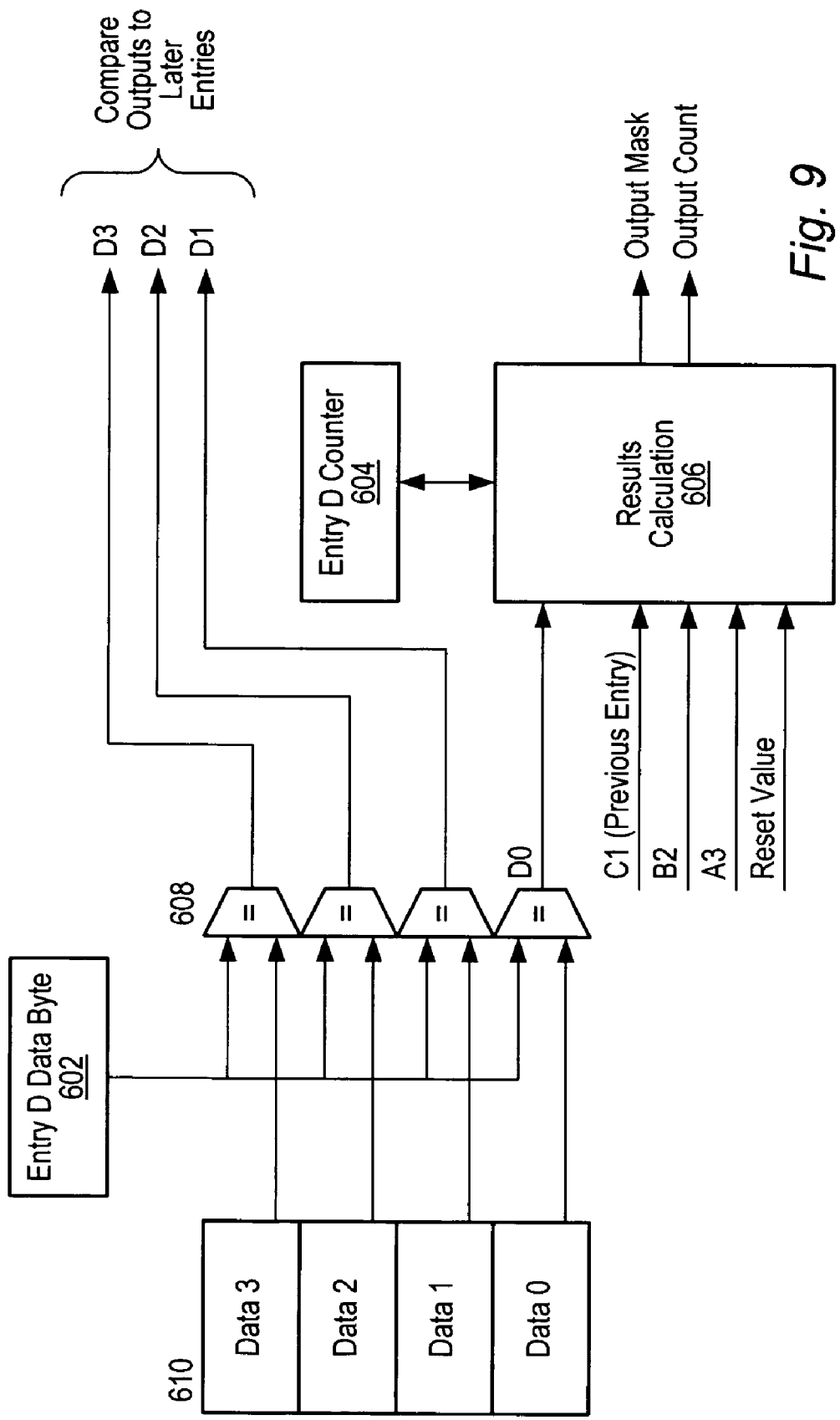
FIG. 9 illustrates the entry data history and input data compare and results calculation for the parallel compression and decompression unit.
Figure 10:
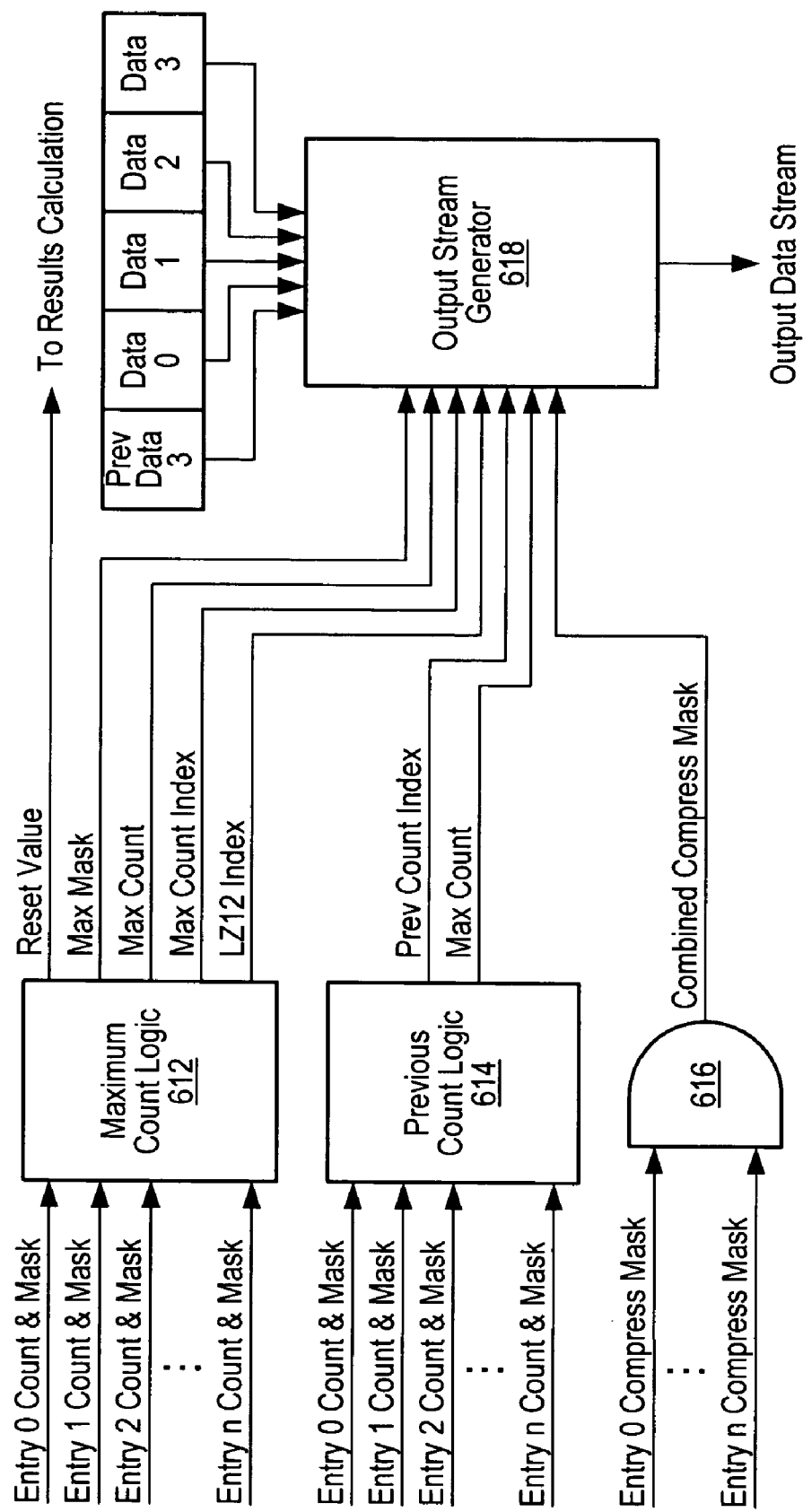
FIG. 10 shows the parallel selection and output generation block diagram.

FIGS. 9 and 10—Operation of the Parallel Compression Algorithm

FIGS. 9 and 10 are hardware diagrams illustrating operation of the parallel compression algorithm. As with the prior art LZ serial algorithm, each entry of the history table contains a symbol (byte) of data, which is compared with the input stream of data 610. The input stream 610 comprises Data0, Data1, Data2 and Data3. FIG. 9 illustrates an entry of the history table, referred to as entry D 602. As shown entry D 602 is compared with each symbol of the input stream 610. FIG. 9 illustrates Entry D 602 of the parallel implementation, and its inputs and outputs. Comparators 608 compare each data byte entry with the 4 bytes from the input stream 610, and generate 4 compare signals (labeled D0 through D3 for entry D). Compare signal D0 is used in entry D. The compare signal D1 will be used by the next entry E in the history table, compare signal D2 will be used by entry F, and compare signal D3 will be used by entry G. Accordingly, entry D uses compare signal 3 from entry A, 2 from compare signal entry B and code 1 from entry C. These can be seen as inputs to the results calculation block 606 in FIG. 9. The results of this compare are held in a counter 604 that is part of the entry logic. The counter values are sent to the compressed stream selection logic 612/614/616 (FIG. 10) to determine if the input data is being compressed or not. This information is forwarded to the output generation logic 618 which sends either the uncompressed data to the output, or the compressed stream data.

The generation of the Output Mask and Output count from the results calculation block 606, along with the Entry Counter update value, is described in the table of FIG. 11. The New Counter Value is calculated by counting the number of matches that occur beginning with A3 and continuing to D0. For example, an A3 and B2 match without a C1 match sets the counter to 2. The special case of all four compares matching adds 4 to the present counter value.

Generation of the counter output is similar, comprising the Saved counter (counter value prior to the setting of the new counter value) plus the count of matches starting with D0 and continuing to A3. The output mask is generated by inverting the 4 match signals and adding a $5^{th}$ signal which is 1 for all cases except for a special case of a C1 and B2 match without a D0 or an A3 match. This special case allows the compression of the two bytes centered in the input word. The Reset Value will be generated by the selection logic 612 from the mask value. The reset value is included in this disclosure as indicated in the table of FIG. 11 for ease of description only.

Compressed Stream Selection Logic

FIG. 10 shows a block diagram of the selection logic 612/614/616 and the output stream generation logic 618. The compressed stream selection logic 612/614/616 collects the output counters and the output masks from each of the entries from the results calculation block 606, and generates indices and counts for the output stream generator 618, along with the Reset Value which is sent back to each entry. The indices point to the entries that generated the selected counts. The main function of the Selection Logic 612/614/616 is to find the largest blocks to be compressed out of the input stream, i.e., the largest contiguous match. This is accomplished by finding the largest output count from any entry. Because of the parallel compression, i.e., because a plurality of symbols are operated on in parallel, there could be multiple compressed blocks that need to be sent to the output. Because of this, in the 4 symbol parallel embodiment, two counts and three indices are provided to the output logic 618. These are referred to as the Previous Count and Index, the Max Count and Index, and the LZ12 index.

Selecting the largest count with a Mask of 11111 generates the Previous Count and Index. This indicates a compressed block that ended with the first data input of this cycle (i.e. the first data input or first symbol could not be compressed with this block). The Index is simply the entry number that contained the selected count. Selecting the largest count with a mask that is not 11111 generates the Max Count and Index. This indicates a compressed block that includes one or more of the 4 symbols received on this cycle. The mask from this entry is also forwarded to the output generator 618. The LZ12 index points to any block that returned a mask of 01111, which is the "special case". The special case includes a contiguous match of one or more middle symbols as described above. A combined compress mask block 616 generates a combined compress mask comprising a logical AND of all of the masks, and forwards this to the Output Generator 618.

Finally, the selected Max Mask and the Reset Value column in the table of FIG. 11 are used in generating a Reset Value. This reset value is distributed back to all entries, and the entries will reset their counters to the minimum of this value, or their present value.

Figure 12:
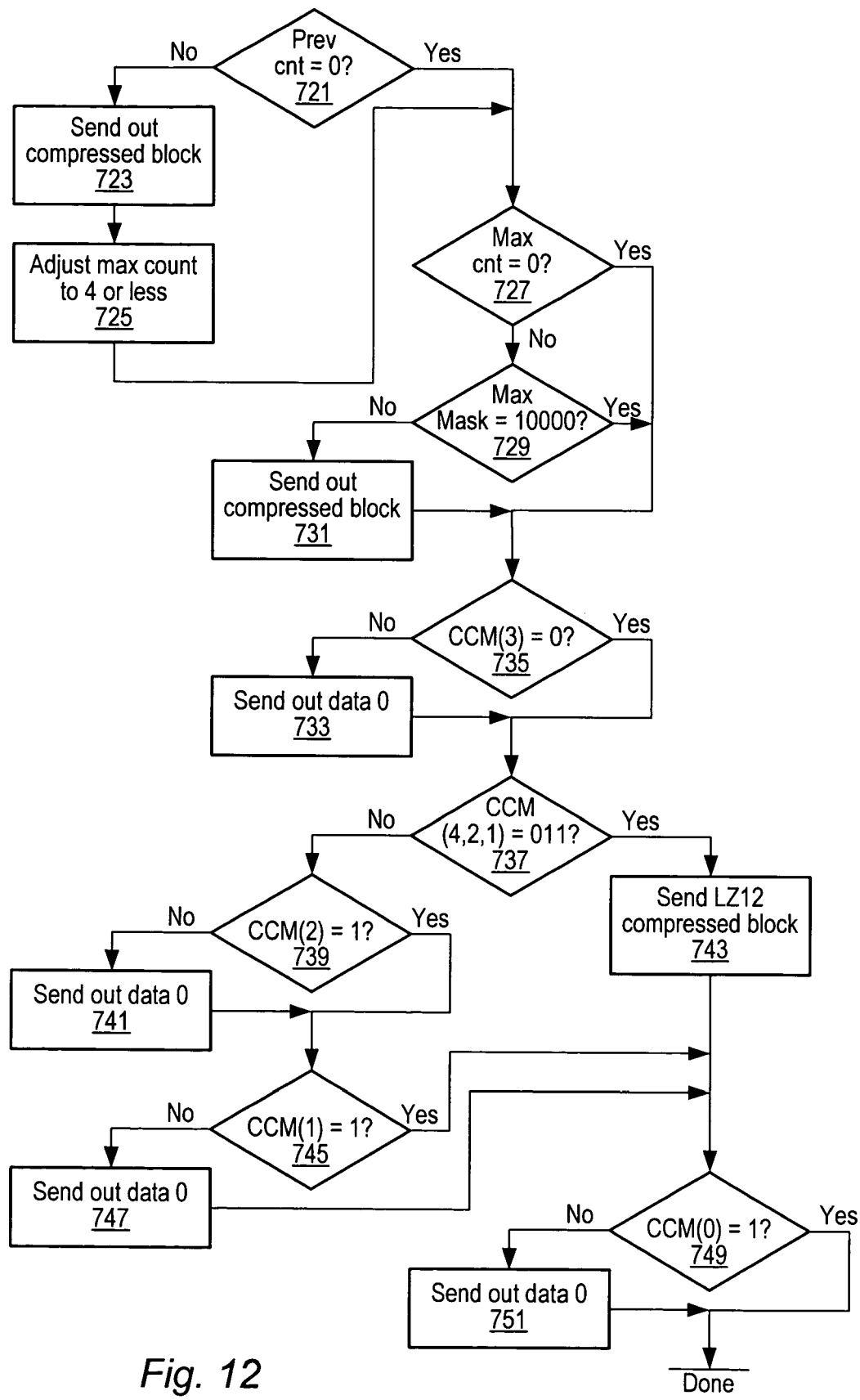
FIG. 12 illustrates the Output Generator Flow diagram.

FIG. 12—Output Stream Generator Flowchart

The output stream generator 618 logic (FIG. 10) generates the output stream according to the flowchart shown in FIG. 12. The term "CCM" in this flowchart refers to the Combined Compress Mask, and CCM(0) is the least significant bit as used in the table of FIG. 11. The output generator 618 sends out either uncompressed data, which includes the proper flags to indicate that it is not compressed, or a compressed block which includes a flag to indicate this is a compressed block, along with an encoded count and index that is used by the decompression logic to regenerate the original input.

As shown, in step 721 the method determines if previous count equals zero. If no, then the method sends out the compressed block in step 723 and adjusts the max count to 4 or less in step 725. Operation then advances to step 727. If previous count is determined to equal zero in step 721, then operation proceeds directly to step 727.

In step 727 the method determines if Max Cnt equals zero. If not, then the method determines in step 729 if Max Mask equals 10000. If not, then the method sends out the compressed block in step 731. Operation then advances to step 735. If Max Cnt is determined to equal zero in step 727 or if Max Mask is determined to equal 10000 in step 729, then operation proceeds directly to step 735.

In step 735 the method determines if CCM (3) equals zero. If not, then the method sends out data zero in step 733. Operation then advances to step 737. If CCM (3) is determined to equal zero in step 735, then operation proceeds directly to step 737.

In step 737 the method determines if CCM (4,2,1) equals 011. If not, then in step 739 the method determines if CCM (2) equals 1. If not, then in step 741 the method sends out data zero, and operation proceeds to step 745. If CCM (2) is determined to equal 1 in step 739, then operation proceeds directly to step 745. In step 745 the method determines if CCM (1) equals 1. If not, then in step 747 the method sends out data zero. Operation then proceeds to step 749. If CCM (1) is determined to equal 1 in step 745, then operation proceeds directly to step 749.

If CCM (4,2,1) is determined to equal 011 in step 737, then in step 743, the method sends an LZ12 compressed block. Operation then proceeds to step 749.

In step 749 the method determines if CCM (0) equals 1. If not, then the method sends out data zero in step 751. Operation then completes. If CCM (0) is determined to equal 1 in step 749, then operation completes.

If single byte compression is being performed by this logic, i.e., if individual symbols are being compressed, additional indices for each of the byte matches should be generated by the Selection Logic to allow the Output Generator to compress these. Otherwise, the output generation logic should also handle the cases where outputs of a compressed stream result in a single byte non-compressed output and adjust the flags accordingly. Previous Data3 may also be required by the output generator 618 in the case that the previous match is a count of one. Preferably, one method of handling single byte matches would be to adjust the table of FIG. 11 to not allow generation of single byte compare masks because single byte compares normally force the compressed stream to increase in size. For example, in the 10xx rows, if the saved count is 0, count out should be 0 along with a mask of 11xx to prevent the generation of a compressed block for the D0 single byte match.

FIG. 13—Parallel Algorithm Example

FIG. 13 illustrates a parallel algorithm example. Assume a window (history table length) of 16 entries, that has been initialized to the following values: Entry 0=F0, Entry 1=F1 . . . Entry 15=FF. Also assume that all of the entry counters are 0. The below sequence shows state changes for the 4 indicated inputs.

In state 0, the input data, in the order received, is F9, F8, F7, C0. The input data is shown in the arrival order from right to left in FIG. 13, i.e., the input data D3:D0=C0,F7, F8,F9. In state 0, the input finds a match of the first 3 symbols in entry 9. This results in those three symbols being replaced in the output stream by compressed data indicating a count of 3 and an index of 9. The output mask value "18" prevents these uncompressed symbols from being included in the output stream, since the compressed data is being output to represent these symbols. Also in state 0, the symbol C5 is determined to not match any entry in the history table.

Thus the symbol C5 is provided in the output stream in uncompressed form. Thus the output in state 0, from right to left, is: C0, (9,3).

In state 1, the input data, in the order received, is B5, F2, F1, F0. The symbol B5 does not match any entry in the history table. Thus the symbol B5 is provided in the output stream in uncompressed form. Also in state 1 three input symbols match 3 symbols in entry 7. Note that the matches are in previous entries, but the results calculation for this match occurs in entry 7. In other words, the actual matching entries are entries 6, 5, and 4. However, this match is detected by entry 7, since entry 7 compares the 4 input symbols with entries 7, 6, 5, and 4. Compressed data is not generated for this match in state 1 because the entry does not know if the match will continue with the next set of input symbols, and thus the output count is 0. The mask value for entry 7 prevents the matching data from being included in the output stream. Thus the output in state 1 is B5. The count value for entry 7 is updated to 3, as shown in state 2, to indicate the 3 matches in state 1.

In state 2, the input data, in the order received, is F9, F8, F7, B5. The matching in entry 7 continues for 3 more symbols, and then ends. Thus entry 7 outputs a count of 6 and a mask for the new matching symbols. In addition, entry 6 matches with the symbol B5.

Thus entry 6 updates its count to 1 in state 3. However, since symbol B5 is the last symbol in this group of input symbols, the entry does not know if the match will continue with the next set of input symbols. Thus for entry 6 the output count is 0 and the mask value will prevent that symbol from being output. Thus the output in state 2 is (7,6)

In state 3, no further contiguous matches exist for the symbol B5 from state 2. Thus, for entry 6, the output count is 1 from entry 6 for the B5 input after stage 2. Also, no match is detected for input symbol E2, and thus E2 is output as an uncompressed symbol. In state 3 a match is detected with respect to the middle symbols C0 and B5. This match comprising solely middle symbols is detected by entry 9, and thus the OF Mask is output from entry 9. This mask is the special case mask that indicates the two symbols centered in the input (B5C0 in this example) can be compressed out. The actual compressed output data or block will include a flag, a count of 2 and the index 9. Thus the output from state 3, from right to left, is (9,2), E2, (6,1). In an embodiment where individual symbols are not compressed, the output is (9,2), E2, B5, as shown in the alternate output box.

The final state in this example, state 4, has a 1 in the count for entry 7 as a result of a match of F3 with entry 4 in state 3. The mask from this match prevented the sending of the F3 to the output stream in state 3. If this were the end of the input stream, the window is flushed, resulting in the single symbol compression block for this match. The output would show a match of 1 at index 7. Thus, assuming that the input in state 3 is the final data received, then the final output for the stream is (7,1). Alternately, the single symbol match could be sent uncompressed as symbol F3, as shown in the alternate output box.

Compare Logic

The compare logic 612 and 614 (FIG. 10) in stage three, which is used to find the largest count may be specially designed to be able to complete in one cycle. The counts are especially critical because stage 2 must first choose to send 0, count, count+1, count+2 or count+3. The count from all entries are then compared to find the largest.

Figure 14:
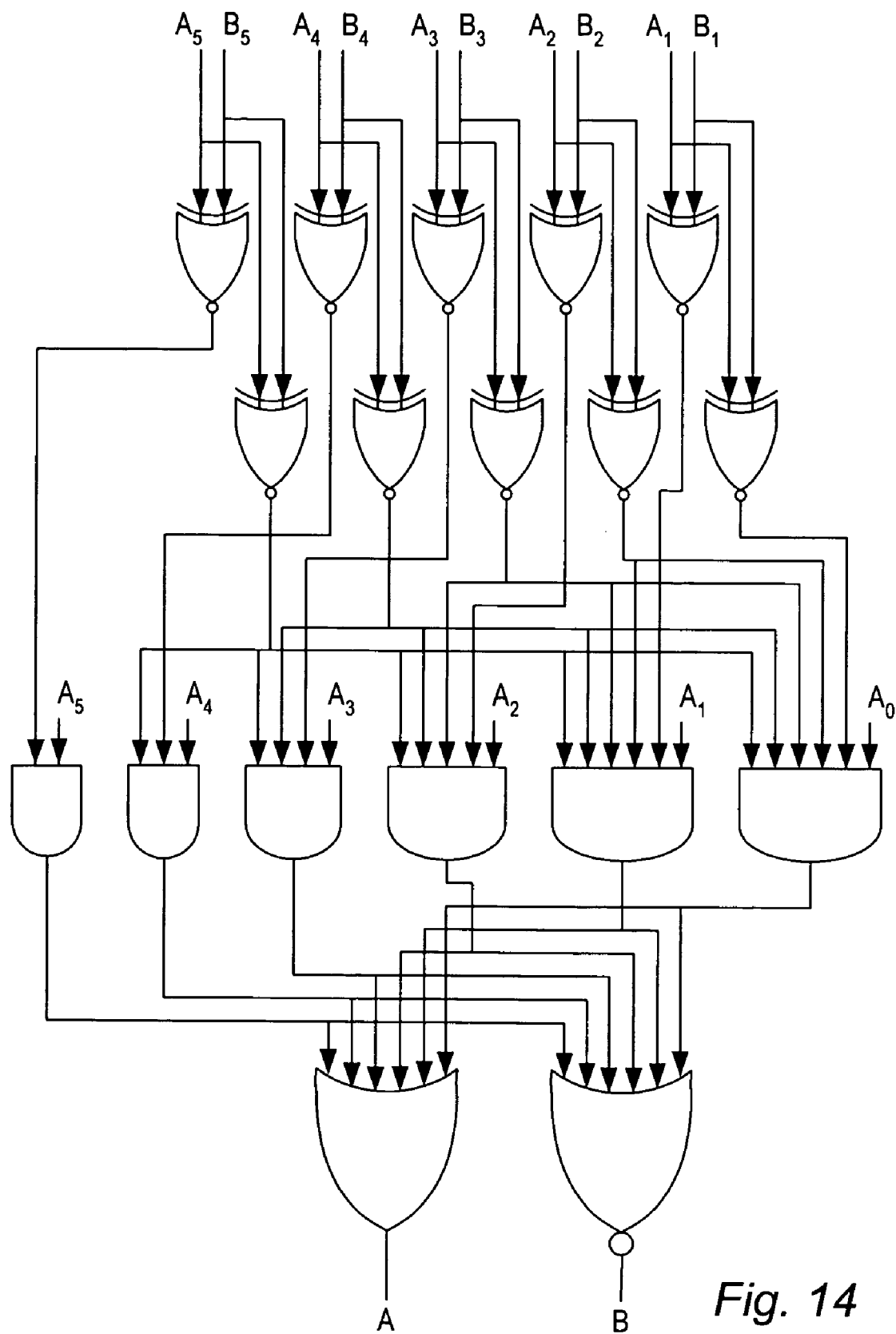
FIG. 14 illustrates a high speed parallel comparison circuit used to find the largest count of matching entries to the history table.

As shown in FIG. 14, straightforward greater-than compare of 2 multi-bit numbers requires 3 levels plus a selector. If the number is 6 bits, this compare will require around 30 gates, and the selector will require an additional 18 for the selector for 48 gates per 2-way compare. A stacked compare (64 to 32, 32 to 16, 16 to 8, 8 to 4, 4 to 2, 2 to 1) would require 6*5 levels of logic, and 48*63~3 Kgates.

With standard 0.25 um process technology the time through the compare should be about 1.25 nS (0.25 ns per XOR, 0.5 ns 6wayAnd/Or). The selector would take an additional 0.3 nS for 1.55 nS per compare. This stacked compare would then require 1.55 nS*6=9.3 nS. This doesn't include the selection and distribution of these counts from the source. For operation above 100 Mhz clocking the timing is too limiting for proper operation.

In order to increase the speed, a novel 4 way parallel compare can be used, as shown in FIG. 15. This embodiment only requires 3 levels of compares (64 to 16, 16 to 4, 4 to 1), however, more two-way compares are required (6 per 4 way compare) and an additional And/Or is required before the selector. This design would then require 126 compares and 21 selectors for 126*30+21*33~4.5 Kgates. But the resulting delay would be (1.55+0.3 ns)*3 Levels=5.55 nS. This timing allows for high speed parallel compression of the input data stream. The table of FIG. 16 describes the Select Generation Logic.

Lossy Compression Algorithm

As indicated in US patent disclosure entitled "Memory Controller Including Embedded Data Compression and Decompression Engines", filed Jun. 5, 1995, Ser. No. 08/463,106, whose inventor is Thomas A. Dye, it is also desirable to implement some of the compression formats as "lossy". The term "Lossy" implies a compression/decompression operation where data is altered and is represented by an approximation of the original data after decompression.

Figure 21:
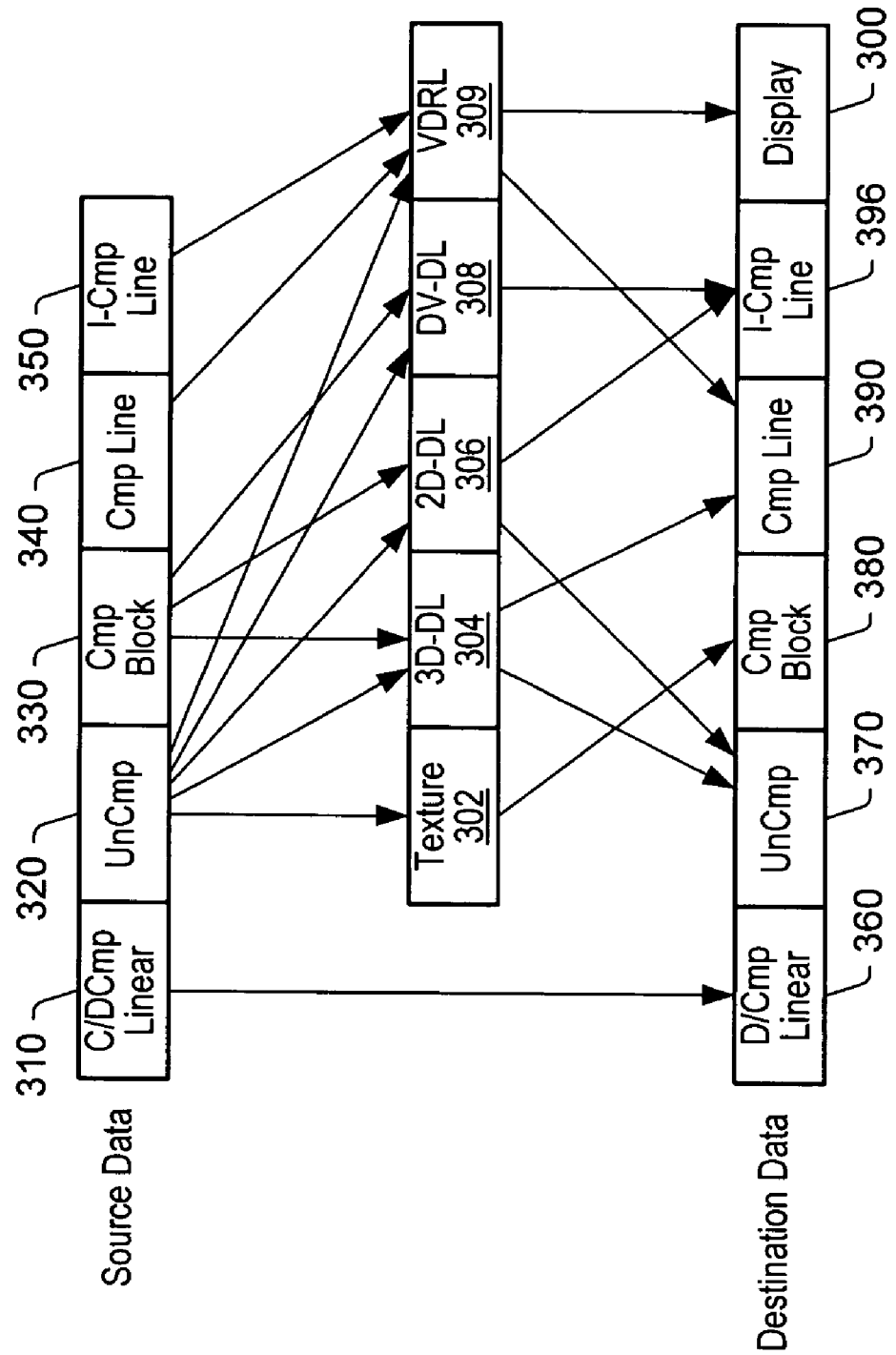
FIG. 21 illustrates a plurality of compression formats for source and destination data as used by the IMC for compression and decompression memory efficiency.

Referring to FIG. 21, some compression conversion formats preferably use lossy compression while others use lossless compression. In the preferred embodiment, texture 302, image data (Compressed block 380), video data (Compressed Block 380), and display data 300, and in some cases "Z" or depth data, are compressed with the lossy algorithm. Alternate embodiments include any of these formats or additional formats to be compressed with the lossless compression algorithm. Control data, programs, VDRL, or 3D parameter data, or any other data required to be decompressed without loss from the original content is compressed using the lossless parallel compression process according to the present invention.

Figure 17:
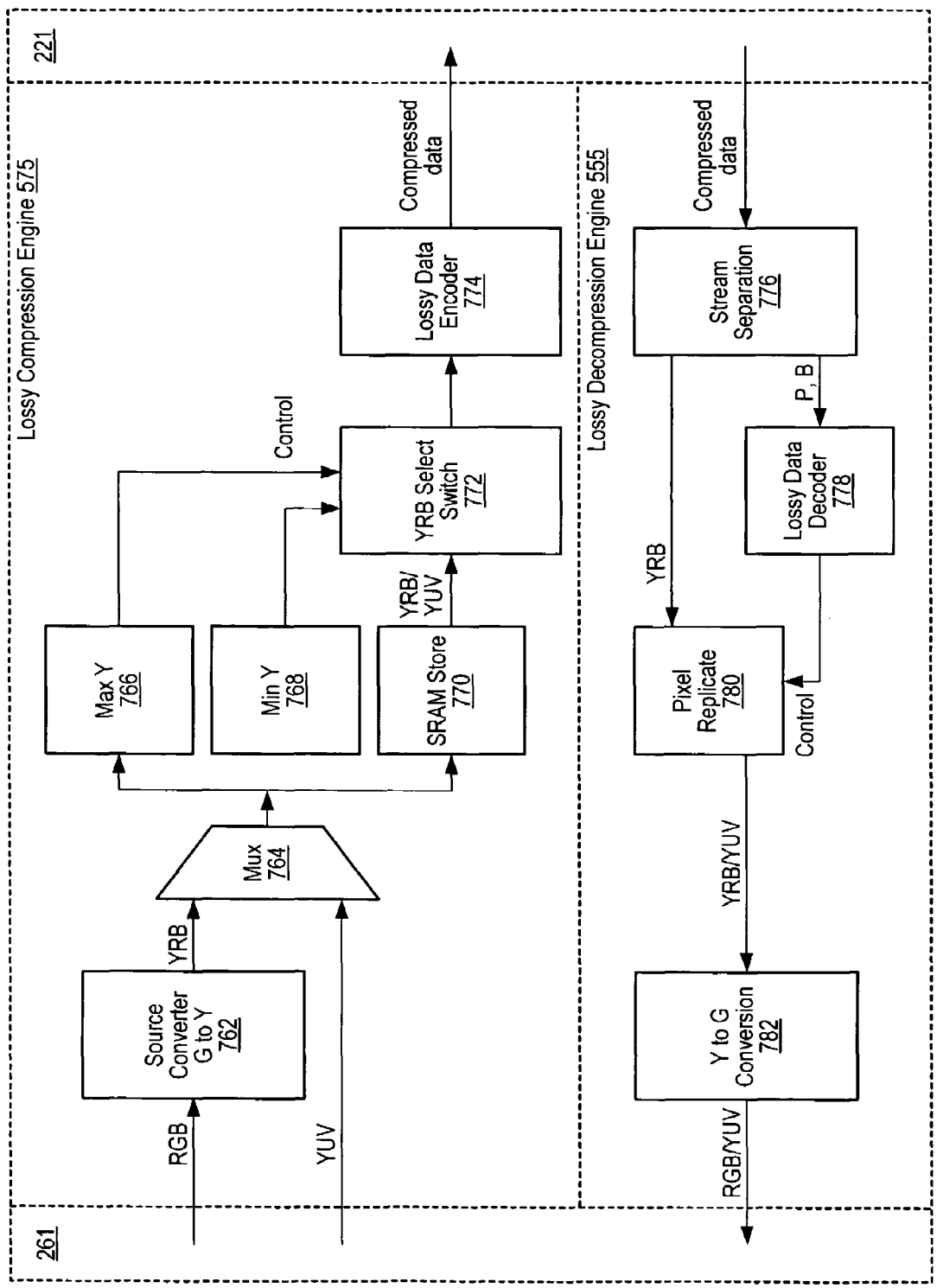
FIG. 17 illustrates the lossy compression and decompression engines.

FIG. 17—Lossy Compression and Decompression Engines

FIG. 17 illustrates the preferred embodiment of the lossy compression engine 575 and the lossy decompression engine 555. These two engines preferably are located within the parallel compression and decompression unit 251.

The lossy compression engine 575 and the lossy decompression engine 555 may be separate blocks or integrated as a single unit. The engines 575 and 555 may be implemented in any of various manners, including discrete logic, a programmable CPU, DSP, or microcontroller, or reconfigurable logic such as an FPGA, among others. Preferably, the lossy compression engine 575 performs the lossy compression algorithm for image, texture, video, and depth data.

Data in either RGB or YUV color format is presented to the lossy compression engine 575 by the switch logic 261 of the memory controller 220. If such data is in the RGB format, a source converter 762 is used to encode the RGB to a luminance (Y) value (encoded to YRB). This conversion process operation is standard for those who are knowledgeable in the art. The reason for this conversion is to improve color replication across the compression and subsequent decompression procedure. Note that the YUV data is not converted by block 762, but rather is treated by the compression algorithm the same as the YRB data previously converted by the source converter 762.

The data is selected by mux 764 for storage as normal data by SRAM store 770 and for min & max calculation by 768 and 766 respectively as described further. The data that resides in SRAM store 770 is selected for values according to the tables of FIGS. 18 and 19. The YRB/YUV values are interpolated by select switch 772 under the control signals generated by control logic located within the Max Y 766 and Min Y 768 units. The lossy data encoder 774 performs the control bit insertion into the selected values that are output by the YRB select switch 772. Lossy compressed data from the lossy compression Engine 575 is output to the memory interface logic 221 for storage in the main system memory 110.

Likewise the lossy decompression engine 555 receives the compressed data from the memory interface logic 221 to perform the lossy decompression operation. Data is first processed by the compressed stream separator 776 which strips off the header for process control information and sends appropriate signals to the lossy data decoder 778 and the pixel replicate logic 780. The lossy data decoder 778 controls the replication process performed in the pixel replicate unit 780. Data Min and Max Y values with the associated Red and Blue (or U and V) can be positioned back preferably into a 4×4 array of output pixels. The final step performed by the Y to G converter 782 is to convert the YRB/YUV data format back to the original RGB format as indicated by the header that accompanied the block of compressed data. For decompression of YUV data, the Y to G conversion process is skipped and the data is output directly from the Y to G converter 782. In alternate embodiments other color source formats can be used, as the compression method operates with a luminance value to determine the minimum and maximum intensity within the group or block of data under compression.

In the preferred embodiment the lossy compression algorithm starts with a 4×4 block of pixels in RGB format and compresses them to various size blocks depending on the attributes of that 4×4 block. Alternate embodiments may use other initial source data block sizes with simple extension to the following process. Also in the preferred embodiment each block could be encoded to a different size, and its size is encoded with the data so the decompression engine can function properly. Alternatively, some applications such as consumer appliances and embedded DRAM require a "fixed" compression ratio in order to accommodate a fixed size memory environment. Fixed compression ratio allows the software to allocate memory in a known size and also compensates for overflow of data past the physical limit of the memory size. In this alternate embodiment, where a fixed compression ratio is required, the lossy algorithm is easily changed to eliminate special cases, which in the preferred embodiment allow a better compression ratio.

Also, in an alternate embodiment the CPU 102 may perform the compression and/or decompression in software according to the present invention. In another embodiment, the decompression process can be performed by logic while the compression can be performed by software executing on the CPU 102.

Data input may originate in the YUV format (typically video) or the RGB format (typically graphics) and may also be combined with alpha for transparency effect. In the preferred embodiment, if the data to be compressed is in Red, Green and Blue format, data is converted to the proper data format of Y (luminance), Red and Blue or is left in YUV format if that is the original source format. During the source read process the data format is converted to the preferred format and a number of compare steps are performed on each block as indicated. The Y values of the block of 4×4 pixels during load are compared to the previous values for the maximum and minimum Y values of two pixels. Once found the associated R and G values are stored corresponding to such minimum and maximum Y values. Thus the maximum Y and minimum Y are determined for each block. As the data for each pixel is read the maximum and minimum Y are located, the associated R, B and Alpha values for the minimum and maximum Y pixels are also stored 770.

For compression operation without alpha components, FIG. 18 indicates the algorithm used to output a block. Likewise, for the lossy compression operation with alpha, values in FIG. 19 are used. Now with reference to the tables of FIGS. 18 and 19, P bits accompany the compressed data such that during the decompression stage output pixel locations can be determined. If 16 P bits are required, then each pixel is compared with the two colors found in the block, and a 0 indicates that pixel is the Min color ($Y_{min}$, $R_{min}$, $B_{min}$, $A_{min}$) or a 1 indicates that pixel is the Max color. When greater than two colors or alphas are present as determined by minimum 768 and maximum 766 Y logic, 32 bits are used. When 32 P bits are used the compression unit calculates intermediate Y values at $1/6^{th}$, $1/2$, and $5/6^{th}$ between the Max and Min Y values. The Y value of each pixel is then compared with these values, and if less than or equal to the $1/6^{th}$ value, 00 is used for this pixel. If greater than the $1/6^{th}$ value, but less than or equal to the $1/2$ value, a 01 is used for this pixel. Likewise, for 10 (between $1/2$ value and $5/6^{th}$ value) and 11 (greater than $5/6^{th}$ value). The decompression engine will calculate the $1/3^{rd}$ and $2/3^{rd}$ values between $Y_{max}$ and $Y_{min}$, and if the value for the pixel is 00, $Y_{min}$ will be used. If 01, the $1/3^{rd}$ value is used, 10 uses the $2/3^{rd}$ value, and 11 uses the $Y_{max}$ value. During the decompression process, the Y, R, B color format is reconverted into the original data format R, G, B, or Y, U, V. For application or system requirements where a fixed compression ratio is required, the default algorithm can use the last entries referenced in FIGS. 18 and 19 for each 16 and 32 bit data input formats. Alternate embodiments could use a larger or fewer bits for each pixel's P bits, or P bits based on individual colors for the pixel. In addition, alternate embodiments and variations of the lossy compression may yield less compression but higher image quality and fixed compression ratios.

Figure 20:
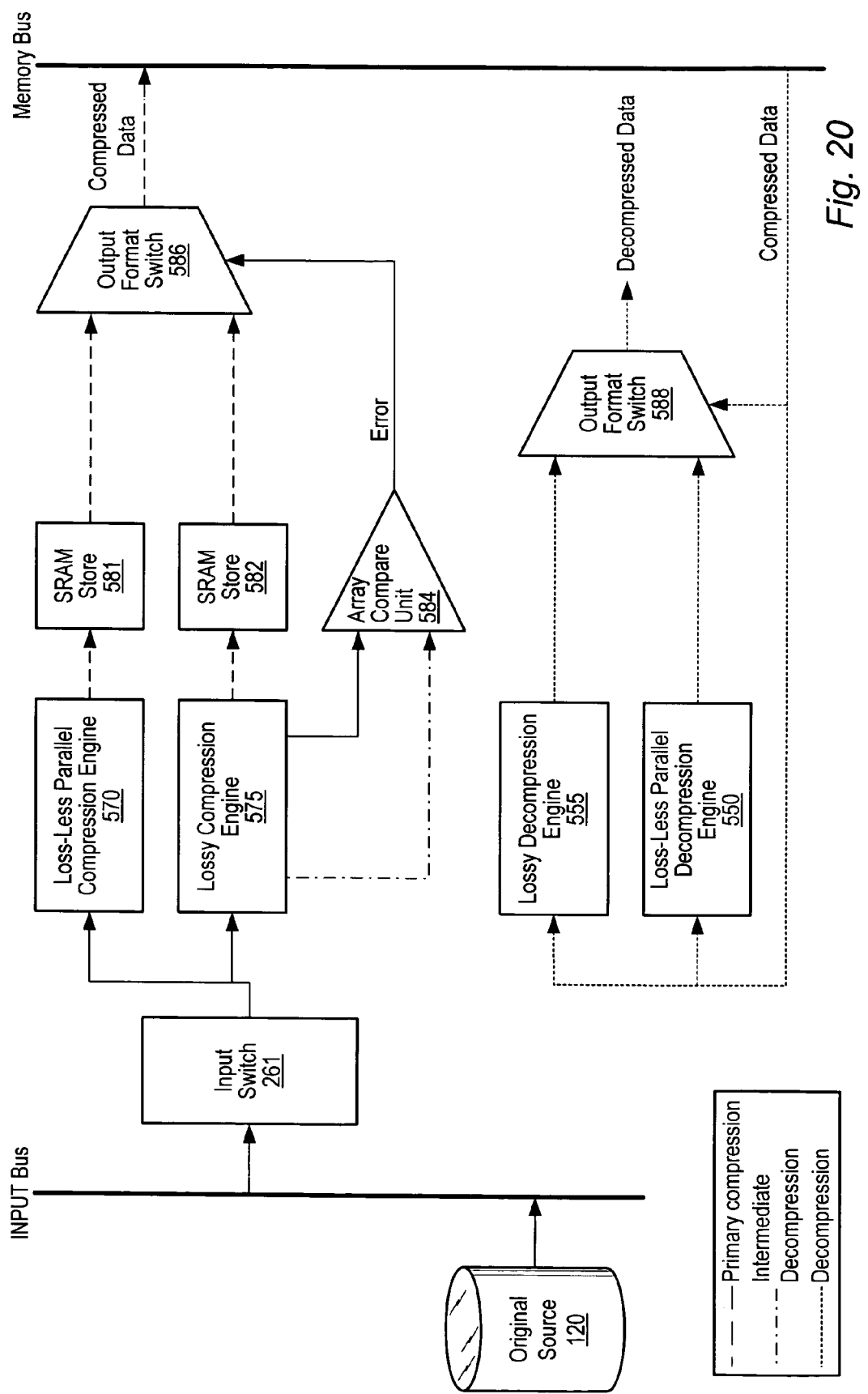
FIG. 20 is a block diagram of the combination lossy and lossless compression and decompression operation.

FIG. 20—Combined Compression

Due to the nature of the compression requirements the preferred embodiment introduces a new method to achieve high quality fixed or variable image and video compression ratios using a combination of both the lossy and lossless engines. The IMC 140 compresses multiple data types and formats as discussed previously in this disclosure. When image data is compressed with only a lossy algorithm, image data with high detail can be blurred or washed out. Prior art performs lossy compression on image data with discrete cosine transforms by conversion into the frequency domain. These practices are expensive due to the high bandwidth requirements of the real time transformation for video and graphics from the time domain to the frequency domain.

In order to solve these issues, a combination of both lossy and lossless engines 575 and 570 running in parallel is performed, and outputs from one of the engines is selected based on a criteria.

As shown in FIG. 20, the original source data 120, e.g., from disk, subsystem, or CPU 102, is transmitted into the input switch 261 across the input bus, where the bus may be an embedded local data or CPU bus or be a proprietary internal design bus. The input switch 261 performs the determination of address and qualification for block size and compression operation. The data then is sent to both the parallel lossless compression engine 570 and the lossy compression engine 575, which performs the proper compression before storing into the SRAM store memory 581 and 582, respectively.

The source data is thus read into both the parallel lossless compression engine 570 and the lossy compression engine 575 in parallel. Both engines compress data of equivalent input block sizes, while compressed output sizes from each engine may vary.

In the preferred embodiment of FIG. 20, an error term determines the selection of either the lossy or the lossless compression results for insertion into the compressed stream. The lossy compression engine 575 may generate the error term during the compression of the incoming data stream. More specifically, an array compare unit 584 generates the error signal in response to output from the lossy compression engine 575. The error signal is preferably generated based on difference between the Min Y and Max Y values. Alternatively, during the lossy compression process, the original data is subtracted from the encoded or lossy compressed data to produce the error term. This error then determines if the block to insert in the compressed stream is either lossy compressed or lossless compressed form. The error signal is provided to an output format switch or multiplexer 586, which selects the compressed data from either the lossless engine 570 or the lossy engine 575. As shown, the outputs of the lossless engine 570 and the lossy engine 575 are temporarily stored in SRAM stores 581 and 582 prior to being provided to the output format switch 586. If the error signal is below a certain threshold, indicating a low error in the compression output of the lossy compression engine 575, then the output of the lossy compression engine 575 is used. If the error signal is above the threshold, then the error in the compressed output from the lossy engine is deemed unacceptably high, and the output from the lossless engine 570 is selected.

Thus, for areas that show a high error due to the magnitude of the difference in luminance, the lossless parallel compression data is used. For data that shows a minimal threshold of error, the lossy compressed data is used. The advantage of this technique is that blocks of image to be compressed with noise will compress better with the lossy engine. Likewise, blocks that have repetitive detail, high frequency imagery or detailed repetitive data will compress more effectively with the lossless parallel compression.

During the write of compressed blocks, the header includes a tag bit used as an indication of the type of compression used. This tag bit is used during decompression to apply the proper decompression procedure to the data.

The error term selection can also be a dynamic function to assure a fixed compression ratio. In this embodiment, if a fixed compression ratio is desired, the dynamic threshold can be adjusted to vary the magnitude of the error deemed acceptable for lossy compression. A running tally of the current compression ratio is used to dynamically adjust the threshold value, which determines where the lossless compression blocks are used instead of the lossy compressed blocks. This operates to degrade the image, if necessary, by selection of additional lossy compression blocks in lieu of lossless compression blocks. If the run rate of the current block is at the required compression ratio, then the threshold is set to the default value. If the current run rate is over-allocated, the error threshold value will increase such that output selection is from the lossy compression engine 575. Thus, a dynamic compression error threshold determines how to adjust the ratio of lossy to lossless data in order to achieve a guaranteed compression ratio.

During decompression, preferably the output format switch 588 first strips the header for determination of decompression engine output selection. In one embodiment, the compressed data is decompressed in parallel by both engines 555 and 550. In this embodiment, during decompression, the header of each block determines, preferably after completion of the decompression operation, whether the destination pixel is selected from the lossy decompression engine 555 or the lossless decompression engine 550. The output format switch 588 performs the selection of decompression engine output.

In another embodiment, only the selected decompression engine, either 555 or 550, is applied to the data. In this embodiment, the compressed data is efficiently allocated to the proper decompression engine, depending on the mode of compression as determined by the header.

FIG. 21—Compression Formats

As shown in FIG. 21, the preferred embodiment of the present invention allows faster memory access time using a plurality of compressed storage formats. The system may be designed to optimize the compression and decompression ratios based on the type of system data. Data that is used for programs or used to control the processing of other data is compressed and stored in a lossless format (lossless compression). Likewise, data that can be compressed with loss during recovery or de-compression is compressed in a lossy format. Thus, each format has a specific address and memory orientation for best decompression rate and storage size. In addition, each specific compression and decompression format scales in bandwidth performance based on the amount of cache memory used to store uncompressed memory during the compression and decompression process.

Referring to FIG. 21, in addition to the lossless format and lossy formats, the IMC 140 preferably contains further multiple compression and decompression formats for efficiency and optimization of bandwidth within the memory controller device. Data Source blocks 310, 320, 330, 340, and 350 represent the compression format of data that is read from system memory 110, written from the CPU 102, read from the non-volatile memory 120, read from the I/O system controller 116, or read from the internal graphics blocks within the IMC 140 device, or alternatively as in prior art FIG. 1, read from the PCI or AGP buses 107 to the IMC 140. Destination blocks 360, 370, 380, 390, 396, 300 represent the compression format of data that is written to system memory 110, or read by the CPU 102 (transferred to the CPU 102 in response to a CPU read), written to the non-volatile memory 120, written to the I/O system controller 116, written to internal graphics blocks within the IMC 140 device, or alternatively as in prior art FIG. 1, written to the PCI or AGP buses 107 from the IMC 140. Therefore, blocks 310, 320, 330, 340, 350 are considered the data source formats where data flows into or is generated within the IMC. Blocks 360, 370, 380, 390, 396, and 300 are destination formats where data flows out of the IMC. It is noted that destination formats become source formats on subsequent accesses by the IMC 140. Thus a compression format may be referred to as source format/destination format.

Blocks 302, 304, 306, 308 and 309 represent the data type of the data. These data types include texture data 302, 3D-DL 304, 2D-DL 306, DV-DL 308 and VDRL 309. These data types are discussed briefly below.

VDRL, Indirect Compressed Lines

One form of data in the preferred embodiment is video display refresh list (VDRL) data as described in U.S. Pat. No. 5,838,334, referenced above. VDRL data comprises commands and/or data for referencing pixel/video data on a span line basis, typically from various non-contiguous memory areas, for refresh of the display. VDRL compressed data is expected to be a long stream of start and stop pointers including various slopes and integer data. Such data must be compressed with the lossless compression and decompression process according to the present invention. The following VDRL context register fields in the graphics engine can be programmed to cause screen data to be written back to system memory as lossless compressed screen lines 390(or sub-lines) during VDRL execution:

```
DestEn
DestType = {Linear, XY, or LineCompressed}
pDestTopLinePtr      // Pointer to compressed pointer list
pDestTopLine         // Pointer to screen data
DestMode = {Draw&Refresh | DrawOnly}
DestPixFmt
DestPitch
```

When enabled, each screen line (or span line) that is rendered or displayed (based on processing one or more VDRL segments) is compressed independently (for each screen line, a new compression stream is started and closed) and written back to memory at the current byte offset into pDestTopLine. In addition, the graphics engine writes back a pointer to the compressed screen line at the current pointer offset into pDestTopLinePtr. The current offsets into pDestTopLine and pDestTopLinePtr are managed by the graphics engine. The compressed screen data 300 and corresponding pointer list can be referenced as a compressed window by a subsequent VDRL 309. Preferably the workspace associated with the compressed window includes the following fields used by the graphics engine to indirectly access the compressed screen data:

pTopLine pTopLinePtr

SrcType={Linear|XY|LineCompressed}

PixFmt

Pitch

Since screen lines are compressed on a line 390 (or sub-line) basis, the subsequent VDRL 309 only has to reference those lines that are needed for the current screen being refreshed.

Note: 3D-DL 304 and DV-DL 308 can also render indirect compressed screen lines 396 in a similar manner. However, the resulting indirect compressed screen lines are to be consumed by subsequent VDRL 309.

Note: DV-DL 308 is fundamentally based on processing and drawing blocks. For implementations that do not have enough storage blocks to cover the width of the screen being drawn, screen lines 390, 300 are compressed back to memory on a sub-line basis.

Static Data

For each independent triangle, the 3D-triangle setup engine generates two lossless compressed static data blocks using standard linear compression 360: an execution static data block, and a graphics engine static data block. For a given 3D window or object, all static data is written starting at a particular base address (pTopStatic). Each static data block is compressed independently (for each static data block, a new compression stream is started and closed) and written back to memory at the current compressed block offset into pTopStatic. In addition, the 3D triangle setup engine writes back a pointer to the compressed static data block (pStatic) in the appropriate static pointer line bucket. The format of pStatic comprises the following fields: static data block pointer offset, static format (indicating whether the data is compressed or not), the number of compressed blocks associated with the execution static data block, and the number of compressed blocks associated with the graphics engine static data block. Note that the number of compressed blocks for each static data block type is used to instruct the decompression engine 550 how much data to decompress.

3D-DL

A 3D-DL comprises a 3-dimensional draw list for rendering a 3-D image into memory, or onto the display. For each 3D window line (or sub-line), the 3D execution engine generates a lossless compressed stream of a 3D-DL 304. Each 3D-DL line is compressed independently (i.e. for each 3DDL line, a new compression stream is started and closed) and the resulting compressed 3D-DL line 390 is written back to memory 110. It is not necessary for consecutive lines of 3D-DL to be contiguous in memory. In addition, the 3D execution engine of the IMC 140 may write back a 3D-DL pointer to the compressed 3D-DL line 390 at the current pointer offset into the 3D-DL pointer list (p3DDLPtr). The resulting compressed 3D-DL lines 390 and corresponding 3D-DL pointer list 304 is parsed and consumed by the 3D graphics engine 212. The graphics engine 212 uses the following 3D-DL context register fields:

p3DDL p3DDLPtr

The context register fields operate to provide context information to the IMC 140 during execution of a 3D-DL.

Note: Since 3D-DL is compressed on a line 390 (or sub-line) basis, only the visible portion of a 3D window (based on feedback from VDRL window priority resolution) may need to be drawn.

Textures

Texture data 302 for 3D rendering is also compressed and decompression according to the present invention. The lossy algorithm preferably compresses images. In an alternate embodiment, the parallel combination of lossy and lossless algorithms can be used for improved image and texture map quality without added time delay. Texture data 302 is typically compressed and decompressed in a block compression format 380 of the present invention. The logical format of a lossy (or lossless) compressed texture table for a given scene with T textures, is as follows:

```
pTopTex ->
opTex0 ->
pLod0Blk0 ->            8x8 compressed texture sub-blocks
pLod0Blk(last) ->
pLod(last)Blk(last) ->
opTex1 ->
pLod0Blk0 ->
opTex(T-1) ->...
``` pTopTex is the base pointer to a compressed texture table. pTopTex is loaded into the graphics engine 212 on a per 3D window basis. opTex is an offset into pTopTex that provides the graphics engine 212 with a pointer to the first compressed texture sub-block (i.e., LOD0, sub-block 0) associated with the targeted texture. opTex is a field located in a group attribute data block, RenderState. RenderState contains attributes shared by groups of triangles. The group attribute data block pointer, pRenderState, is contained in each 3D-DL 304 segment. Using pTopTex, opTex, and all of the texture attributes and modifiers, one of the graphics engine's texture address generation engines determine which critical texture sub-blocks 380 (pLodB1k) to prefetch.

The size of a texture sub-block 380 in the preferred embodiment will be 8×8 texels. The compressed texture sub-blocks are read into the compressed texture cache Note that the pLodB1k pointers point to 8×8 compressed texture sub-blocks 380.

DV-DL Video

The DV-DL format comprises a digital video draw list for rendering digital video into memory or onto the display. The block compression format 380 can also be used for video and video motion estimation data. In addition, Display data 300 is also preferably stored in compressed format according to the present invention. The display data 300 is expected to be sequentially accessed RGB or YUV data in scan line blocks typically greater than 2 K bytes. The preferred method for compression of display data 300 is to line compress 390 the entire span line preferably in the parallel lossless format.

Video input data is also compressed preferably in any of the formats, lossless, lossy, or a combination of lossy and lossless according to the present invention. Video data is typically and preferably compressed and decompressed in two dimensional blocks 380 addressed in linear or X/Y format.

Each data type has a unique addressing scheme to fit the most effective natural data format of the incoming source format.

For special graphics, video, and audio data types 306, 308 and 310 the data types can be associated with a respective compression format to achieve optimal compression ratios for the system.

Blocks 310 and 360 represent a lossless or lossy compression and decompression format of linear addressed compressed or decompressed data blocks as specified by the CPU 102 and system software. Data block size and data compression type are dependent on the bandwidth and cost requirements of the application and system respectively. Source data applied to block 310, if coming from the system memory, will be decompressed and written to the destination as normal (uncompressed) data or data which has some loss associated with the decompression process. The input bandwidth of compressed data provided to block 310 is equal to the bandwidth required by normal non-compressed data divided by the difference of the compression ratio. The compression ratio is a function of multiple constraints, including compression block size, data type, and data format. Further, the bandwidth of the uncompressed destination data is equal to the original uncompressed source data bandwidth. In addition, source data can be uncompressed "normal" data that is compressed and written to the destination in one of many compression formats as indicated by blocks 360, 380, 390, and 396.

Source data block 320 represents incoming data that has not been altered by compression. In this case data which represents a texture type can be written in the compressed block format 380 for optimal use of 3D texture memory space. Likewise, 3D-Draw (3D-DDL) type data can be received as source data in an uncompressed format 320 and can be processed and formatted for output in either uncompressed 370 or line compressed 390 destination formats. Similar operation can occur when the source is already in Compressed block format 330.

Compressed line 340/390 for example may be generated from VDRL 309 instructions and stored in partial compressed line segments 340/390 for later usage by another requesting agent. These compressed line segments are addressed in standard linear addressing format.

Intermediate compressed line segments 350/396 are a special case of conversion from compressed blocks 330/380 to compressed intermediate lines 350/396. Compressed intermediate lines are used as a conversion technique between compressed block 330/380 and the digital video draw list (DV-DL) 308.

Display data 300 can also be compressed and is typically compressed in a lossless format that is linear complete span lines. During the refresh of video to the display, the display compressed span lines 300 which have not been modified by the 3D graphics engine 212 are decompressed for display on the respective display device span line.

Video and Texture data 302, for example, are preferably in uncompressed 320/370 or compressed block 330/380 formats. Block formats 330/380 are typically 8×8 blocks that have representation of X/Y address but are referenced in system memory as linear 64 bytes with a pitch of 8 bytes. In the compressed block format 330/380, decompression results in 32×32 texture blocks also addressed in X/Y format.

Instruction lists, such as VDRL (video display refresh list) 309, DV-DL (digital video draw list 308, 3D-DL (3-D draw list) 304 preferably are stored in a lossless compressed format with linear addressing. CPU data is also preferably stored in a lossless compressed format with linear addressing. These instruction lists are executable to render pixel data into memory in response to geometry lists or to access video/pixel data from memory for display on the display device. The draw results of these also have formats as indicated in FIG. 21. For example, uncompressed linear addressed data 320 as a source may be manipulated and read by the 3D-DL 304 instruction list, and stored compressed in compressed line 390 format or Uncompressed 370 data format. Each operator indicated in FIG. 21 has a preferred format for data transition and storage.

Data which is type 2D-Draw list 306 is received as source data in uncompressed 320 format or block compressed 330 format. For 2D-DL data type 306, the output data can be in uncompressed 370 or Intermediate line compressed 396 formats.

For digital video draw lists (DV-DL) 308, the source data of the DV-DL 308 is received in uncompressed 320 format or block compressed 330 format which is output to the destination in intermediate line compressed 396 format.

Source data of the VDRL data type is received in either uncompressed 320, Compressed line 340, or intermediate compressed line 350 formats, and is output to the destination address as compressed line 390 or directly to the display device 300.

Lastly, data of the Display format type 300 is typically normal or lossless compressed with a linear span addressing format.

As indicated in U.S. Pat. No. 5,838,334, "workspace areas" are located in memory to define the windows or object types. In one embodiment, the relationship between such workspace regions and the compression and decompression operation of the present invention is as follows. Each "workspace" contains a data area which indicates the compression type and quality (if lossy compression) for reproduction of the window or object on the display. The Application Software (API), Graphical User Interface (GUI) software or Operating System (OS) software can determine the type and memory allocation requirements and procedures to optimize the cost, performance and efficiency of the present invention. Windows or objects that have been altered from the original content or that have been resized can be represented with a plurality of quality levels for final representation on the display as indicated in the window workspace areas of the main system memory. In addition, 3D objects or textures can contain the compression quality attributes as well. Thus, by assignment of compression type, address format, and quality of representation in the individual window or object workspace area, the system can be optimized for cost and performance by the elimination of memory size and bandwidth requirements.

Data types texture data 302, 3D-draw lists 304, 2D-draw lists 306, Digital video draw lists 308, and Virtual (video) Display Refresh List 309 all represent the audio, video and graphics media formats of the IMC as referenced in U.S. Pat. No. 5,838,334.

The core compression block formats allow multiple data types from various sources as inputs. The compression and decompression formats attempt to compress the data into the smallest possible storage units for highest efficiency, dependent upon the data type of the data received. To achieve this, the memory controller 210 understands the data types that it may receive.

Therefore, the IMC 140 of the present invention reduces the amount of data required to be moved within the system by specific formats designed for CPU 102, Disk 120, system memory 110, and video display, thus reducing the overall cost while improving the performance of the computer system. According to the present invention, the CPU 102 spends much less time moving data between the various subsystems. This frees up the CPU 102 and allows the CPU 102 greater time to work on the application program.

As discussed further below, data from the CPU may be compressed and stored in linear address memory with variable block sizes. This data from the CPU may be unrelated to the graphics data, and may result from invalidation of cache lines or least recently used pages (LRU), or requested memory from a CPU-based application. In this embodiment the driver requesting compression will handle the memory allocation and directory function for both the compressed and uncompressed data.

Latency and Efficiency

The memory Controller 220 minimizes latency of read operations by a plurality of novel methods. Each method is discussed further in reference to the preferred embodiment. Most of the control functions for latency reduction are located in the switch logic 261, and further located in the compression switch logic 516, the decompression switch 512 and the normal memory switch 514. Locality of data addresses to compression blocks and L3 data cache blocks also play a major role in latency reduction. The various latency reduction and efficiency methods include: Parallel compression/decompression (described above); Selectable compression modes; Priority compression mode; Variable compression block size; the L3 Data Cache; and Compression Reordering.

Figure 22:
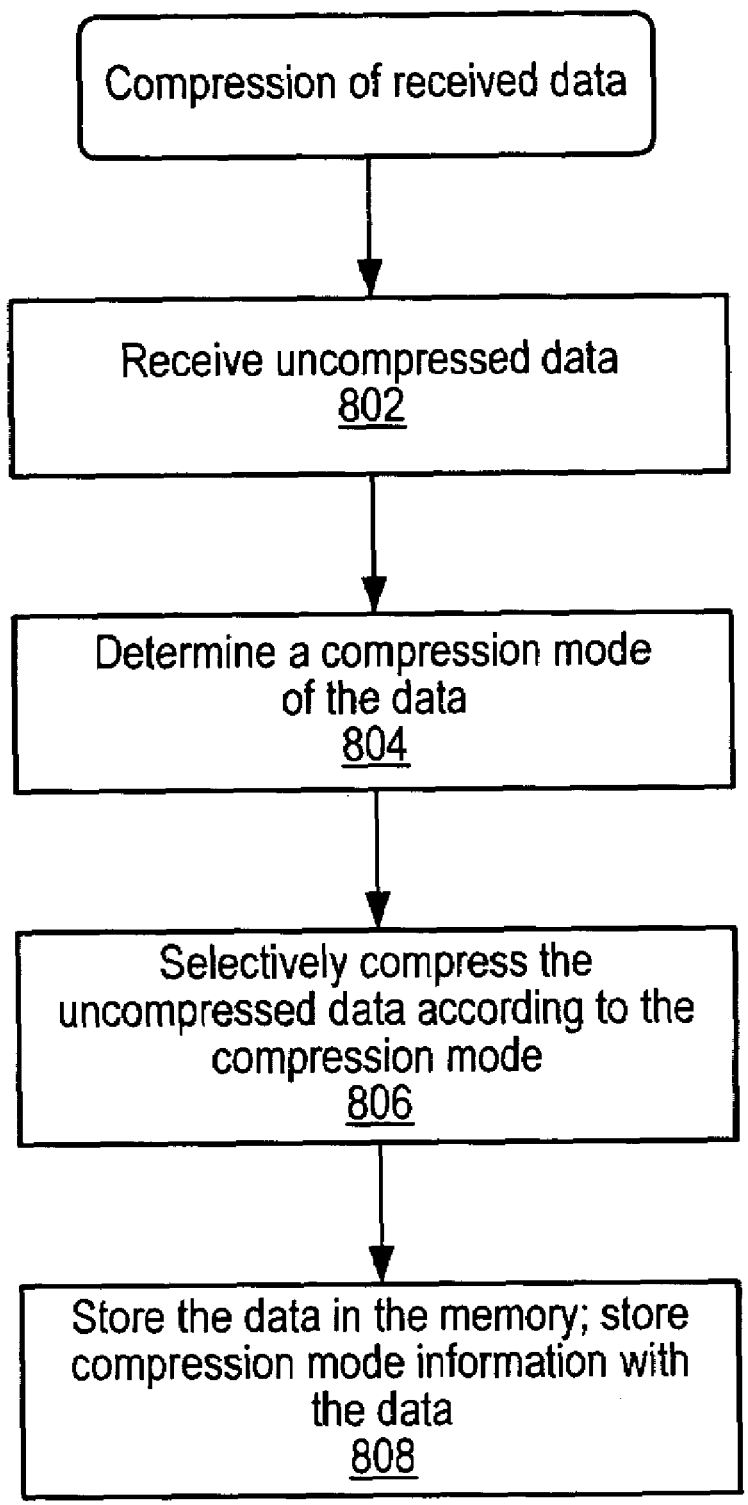
FIGS. 22 and 23 are flowchart diagrams illustrating operation of memory accesses using the compression mode features of the present invention.
Figure 23:
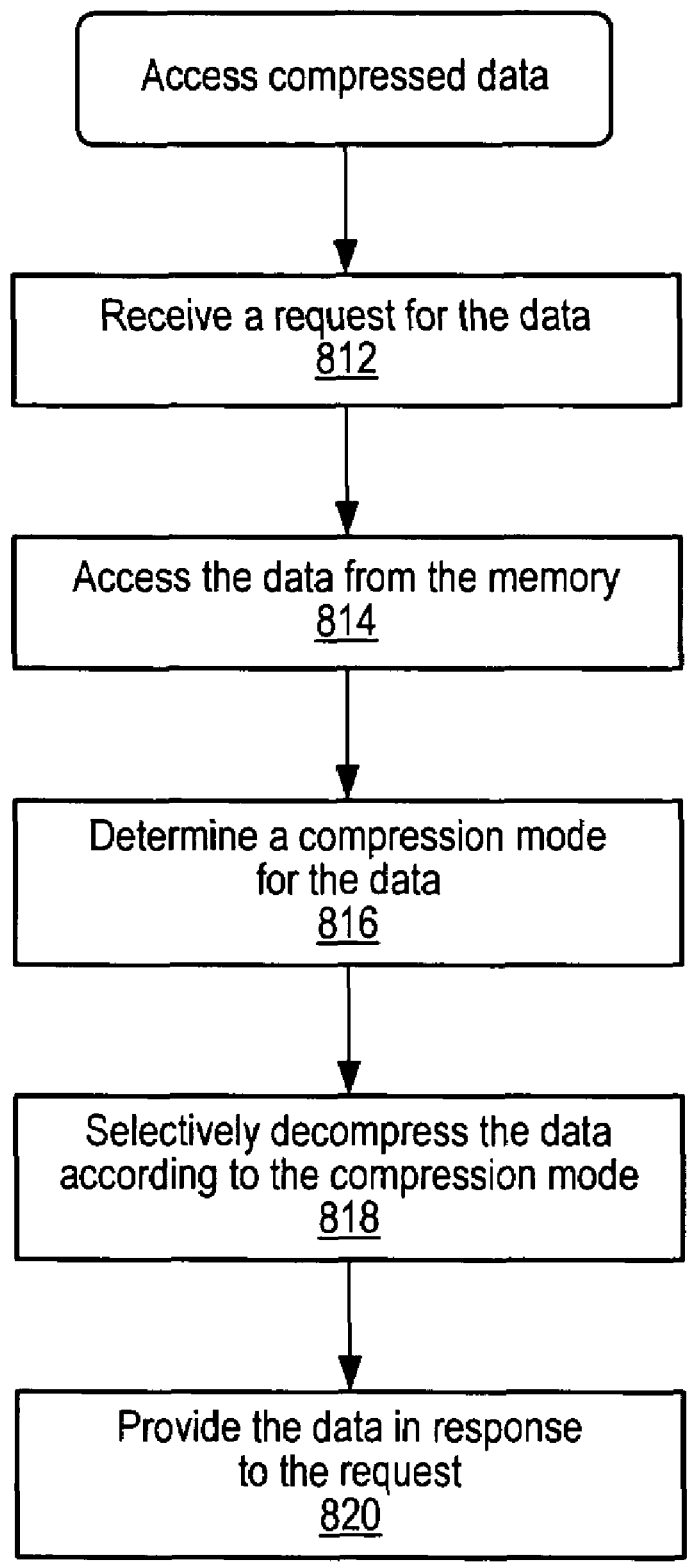

FIGS. 22 and 23—Selection of Compression/Decompression Mode Based on Criteria The parallel compression and decompression unit 251 can selectively perform a compression/decompression mode or type (compression mode) based on one or more of: requesting agent, address range, or data type and format, again as indicated in U.S. patent application Ser. No. 08/463,106. Examples of the compression/decompression modes (compression modes) include lossless compression, lossy compression, no compression, and the various compression formats shown in FIG. 21. The compression modes may also include varying levels of lossy compression for video/graphical objects or windows which are displayed on the display. Thus the IMC 140 can selectively perform lossless compression for first data, lossy compression for second data, and no compression for third data.

FIGS. 22 and 23 are flowcharts illustrating selective use of compression and decompression schemes. The method of FIGS. 22 and 23 is preferably performed by the memory controller comprising the compression/decompression engine. The memory controller is preferably a system memory controller for controlling system memory, wherein the system memory stores application code and data executed by the CPU.

As shown, the method in step 802 first receives uncompressed data. The data may be CPU application data, operating system data, graphics/video data, or other types of data. The data may originate from any of the various requesting agents.

In step 804 the method determines a compression mode for the data. The compression mode preferably comprises one of lossless compression, lossy compression, or no compression. Other compression modes include either the lossless or lossy types above in combination with one of the compression types shown in FIG. 21, e.g., either compressed linear, compressed block, compressed line, or I-compressed line.

The compression mode is preferably determined in response to one or more of: an address range where the data is to be stored; a requesting agent which provides the data; and/or a data type of the data.

Where the address range is used to determine the compression mode, the method analyzes the destination address received with the data to determine the compression mode, wherein the destination addresses indicating a storage destination for the data in the memory. For example, assume a first address range is designated with a lossless compression format, a second address range is designated with a lossy compression format, and a third address range is designated with a no compression format. In this case, step 804 of determining the compression mode comprises analyzing the destination address(es) to determine if the address(es) reside in the first address range, the second address range, or the third address range.

Where the requesting agent is used to determine the compression mode, the method determines who is the requesting agent and then determines the compression mode based on the requesting agent. For example, if the requesting agent is a CPU application or associated driver, then a lossless compression should be applied. If or the requesting agent is a video/graphics driver, then lossy compression may be applied.

Where the data type is used to determine the compression mode, the method examines the data type of the data and determines the compression mode based on the data type of the data. Using the example above, if the data comprises application data, the compression mode is determined to be lossless compression. If the data comprises video/graphics data, then the compression mode may be lossy compression. In the preferred embodiment, the determination of the compression mode is preferably inherently based on data type of the data, and the use of address range or requesting agent in determining compression mode may be implicitly based on the data type being stored in the address range or originating from the requesting agent.

Further, the compression modes may comprise varying levels of lossy compression for video/graphical objects or windows which are displayed on the display. Thus a lossy compression with a greater compression ratio may be applied for objects which are in the background of the display, whereas lossy compression with a lesser compression ratio may be applied for objects which are in the foreground of the display. As noted above, for graphical/image data, in step 804 the compression mode may be determined on a per-object basis, e.g., based on whether the object is in the foreground or background, or based on an attribute of the graphical object. For example, 2, 4, 8, or 16 varying levels of lossy compression may be applied to graphical/image data, depending on attributes of the object.

In step 806 the method selectively compresses the uncompressed data based on or in response to the compression mode for the data. In step 806, the data is compressed using a lossless compression format if the compression mode indicates lossless compression for the data, the data is compressed using a lossy compression format if the compression mode indicates lossy compression for the data, and the data is not compressed if the compression mode indicates no compression for the data.

In step 808 the method stores the data in the memory. In step 808, the data is stored in the memory in a lossless compression format if the compression mode indicates lossless compression for the data, the data is stored in the memory in a lossy compression format if the compression mode indicates lossy compression for the data, and the data is stored in the memory in an uncompressed format if the compression mode indicates no compression for the data.

In the preferred embodiment, storing the data in the memory includes storing compression mode information in the memory with the data. The compression mode information indicates a decompression procedure for decompression of the compressed data. The compression mode information is stored in a non-compressed format regardless of the compression mode of the data.

The compression mode information is preferably embedded in the data, i.e., is not stored in a separate table or directory. In the preferred embodiment, a header is created which includes compression mode information indicating the compression mode of the first data. As described below, the header is also used to store other information, such as an overflow indicator and overflow information. The header is preferably located at the top of the data, i.e., is stored at the beginning address, followed by the data, but may also be located at the bottom of the data or at designated points in the data.

In an alternate embodiment, the IMC 140 reserves space for an overflow tag and overflow table entry number in memory within the IMC 140. Thus, in this embodiment, the IMC 140 includes a separate overflow cache, entry table and control logic. In an alternate embodiment, the overflow indication can be processed by the same control and translation cache logic blocks used for a normal compression operation.

Referring now to FIG. 23, decompression of the stored data is shown. In step 812 the method receives a request for the data.

In step 814 the method accesses the data from the memory in response to the request.

In step 816 the method determines a compression mode for the data in response to receiving the request. In the preferred embodiment, the compression mode is comprised in the stored data, preferably within a header comprised within the stored data. Thus the data is first accessed in step 814 before the compression mode is determined in step 816.

In step 818 the method selectively decompresses the data. The type or mode of decompression is selected based on the compression mode for the data. In the selective decompression of step 818, the data is decompressed using lossless decompression if the compression mode indicates lossless compression for the data, the data is decompressed using lossy decompression if the compression mode indicates lossy compression for the data, and the data is not decompressed if the compression mode indicates no compression for the data.

In step 820, after decompression, the method provides the data in response to the request.

Thus, to further reduce latency, certain selected data can be stored/retrieved with normal operation using no compression or with a selected compression mode such as lossless or lossy. This is preferably accomplished by address range comparison for Memory management unit (MMU) blocks that contain special flags for "no-compression" indication. It is assumed that for power-on configuration, these non-compression address ranges may be set to the supervisor mode code and data blocks used by the operating system.

The MMU in the memory controller 210 can determine (e.g., 4096 byte range) what form of compression, if any, is used. In the preferred embodiment, this determination is based on compression fields located within the MMU translation table on a memory page boundary. In alternate embodiments, the compression type flags may be located on a plurality of boundary ranges. The method of using address range look-up to determine memory compression data types is further documented in patent disclosure titled "Memory Controller Including Embedded Data Compression and Decompression Engines", filed Jun. 5, 1995, Ser. No. 08/463,106, whose inventor is Thomas A. Dye.

Memory Allocation for Compressed Data—Priority and Normal Compression Modes

1. Priority Mode Compression

The IMC 140 includes two different compression modes for fast and efficient memory allocation and data retrieval. These two modes are referred to as "priority compression mode" and "normal compression mode". The "priority mode" architecture is a non-intrusive memory allocation scheme. Priority mode provides the ability to incorporate the MemoryF/X Technology, including the compression/decompression capabilities, for faster effective bandwidth, without requiring operating system software changes. In this case (without OS changes) the memory controller 210 of the IMC 140 is more tailored to bandwidth improvements than to memory size conservation. The compression and decompression operations increase the effective bandwidth of the system. The memory allocation and compression operations uses the additional memory freed up by the compression algorithm for the overflow space. The overflow space is used in cases where the lossless compression results in more data than the original data size before compression. The "priority mode" feature is used for systems that require faster data transfers and have no need for memory conservation.

In the case of priority mode operation, the overflow addresses are assumed to be in memory blocks previously reduced by the compression operation. Thus in priority mode system software reallocation is not required to compensate for memory allocation and size.

Any second level overflow or overflow that does not fit into the allocated overflow area provided by the memory allocation of the present invention is handled by a system level driver interrupt. In such cases where a real time event can not handle the second level interrupt delay, a fixed compression ratio of a required size can be used under the alternate embodiment previously disclosed.

The priority mode is used for compressing data and storing the compressed data in a memory in a computer system, wherein portions of the computer system are not required to account for the compression. In the priority mode method, the computer system, e.g., the operating system, first allocates a memory block for uncompressed data. The memory block is allocated on the assumption that the data stored there will be uncompressed data.

The operating system is not required to account for the compression operation and may be unaware of the compression operation.

The memory controller may later receive uncompressed data and one or more corresponding destination addresses indicating a storage destination of the first data in the allocated memory block. In response, the memory controller compresses the uncompressed data to produce compressed data. The memory controller then stores the compressed first data in the allocated memory block at the one or more destination addresses. This store operation preferably does not perform address translation of the one or more destination addresses for reduced latency. Thus the priority mode compression does not attempt to perform memory minimization. Also, as noted above, overflow storage may be allocated in the allocated memory block, as needed.

When this compressed data is later requested by a requesting agent, the destination addresses are used to access the compressed data from the memory, decompress the compressed data, and provide the uncompressed data in response to the request.

1. Normal Mode Compression

In the normal compression mode (non-priority mode), the IMC 140 uses a novel memory directory for fast and efficient data retrieval during the decompression process. The novel directory procedure allows for minimum memory consumption to hold memory allocation and directory tables, and a fixed area allocation to assist the operating system software for use in the computer main-system memory bank 110.

Memory allocation and directory maintenance is performed under control of the compression control unit 281 and the compressed data directory 271 located in the IMC 140 memory controller 220 (FIG. 4). The initial address ranges and compression block sizes are set during initialization and configuration by the BIOS or boot software. The address range selection is only necessary when the system uses a plurality of requesting units with different compression formats and requirements. In a closed system where only a single client uses the memory system, a majority of this initialization can be hard wired into the standard operation. The address range and block selection flexibility gives the system more performance as required by the special needs of the requesting agents. In the PC environment for example, the PCI and AGP address ranges require separate entries in the compressed address translation table 2710. The present invention allows for multiple compressed address translation table 2710 entries for CPU to memory transactions.

In an alternate embodiment the address translation table 2710 entries can be allocated not by the operating system software but by a separate statistical gathering unit (not shown in the preferred embodiment). The statistical gathering unit monitors sequential addresses, requesting agents, and the associated block sizes and then automatically and dynamically programs entries into the compressed address translation table 2710.

In addition, if the compression operation is not required for a plurality of requesting agents or block sizes, such as graphics frame buffer or depth and texture compression, the compression address translation table 2710 is not required in the alternate embodiment.

Figure 24:
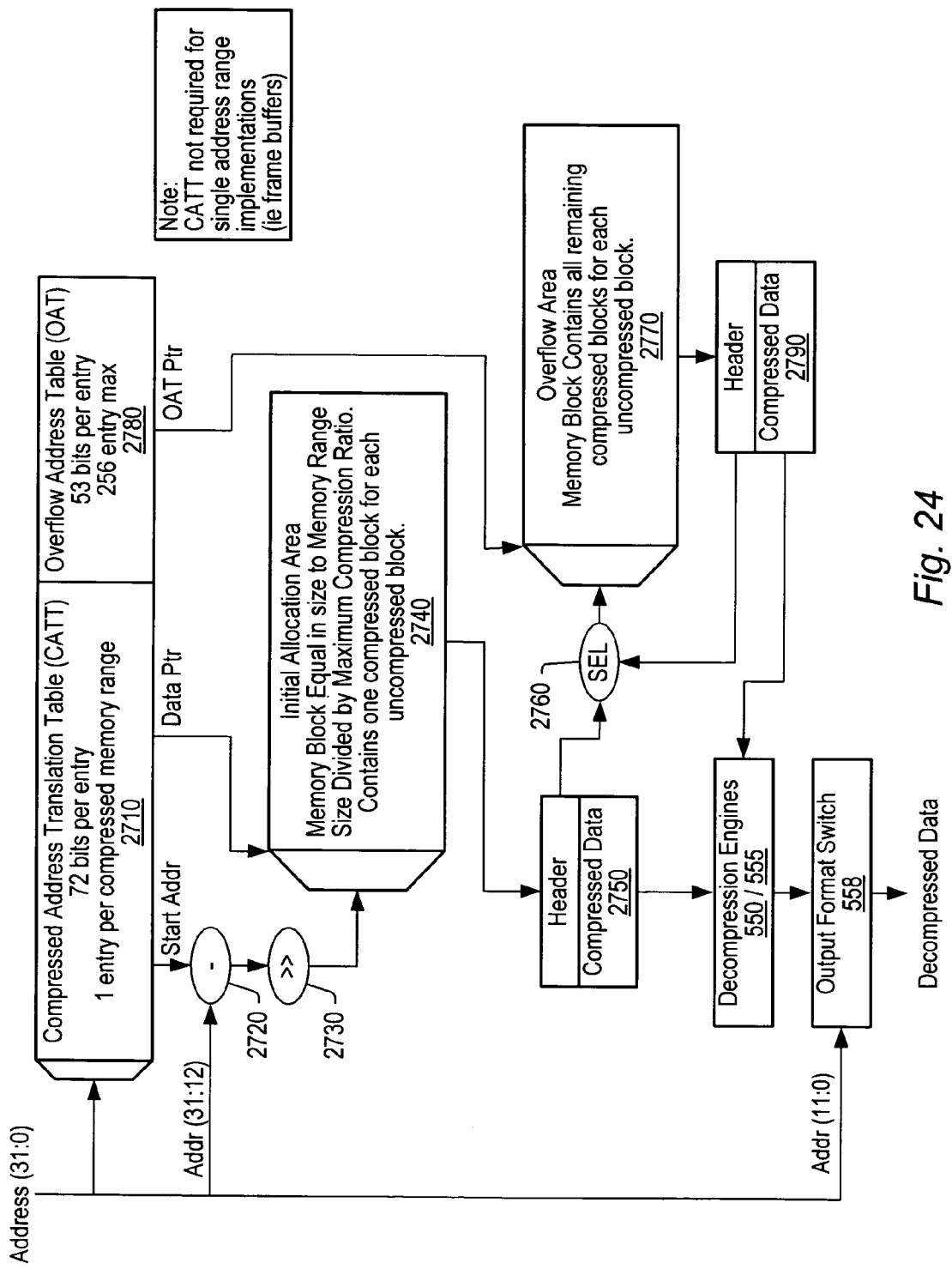
FIG. 24 illustrates the flow for compression address translation, dictionary and overflow block address translation.

FIG. 24—Memory Allocation

FIG. 24 illustrates the preferred procedure for memory allocation within the compression and decompression system environment of the IMC 140 or alternate embodiments of the present invention. The full address bus is presented to the compressed address translation table (CATT) 2710 for address start selection, data pointer, and overflow table pointer information. The initial allocation area 2740 is a portion of system memory which has previously been allocated to a fixed size by the system or user software. The initial allocation area 2740 receives a portion of the translated address that preferably has been translated by a simple subtraction and shift operation for look up of the first block. The initial allocation area 2740 contains one block of the compressed data for each uncompressed block in a fixed memory allocated range. Once the address for the compressed block is located, the header for the block is decoded by the compressed data header logic 2750 for determination of further decompression. The compression block header 2750 located at the front of the compressed data block determines if the block compressed to a size larger than the allocated compressed block size. If so, the overflow address translation pointer is used along with the information from the compressed header data 2750 through the select logic 2760 to select the correct overflow area pointer to read the overflow block from the overflow area 2770. The overflow area resides in the remaining portion of system memory unused by the initial allocation area. The resulting overflow block header 2790 contains information along with the original header information 2750 used by the decompression engines 550 and 555 to complete the decompression process. The output of the decompression unit is used by the output format switch 588 for selection of block information and final output as decompressed data.

Figure 26:
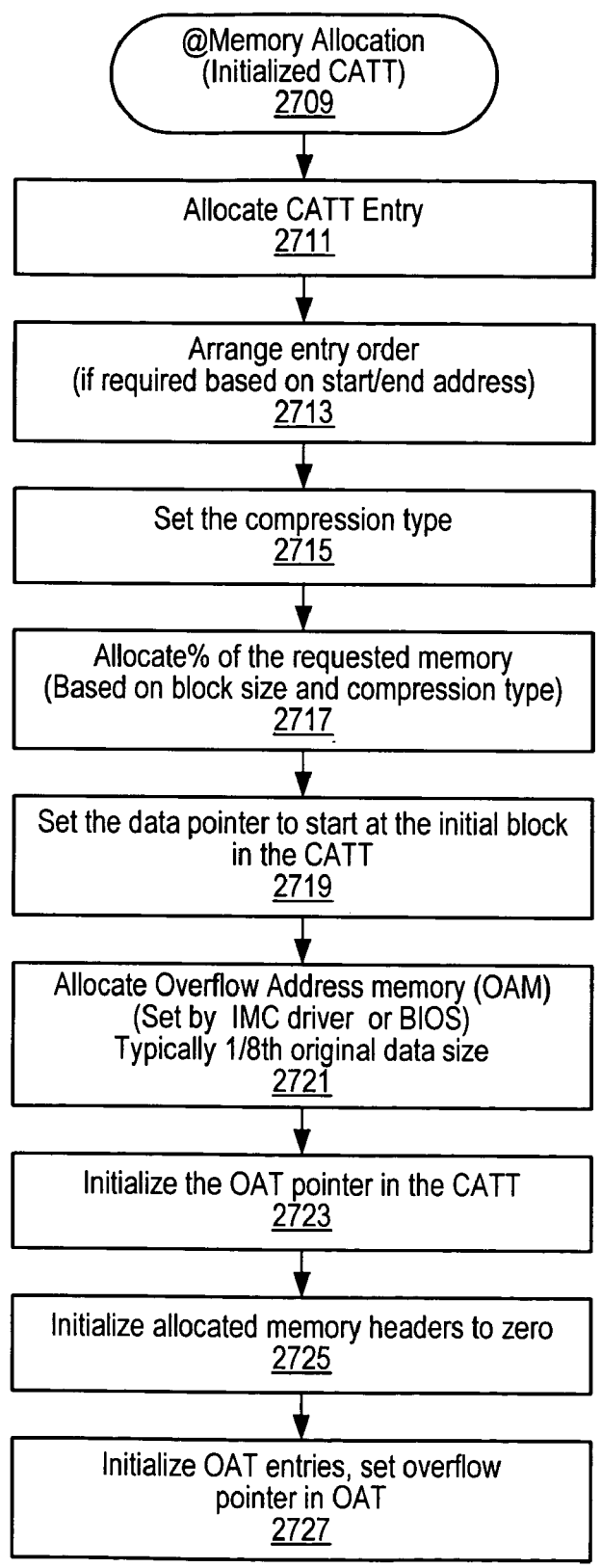
FIG. 26 illustrates the initialization process flow for the compression address translation table.

FIG. 26—Memory Allocation and Initialization

Referring to the flowchart of FIG. 26 and in reference to FIG. 24 and the table of FIG. 25, the preferred embodiment for the memory allocation and initialization is outlined. It should be noted that in FIG. 24 the most recently used CATT and OAT entries could be cached by the compression controller for faster access in a system with many separately compressed memory ranges. The number of entries in the CATT is variable, and allows overflow into the memory. For faster lookup, the CATT in memory will have its entries ordered. The OAT entries are numbered so no ordering is required.

The preferred initialization 2709 is shown in FIG. 26. First, in step 2711 the method allocates a compressed address translation table entry. If required in step 2713, a reorder of entry data for the start and end compression block addresses is performed. In step 2715 the set method of the compression type for this memory range based on the allocate command of the initialization or operating system software. In the preferred embodiment pages are on 4096 byte boundaries which follow the current PC architecture for address translation performed by the CPU or GART. In alternate embodiments other page sizes may be used. In addition, in other alternate embodiments the CATT may not be necessary if memory allocation is to fixed memory types such as frame buffers, or embedded appliances where a single CATT entry could describe the entire memory.

In step 2717 the method allocates a percentage of the requested memory, based on the block size and the compression type. During the allocation command sequence of step 2717 the requested compression block size and the type of compression operation performed will determine the maximum amount of allocated memory. The data (DAT) pointer is initialized in step 2719 to start at the initial block in the CATT 2710.

The overflow memory allocation and initialization in step 2721 is performed by either the initialization logic, software drivers, BIOS or operating system software. With the lossless compression algorithm used by the preferred embodiment, the maximum overflow allocation is 12.5%. Typical allocation of the overflow area in step 2770 is a portion of the original data size. For the preferred embodiment, $\frac{1}{8}^{th}$ the original data size is the typical choice. The overflow address table 2780 is then initialized in steps 2723, 2725 and 2727 if required. These steps initialize the headers to zero and initialize the overflow address table 2780 entries to point at the overflow address area 2770. Thus the memory allocation procedure 2709 performs the initialization of the CATT 2710 and OAT 2780, and in addition allocates the initial allocation area 2740 and the overflow area 2770.

Figure 27:
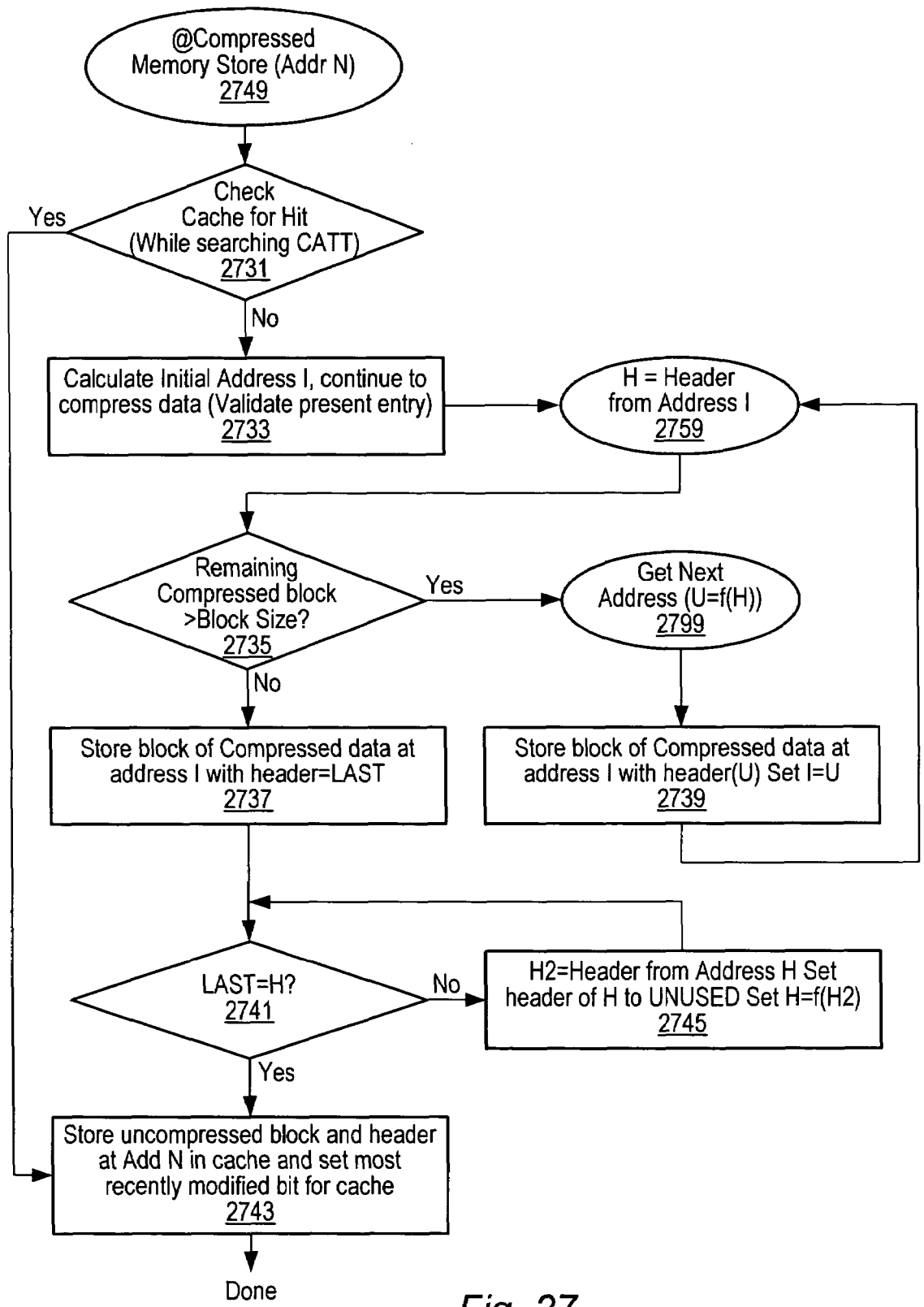
FIG. 27 illustrates the store transaction process flow for the compression and decompression unit.

FIG. 27—Compressed Memory Writes

FIG. 27 illustrates the procedure for performing compressed memory writes. A write operation first involves a cache look-up to determine if the write data resides in the cache 291 in an uncompressed format. If so, the write data overwrites the current data in the cache 291, and this entry is marked as most recently used. In a write-back implementation, the write data is not actually written back to the system memory 110, but rather is stored only in the cache 291. In a write-through implementation, the write data is written back to the system memory 110, preferably in a compressed format, as well as being stored in the cache 291 in an uncompressed format.

If the write data does not reside in the cache 291, then an LRU block may be flushed back to the system memory, preferably in a compressed format, to free up a line in the cache 291, and the new write data is stored in the cache 291 in an uncompressed format in the freed up line. Again, this write data is not actually written back to the system memory 110 in a write-back implementation, but is written back to the system memory 110, preferably in a compressed format, in a write through implementation.

The operation of the cache 291 may also involve analysis of status bits, such as invalid and modified bits, for lines in the cache. Where the cache 291 is an L2 or L1 cache, the operation of the cache 291 may also involve analysis of status bits, such as invalid, shared, exclusive, and modified bits, for lines in the cache.

Referring to FIG. 27, as write data enters the memory controller 220, a look up by the CATT 2710 is performed in step 2731 for determination of an internal cache hit. The internal compression cache 291 preferably contains normal non-compressed data. If a cache hit occurs as determined in step 2731, no compression or memory fetch of compressed block is required, and the data is retired to the cache immediately in step 2743. The uncompressed write data is preferably stored in the cache, and a most recently modified flag is set for this cache entry. In alternate embodiments the compression cache memory may be internal or external to the IMC 140 or may contain compressed data in addition to normal non-compressed data.

The write data is assembled into a decompressed block, and in the preferred embodiment, the block is stored uncompressed in the data cache. In alternate embodiments without the compression data cache, the block can be written back to the system memory 110. In the alternate embodiment, or in the case of a castout of this data from the cache, the same compressed blocks that were previously used for this uncompressed data will be reused.

If the resulting lookup of step 2731 is a cache miss, and the cache does not contain an unused line for this write data, the LRU line is selected for write back. The initial address for the write back is calculated in step 2733 using a simple subtract and shift to write the first compressed block to main memory 110. The header is read and processed, to determine if additional blocks were previously allocated for this block of data in steps 2759 and 2735 while the write back data is compressed by the compression engine 570 or 575.

Figure 29:
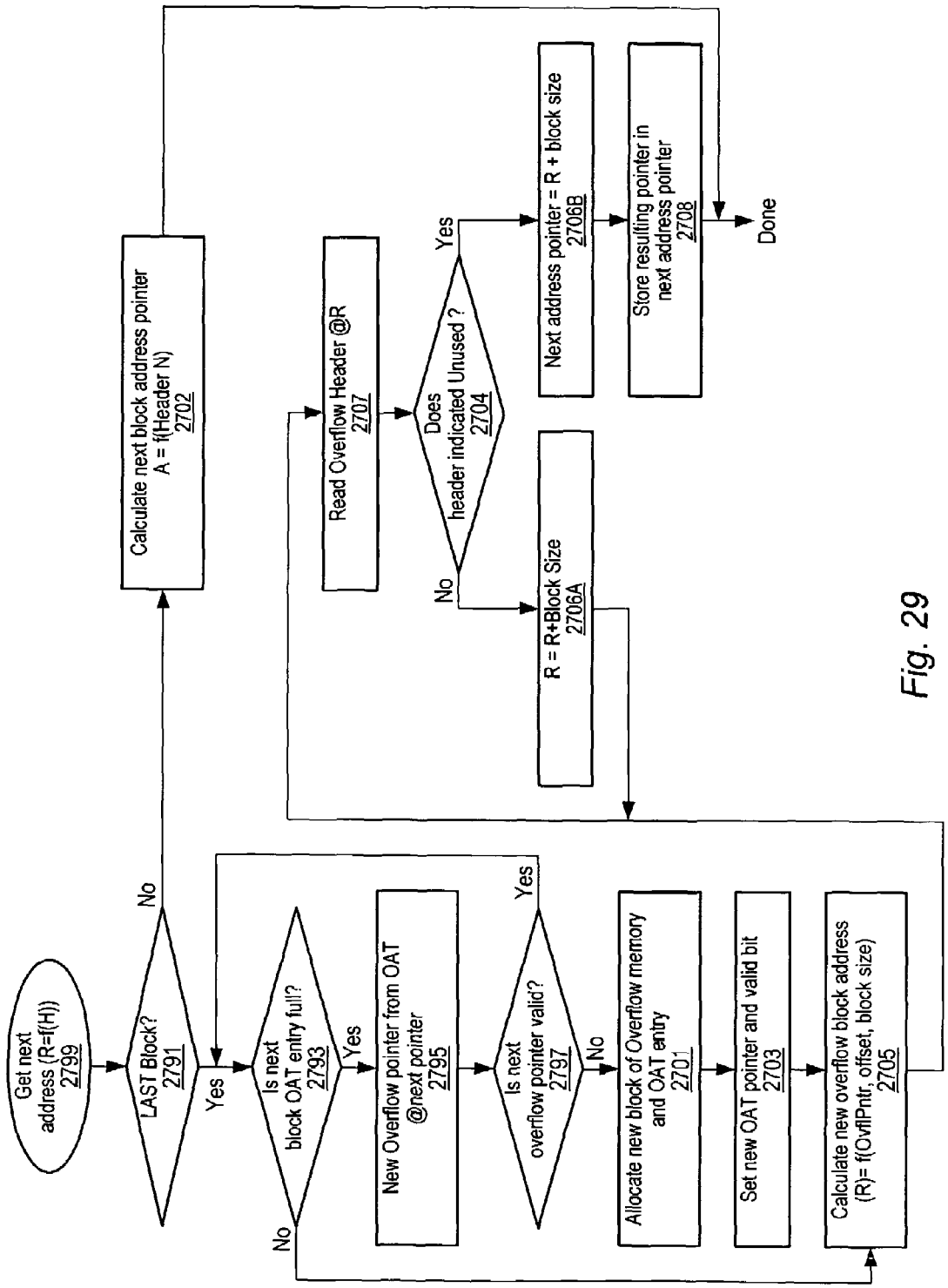
FIG. 29 illustrates the next address generation process flow.

Once the compression of the data is complete, the compressed data is tested for overflow of the initial allocation block 2740 as indicated in step 2735. If larger than the initial block size, the next address allocation, step 2799 shown in FIG. 29, is performed. A compressed block is stored in the block returned by the next address allocation, and the header from the next block is retrieved 2759. This loop continues until the complete compressed data is stored. If the compressed data fits without overflow it is stored in this block with an overflow indicator in the header indicating Last Block, and the test for last block of step 2741 is performed. If this block was the last one allocated previously, the store is complete. Otherwise, the header of the next block is fetched and re-written as Unused 2745. The newly fetched header is then checked for Unused, and this loop (2741, 2745) continues until all previously allocated blocks are marked unused In step 2745. The newly fetched header is then checked for Unused, and this loop steps (2741 & 2745) continues until all previously allocated blocks are marked Unused.

Figure 28:
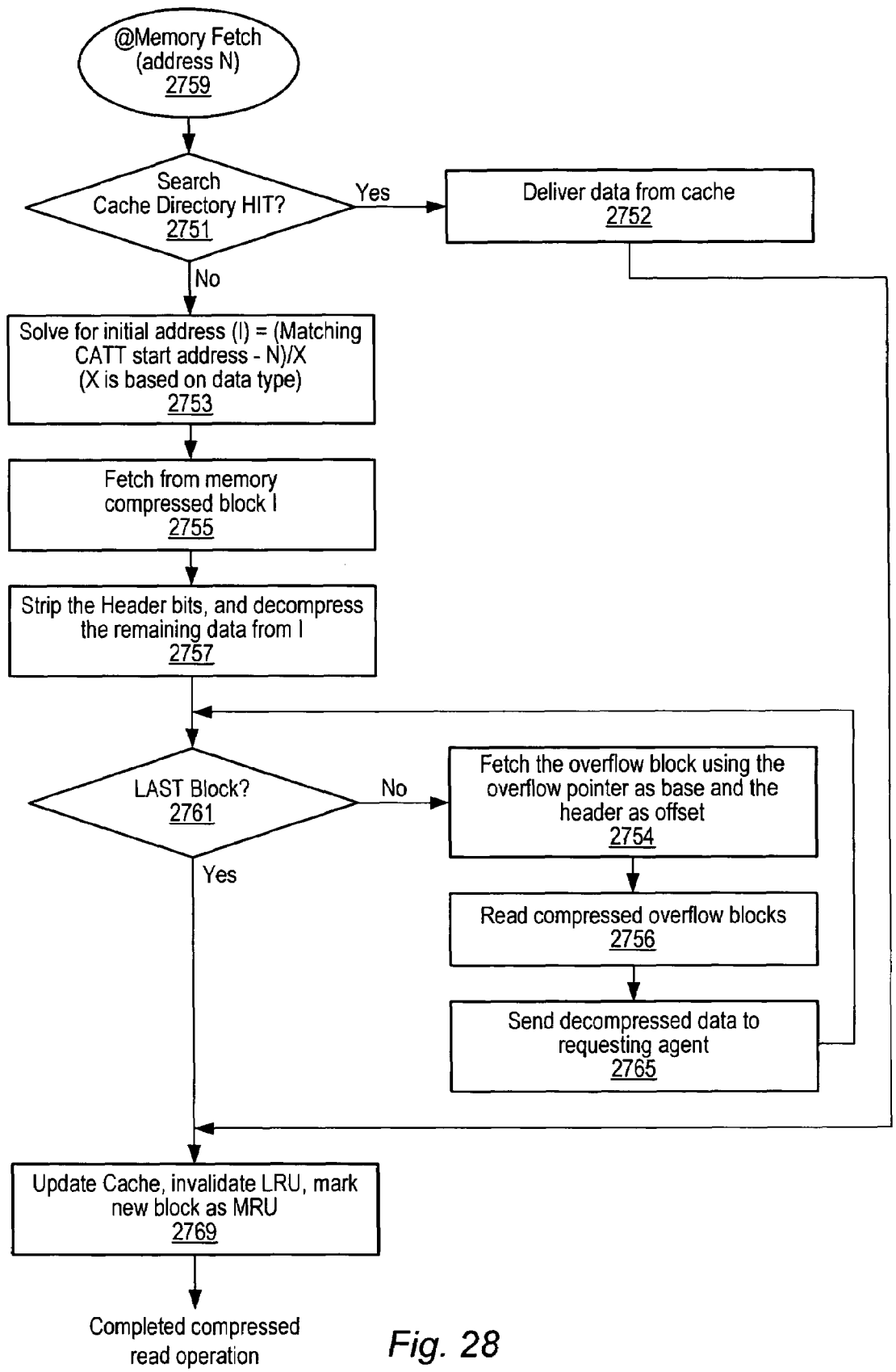
FIG. 28 illustrates the memory fetch process flow.

FIG. 28—Memory Fetch

FIG. 28 illustrates the process for memory fetch 2759. As shown, in step 2751 the method determines if the data is resident in cache. If a cache hit occurs, i.e., the data resides in the cache, then data is read directly from the cache in step 2752. The cache flags are undated in step 2769 and the most recent block is marked n step 2769.

If the compressed block is not located within the cache as determined in step 2751, the initial compressed block address is calculated in step 2753. From this address the initial block is read from the system memory 110 in step 2755. In step 2757 the header instructs the memory controller 210 for the decompression process. More specifically, the method strips the header bits to determine the type of decompression, and the data is decompressed using the appropriate decompression method. In step 2761 the initial block header is tested for a last block indication to determine if the last block of the fetch has been accessed and if so marked, the process finishes with a cache invalidation of the LRU and a store of the block as MRU as in step 2769.

Thus the LRU data in the cache is removed or invalidated to make room for the newly read data, which is stored in the cache and marked as most recently used. If the header indicates additional blocks in step 2761, a fetch of the overflow block from the overflow area 2770 is required in step 2754. Based on the calculation of the overflow block pointer in step 2754 the block is read and decompressed in step 2756. In order to reduce latency, the data is sent back to the requesting agent in step 2765 and the process is ended if the last block was reached in step 2761. The book-keeping then updates the operation, setting the new cache block as MRU with a possible compression and memory write of the LRU block in cache as shown in step 2769. Thus the memory fetch operation and process of 2759 reads compressed blocks from system memory 110 decompresses these blocks and manages such cache and overflow address calculations.

FIG. 29—Next Address Generation

The next address generation shown in FIG. 29 performs the calculation for the next compression block address. During step 2791 the header is examined for indications of block completion. The last/unused flag (overflow indicator) located in the header indicates completion. If the last block is not reached, the process continues with step 2702 for calculation of the next block address pointer. Once complete the next address is returned for further process. If during step 2791 the initial header indicates last block, then the process proceeds with step 2793 where the overflow process must determine a new overflow address for the overflow header build. If the OAT 2780 is not full operation continues with step 2705. If the OAT 2780 entry is full a new overflow pointer must be assigned in step 2795. A check for valid overflow pointer is made in step 2797 and this pointer is used if it is valid. If the overflow pointer is not valid, operation continues with the allocation of the new overflow memory block and OAT 2780 entry, step 2701. The new overflow address table 2780 pointer is set to the address of the newly allocated entry 2703. The process continues with step 2705 where the new overflow block address is calculated. Once the new block address is presented, step 2707 reads the new overflow header and based on this header step 2704 determines if the overflow block is unused. If unused is indicated in step 2704 the next sequential block's address is stored in the next address pointer in step 2706B. If a unused in not indicated in step 2704 then the address for the next sequential block is calculated, and a return to step 2707 checks that block for unused. A reasonable implementation of the present invention for the parallel compression and decompression address allocation and data directory are shown in Table 6. The memory allocation table, from left to right indicates the uncompressed block size, the type number entry, the initial allocation area block size, the overflow area block size, the maximum compression ratio, the initial allocation percentage of the uncompressed data, the header size without overflow, the maximum header size with overflow and sequential blocks, the maximum header size with fragmentation and non-sequential blocks, compression and fragmented data. For an average uncompressed block size of 512 bytes, the total directory size is less than 1% of the compressed data size. Thus the embedded compressed next address and overflow algorithm significantly enhances the reduction of directory information required for compression and decompression process as indicated by the present invention.

L3 Data Cache

The structured use of L3 data cache 291, which contains pre-fetched decompressed data, reduces latency by using pipelined addresses and a most recently least recently used cache address scheme. Thus, in the preferred embodiment an L3 data cache is used to store most recently used memory pages which are read from the main memory 110. The pages are preferably decompressed by the parallel compression and decompression unit 251 and stored in the L3 cache in a decompressed format for rapid access and reduced latency. The L3 cache was discussed in detail above.

Compression Reordering

To reduce latency even further, the IMC can also operate to reorder compressed blocks for faster access of compressed data blocks. In the preferred embodiment, an optional address tag is stored in the compressed data to indicate a new byte order from the original or last byte order of the input data stream. During decompression the longest latency to recover a compressed portion of data on a compressed first block will be the last byte in the portion of the compressed block. Larger compression block sizes will increase latency time. This method of latency reduction separates a compression block at intermediate values and reorders these intermediate values to be located at the front of the compression block. The block is reordered so that the segment most likely to be accessed in the future, e.g. most recently used, is placed in the front of the block. The tag field indicates to the decompression engine how to reorder the bytes in the intermediate segments for placement into the L3 data cache. When the block (currently stored in the L3 data cache) becomes the least recently used block, and before it is written back to main memory 110, it will be compressed with the most recently used intermediate segment at the front of the compressed block before storage back into the main memory 110. This method of latency reduction is especially effective for program code loops and branch entry points and the restore of context between application subroutines. In an alternate embodiment, a tag field could be present for each intermediate block such that the new compression order of intermediate segments track the N most recent intermediate blocks in the order in which they were accessed over time. In the preferred embodiment only the block header will indicate which intermediate block segment is first in the recompression and restore process, the order will then follow the nature of the original data stream.

Figure 31:
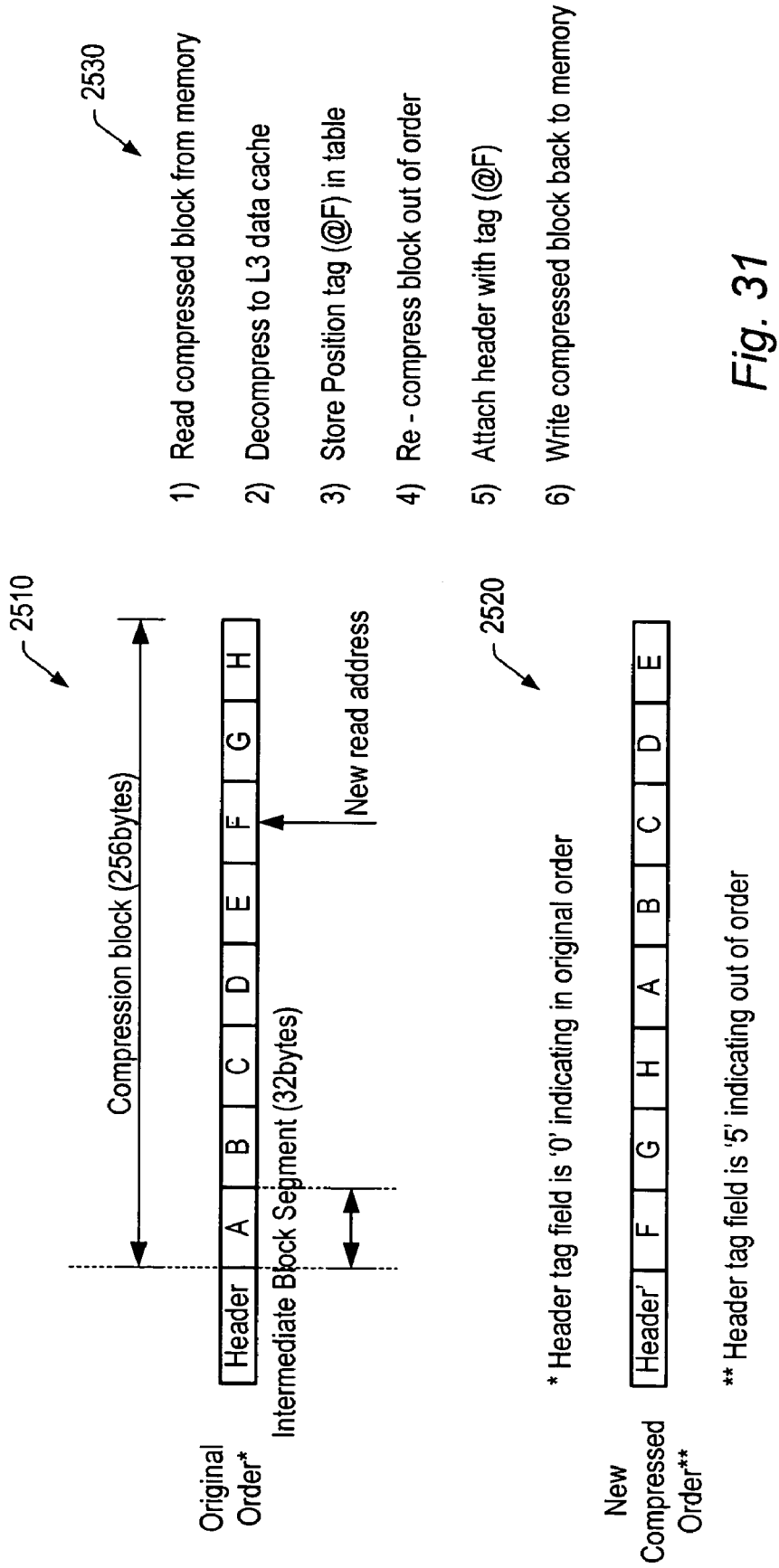
FIG. 31 illustrates the compression re-ordering algorithm use to reduce read data latency of subsequent memory read cycles by requesting system agents.

FIG. 31 illustrates how out of order compression is used to reduce read latency on subsequent reads from the same compressed block address. The original compressed block 2510 is stored in main memory 110 in the order written by the requesting agent. As a new request is issued by the requesting agent, the steps indicated in sequence 2530 are preformed. At the time compressed block 2510 is ready to be re-compressed for storage into the main memory 110, an out of order flag is attached to the header field indicating that the intermediate blocks are out of order from the original written order. The new compressed out of order block 2520 is written back to main memory 110.

Variable Compression Block Size

In the preferred embodiment, the compression block size, representing the input data block before compression, is dynamic and can be adjusted in size to reduce latency of operation. For example, the local bus interface 106 may compress with input blocks of 32 or 64 bytes while video 235 or graphics engine 212 may compress with input blocks of 256 or 512 bytes. In the preferred embodiment the power-on software will set default block sizes and compression data formats for each of the requesting units and for specific address ranges. Also, the preferred embodiment includes software control registers (not shown) that allow interface software drivers to dynamically adjust the compression block sizes for a plurality of system memory performance levels. Thus, by dynamically adjusting the compression block sizes based on one or more of the requesting agent, address range, or data type and format, latency can be minimized and overall efficiency improved.

Dynamically Gather Statistics to Adjust Block Size

In one embodiment, the IMC 140 may gather statistics to dynamically adjust block size. The IMC gathers statistics on sequentiality of addresses and locality of addresses. In this embodiment, the IMC 140 includes a statistical unit which analyzes, for example, address blocks, localities of requests to the same page or block, and the sequentiality of the addresses being accessed.

Loss Less Decompression

A discussion of the parallel decompression 550 for the lossless decompression of parallel compressed data is now disclosed. According to the present invention, decompression of the parallel compressed data can be done serially as well as in parallel. Because the data is designed to be identical to the serial compression algorithm, either serial or parallel decompression engines will result in the same data. In the preferred embodiment, it is desirable to be able to decompress at least as fast as the compression operation or faster. Also, in alternate embodiments, decompression engines 550/555 may be placed in a plurality of locations within the system or circuit. Multiple decompression engines allow for a custom operation of the decompression process and a custom bandwidth of throughput may be designed depending on the number of stages used in the decompression engine. Therefore, below is a decompression algorithm for the decompression engine 550 that yields higher bandwidth than prior art serial algorithms.

Figure 33:
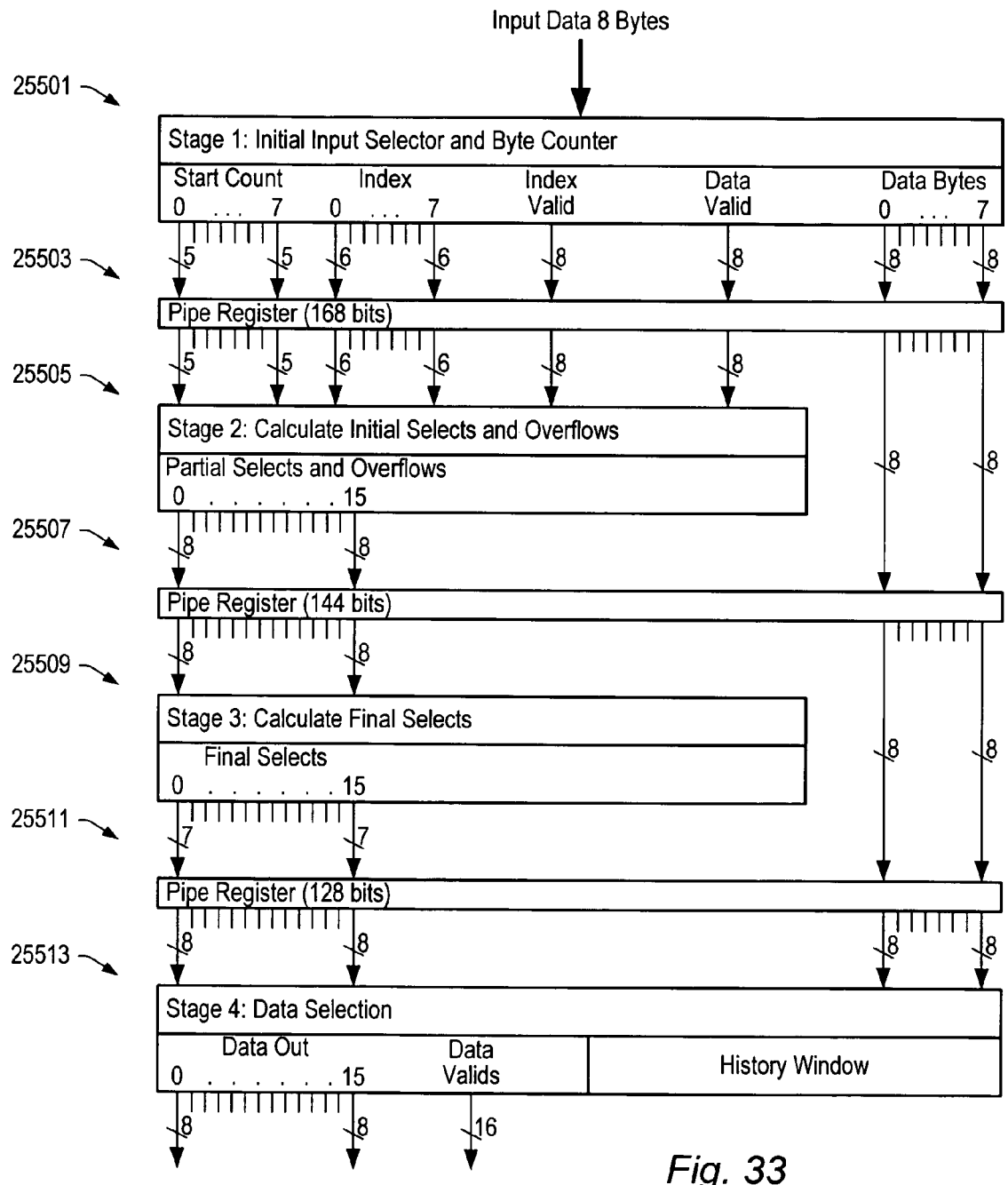
FIG. 33 illustrates the four stages used for the parallel lossless decompression algorithm.

According to the present invention the pipelined design is expected to require 4 stages to run at 100 MHz using a 0.25μ CMOS technology. The stages of the decompression engine are illustrated in FIG. 33. These stages are preferably divided up, or alternatively combined, as the silicon process technology requires. Only the last stage in this pipeline 25513 uses the history window, and that final stage contains minimum logic. Based on this, this function could be extended to many more than 4 stages if a significantly faster clock was available. Thus in alternate embodiments as process improves and clock rates increase the stages of the decompression engine can increase to increase the decompression rate with the same input compression stream. However, for the preferred embodiment the four stages shown are the logical divisions of the function. To understand this novel decompression the table of FIG. 32 illustrates the compression mask and index coding algorithm for a sample code. In alternate embodiment other codes could alter the design of the decompression unit.

With the preferred embodiment of codes is shown in the table of FIG. 32, the following decompression trees allows decoding of 8 bytes of the input in one cycle. The smallest encoded data is 8 bits, so the minimum number of decoders (25521–25535), indicated in FIG. 34, for 8 bytes is 8. Each of these decoders could see one of many data inputs depending on the prior compressed stream.

Figure 34:
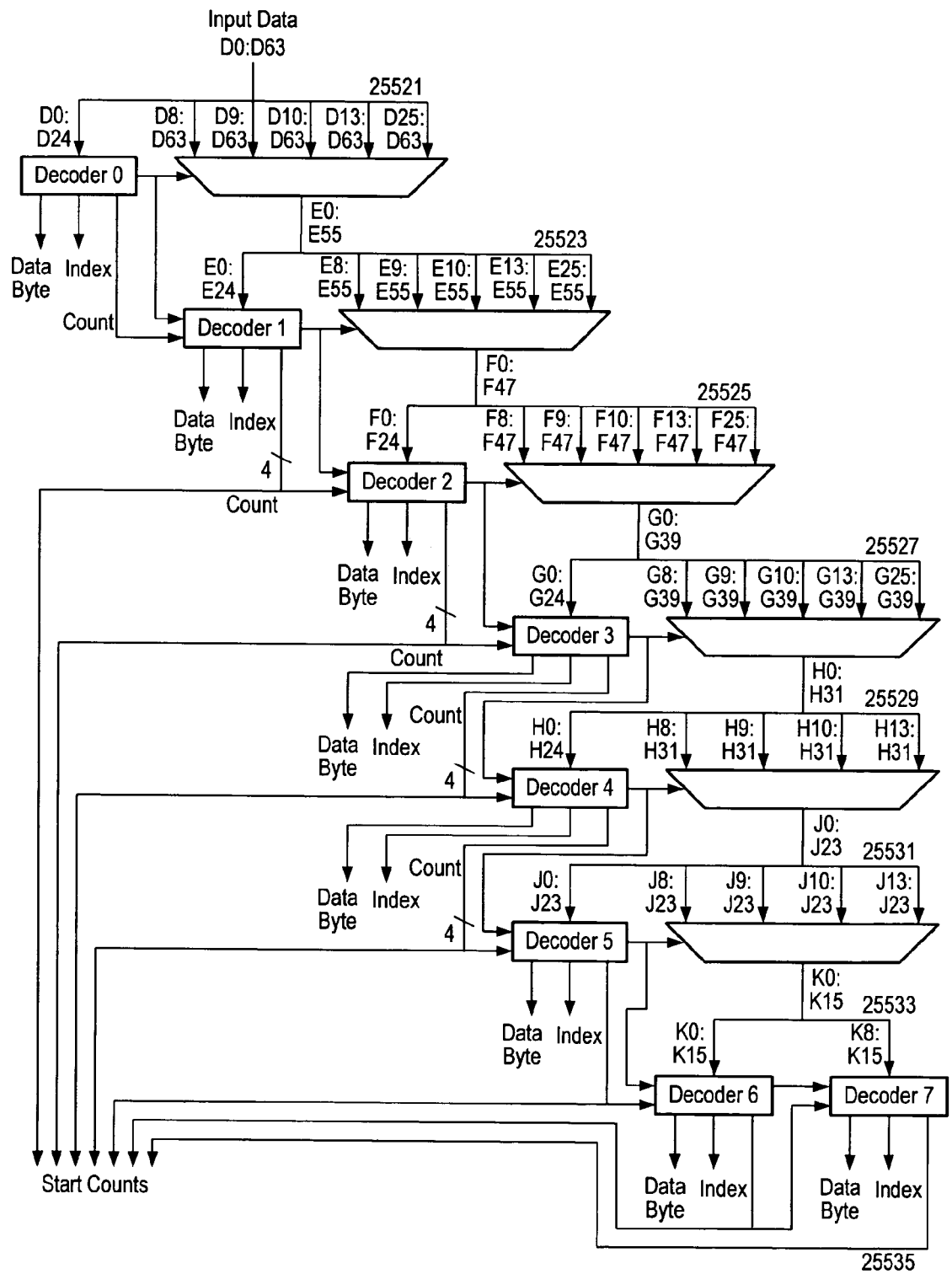
FIG. 34 illustrates the eight decoder stages required to generate the start counts used for the parallel decompression process.

The decompression tree, shown in FIG. 34, requires very fast decoding at each stage to determine the proper data for the next stage. The Window Index, Start Count and Data Byte output (FIG. 32) should be latched for the next stage of the decode pipeline of FIG. 33. This decode pipeline requires the assembly of the output data. More detail of the preferred Decode block can be seen in FIG. 35.

Figure 35:
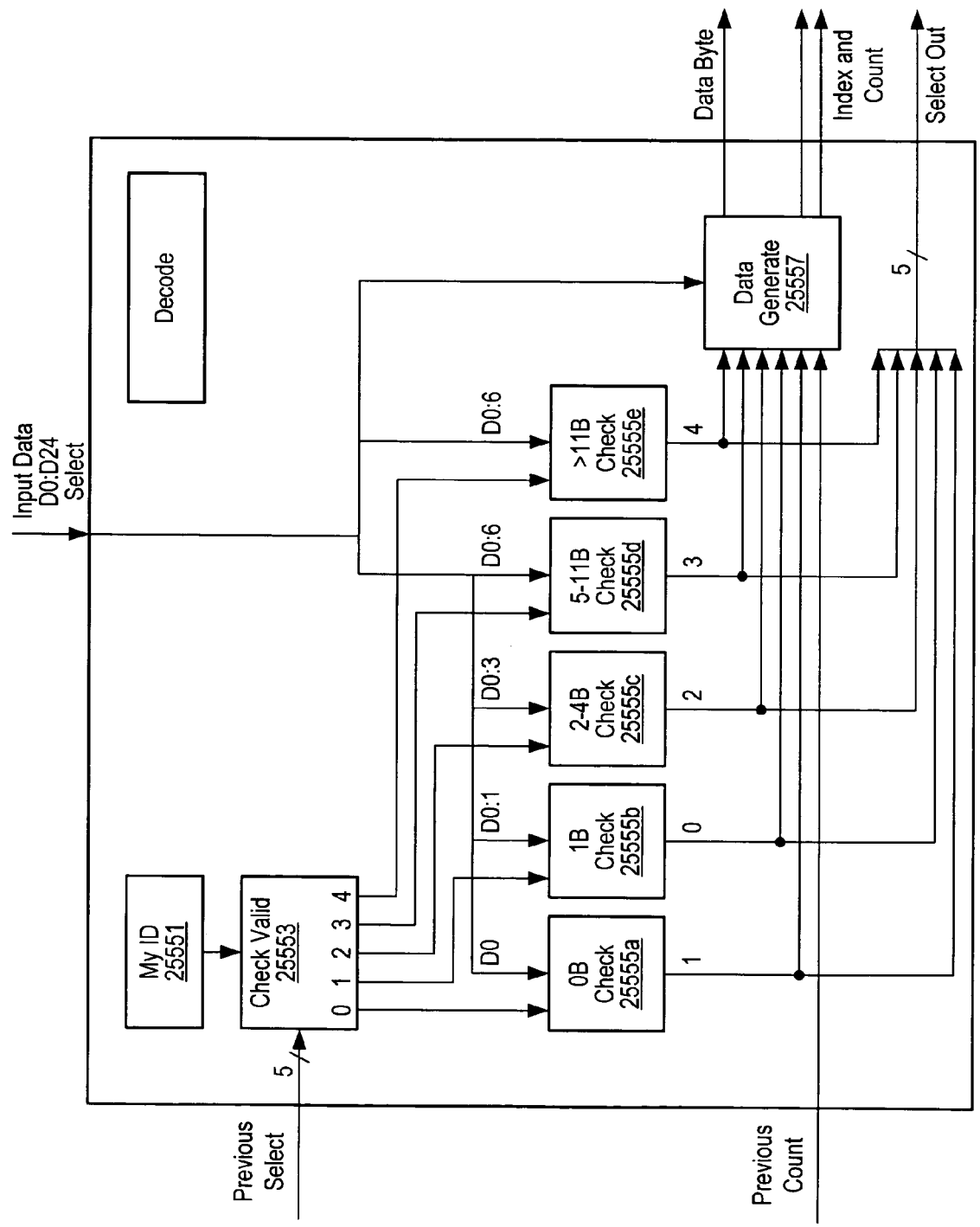
FIG. 35 illustrates a single decoder block used by the stage 1 input selector and byte counter of FIG. 33.

The Check Valid block 25553 verifies that enough bits are available for the checker 25555(*a*–*e*). The tables for these blocks are illustrated in the tables of FIGS. 36*a* and 36*b*. In the preferred embodiment, the longest path through Check Valid 25553 should be 3 gates, and the Byte Check 25555 (*a*–*e*) will only add one gate because the check is an output enable. The outputs from the Check Valid logic 25553, and the Byte Check logic 25555 in FIG. 35 show 0 as the most significant bit, and 6 as the least significant bit.

The data generate logic 25557 is simply a mux of the input data based on the check select 25555 input. At most, one Byte Check should be active for valid data. In addition an alternate embodiment may include a checker which is added to this decoder to verify that one byte check is active for valid data. The table of FIG. 36*b* describes the Data Generate outputs based on the Data Input and the Byte Check Select.

The second stage 25505 of the decompression begins calculating pointers to the appropriate bytes from the history window for compressed data which have been latched in the 168-bit pipe register 25503. Stage two receives eight copies of the Index & Count or Data Byte from each decoder, along with a pair of valid bits for these sets of signals. With minimal logic, a preliminary select can be calculated for each of the 16 output bytes that are latched in the 144-bit pipe register 25507. Each select latched into 35507 is a 7 bit encode (for a 64-entry window) with a single bit overflow. These signals are latched 35507 and used by the next unit 25509 in stage 3. The selects will have the values of 0–63 if a window value is to be used for this output byte, 64–71 if one of the eight data bytes is to be used for this output byte, and an overflow if the data for this output byte is a result of one of the other parallel decodes occurring with this data. The third stage 25509 checks each of the overflows from the previous stage 25505. If inactive, the 7 bit select is passed on unchanged. If active, the select from the correct stage 2 decoder 25505 is replicated on the select lines for this output byte.

The final stage of the decompression, stage 4 25513, selects the data from the window or the data bytes passed from the 1$^{st}$ stage to build the output data. The output bytes that are assembled are then added to the window for the next cycles decode.

Because the maximum output of this design is 16 bytes per cycle, it is required that the 1$^{st}$ stage select its next input data based on the number of bytes that will be used to decode 16 bytes. This is calculated during the 1$^{st}$ stage in 25501. Additionally, the last stage 25513 includes data valid bits so that the proper output data assembly can occur if fewer than 16 bytes can be decoded for any one cycle. According to the preferred embodiment of present invention, the minimum number of bytes that could be decoded any cycle is 7 if there was no compression of the input data.

Decompression Timing

Each stage in this design has been timed to achieve 100 MHz with 0.25μ technology and low power standard cell design library. Alternate embodiments may use custom data-paths or custom cells to achieve higher clock rates or fewer stages. Stage 1 25501 has proven to be the most critical at 9.1 nS in standard cell design. Stage 2 25505, required only 3.8 nS, with stages 3 25509 and 4 25513 at 8.23 nS and 1.5 nS respectively. There will be some additional powering logic delay in stage 4 not accounted for in these calculations, which are not a problem due to the timing margin of stage 4 25513.

Scalable Compression/Decompression

The IMC 140 also includes scalable compression/decompression, wherein one or more of the parallel compression/decompression slices can be selectively applied for different data streams, depending on the desired priorities of the data streams.

Concurrency

The IMC 140 also allows concurrency of operations by allocation of multiple data requests from a plurality of requesting agents or from multiple data requests input from a single requesting agent. On average, when the compression and decompression unit 251 is used, the requested data block is retired sooner than without use of the current invention. When multiple data requests are queued from concurrent sources, the pending transactions can complete with less latency than in prior art systems. As the input block size grows and the number of pending concurrent data requests increase, the present invention becomes increasingly attractive for reduction of latency and increased effective bandwidth.

Although the system and method of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

The invention claimed is:

1. A method for storing data in a memory in a computer system the method comprising:
   receiving uncompressed data;
   determining a compression mode for the data, wherein the compression mode comprises one of lossless compression, lossy compression, or no compression;
   selectively compressing the uncompressed data, wherein said compressing is selectively performed in response to the compression mode for the data;
   storing the data in the memory;
   creating a header after said determining the compression mode for the data, wherein the header includes compression mode information indicating the compression mode of the first data, wherein the compression mode information indicates a decompression procedure for decompression of the compressed first data; and
   wherein said storing the data in the memory includes storing the header in the memory with the data.

2. The method of claim 1, further comprising:
   receiving a request for the data;
   accessing the data from the memory in response to the request;
   analyzing the header to determine a compression mode for the data in response to receiving the request;
   selectively decompressing the data, wherein said decompressing is selectively performed in response to the compression mode for the data; and
   providing the data in response to the request.

3. A method for compressing data and storing the compressed data in a memory in a computer system, the method comprising:
   receiving uncompressed first data;
   compressing the uncompressed first data to produce compressed first data, wherein said compressed first data has a first size;
   determining if the first size of the compressed first data is greater than an allocated memory block size of a first allocated memory block;
   creating a header, wherein the header includes an overflow indicator indicating whether the first size of the compressed first data is greater than the allocated memory block size; and
   storing the compressed first data and the header in the memory.

4. The method of claim 3, wherein said determining determines that the first size of the compressed first data is less than or equal to the allocated memory block size;
   wherein the overflow indicator indicates that the first allocated memory block stores all of the compressed first data.

5. The method of claim 4, wherein said overflow indicator indicates that the last symbol of the compressed first data is stored in the first allocated memory block.

6. The method of claim 3, wherein said determining determines that the first size of the compressed first data is greater than the allocated memory block size;
   wherein the overflow indicator indicates that the first allocated memory block does not store all of the compressed first data;
   the method further comprising:
   allocating a first overflow memory block;
   storing overflow information in the header, wherein the overflow information includes an overflow address pointer which points to the first overflow memory block;
   wherein said storing comprises:
   storing a first portion of the compressed first data and the header in the first allocated memory block; and
   storing an overflow portion of the compressed first data in the first overflow memory block.

7. The method of claim 6, wherein the first overflow memory block has a fixed size.

8. The method of claim 6, further comprising:
   determining whether the overflow portion has a size greater than the first overflow memory block;
   creating an overflow header, wherein the overflow header includes an overflow indicator indicating whether the overflow portion has a size greater than the first overflow memory block;
   wherein said storing the overflow portion includes storing the overflow portion and the overflow header in the first overflow memory block.

9. The method of claim 8, further comprising:
   wherein said determining determines that the overflow portion of the compressed first data has a size greater than the first overflow memory block;
   wherein the overflow indicator in the overflow header indicates that the first overflow memory block does not store all of the overflow portion;
   the method further comprising:

allocating a second overflow memory block in response to determining that the overflow portion of the compressed first data is greater than the first overflow memory block;

storing overflow information in the first overflow header, wherein the overflow information includes an overflow address pointer which points to the second overflow memory block;

wherein said storing comprises:

storing a first portion of the compressed first data and the header in the first allocated memory block;

storing a first overflow portion of the compressed first data in the first overflow memory block; and storing a second overflow portion of the compressed first data in the second overflow memory block.

10. The method of claim 3, wherein said determining determines that the first size of the compressed first data is greater than the allocated memory block size;

wherein the overflow indicator indicates that the first allocated memory block does not store all of the compressed first data;

the method further comprising:

allocating a plurality of overflow memory blocks, including a first overflow memory block and a last overflow memory block;

storing overflow information in the header, wherein the overflow information includes an overflow address pointer which points to a first overflow memory block;

wherein said storing comprises:

storing a first portion of the compressed first data and the header in the first allocated memory block; and for each of the overflow memory blocks except the last overflow memory block, storing, in the respective overflow memory block, an overflow portion of the compressed first data and a header pointing to a subsequent overflow memory block.

11. The method of claim 3 wherein said determining determines that the first size of the compressed first data is greater than the allocated memory block size;

wherein the overflow indicator indicates that the first allocated memory block does not store all of the compressed first data;

the method further comprising:

allocating one or more overflow memory blocks, wherein the first allocated memory block and the one or more overflow memory blocks are insufficient to store the compressed first data;

generating an interrupt to a driver in response to the first allocated memory block and the one or more overflow memory blocks being insufficient to store the compressed first data;

the driver allocating additional overflow memory blocks in response to the interrupt.

12. The method of claim 3, wherein said determining determines if the first size of the compressed first data and a maximum header size are greater than the allocated memory block size.

13. The method of claim 3, further comprising:

allocating the first allocated memory block in response to receiving the uncompressed first data, wherein the first allocated memory block is allocated according to a pre-determined compression ratio.

14. The method of claim 3, wherein the computer system includes an operating system, the method further comprising:

the operating system allocating the first allocated memory block in response to receiving the uncompressed first data.

15. A computer system including a memory controller having an embedded compression/decompression engine, the computer system comprising:

a CPU;

system memory which stores data used by said CPU for executing one or more applications;

a memory controller coupled to said system memory and said CPU, wherein said memory controller performs memory control functions for said system memory, wherein said memory controller includes said compression/decompression engine comprised in said memory controller for compressing and decompressing data transferred to or from said system memory;

wherein said memory controller is operable to:

receive uncompressed first data;

selectively compress the uncompressed first data to produce compressed first data according to a compression mode;

create a header, wherein the header includes compression mode information indicating the compression mode of the first data, wherein the compression mode information indicates a decompression procedure for decompression of the compressed first data; and store the compressed first data and the header in the memory.

16. A method for compressing data and storing the compressed data in a memory in a computer system, the method comprising:

allocating a memory block, wherein the memory block is allocated according to a pre-determined compression ratio:

receiving uncompressed first data having a first size;

receiving one or more destination addresses indicating a storage destination of the first data in the allocated memory block; compressing the uncompressed first data to produce compressed first data having a second smaller size;

storing the compressed first data in the allocated memory block at the one or more destination addresses;

determining if the compressed first data fits within the allocated memory block; and allocating an overflow memory block if the compressed first data does not fit within the allocated memory block.

* * * * *